US012156396B2

(12) United States Patent
Nagatsuka et al.

(10) Patent No.: US 12,156,396 B2
(45) Date of Patent: Nov. 26, 2024

(54) MEMORY DEVICE, SEMICONDUCTOR DEVICE, AND ELECTRONIC DEVICE

(71) Applicant: Semiconductor Energy Laboratory Co., Ltd., Atsugi (JP)

(72) Inventors: Shuhei Nagatsuka, Atsugi (JP); Tatsuya Onuki, Atsugi (JP); Takahiko Ishizu, Sagamihara (JP); Kiyoshi Kato, Atsugi (JP); Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 438 days.

(21) Appl. No.: 17/424,664

(22) PCT Filed: Nov. 22, 2019

(86) PCT No.: PCT/IB2019/060053
§ 371 (c)(1),
(2) Date: Jul. 21, 2021

(87) PCT Pub. No.: WO2020/157558
PCT Pub. Date: Aug. 6, 2020

(65) Prior Publication Data
US 2022/0108985 A1    Apr. 7, 2022

(30) Foreign Application Priority Data

Jan. 29, 2019   (JP) .................................. 2019-013469

(51) Int. Cl.
*H10B 12/00*    (2023.01)
*G11C 5/02*     (2006.01)
(Continued)

(52) U.S. Cl.
CPC .............. *H10B 12/00* (2023.02); *G11C 5/02* (2013.01); *H01L 27/1225* (2013.01);
(Continued)

(58) Field of Classification Search
CPC ..................................................... H10B 12/00
See application file for complete search history.

(56) References Cited

U.S. PATENT DOCUMENTS 8,378,403 B2    2/2013   Kato
8,455,868 B2    6/2013   Yamazaki et al.
(Continued)

FOREIGN PATENT DOCUMENTS

CN    102804360 A    11/2012
CN    103985760 A    8/2014
(Continued)

OTHER PUBLICATIONS

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.
(Continued)

*Primary Examiner* — Yu-Hsi D Sun
(74) *Attorney, Agent, or Firm* — Eric J. Robinson; Robinson Intellectual Property Law Office, P.C.

(57) ABSTRACT

A memory device including a gain-cell memory cell capable of storing a large amount of data per unit area is provided. A peripheral circuit of the memory device is formed using a transistor formed on a semiconductor substrate, and a memory cell of the memory device is formed using a thin film transistor. A plurality of layers including thin film transistors where memory cells are formed are stacked above the semiconductor substrate, whereby the amount of data that can be stored per unit area can be increased. When an OS transistor with extremely low off-state current is used as the thin film transistor, the capacitance of a capacitor that accumulates charge can be reduced. In other words, the area of the memory cell can be reduced.

13 Claims, 20 Drawing Sheets

(51) Int. Cl.
- *H01L 27/12* (2006.01)
- *H01L 29/786* (2006.01)
- *G11C 11/405* (2006.01)
- *G11C 11/408* (2006.01)
- *G11C 11/4094* (2006.01)

(52) U.S. Cl.
CPC .... *H01L 29/78648* (2013.01); *H01L 29/7869* (2013.01); *G11C 11/405* (2013.01); *G11C 11/4085* (2013.01); *G11C 11/4094* (2013.01)

(56) References Cited

U.S. PATENT DOCUMENTS

| | | | |
|---|---|---|---|
| 8,508,967 | B2 | 8/2013 | Yamazaki et al. |
| 8,614,916 | B2 | 12/2013 | Nagatsuka et al. |
| 8,637,865 | B2 | 1/2014 | Kato |
| 8,907,392 | B2 | 12/2014 | Yamazaki et al. |
| 8,981,367 | B2 | 3/2015 | Yoneda et al. |
| 9,349,735 | B2 | 5/2016 | Yamazaki et al. |
| 9,368,501 | B2 | 6/2016 | Yamazaki et al. |
| 9,514,792 | B2 | 12/2016 | Kajigaya |
| 9,748,274 | B2 | 8/2017 | Ishizu et al. |
| 9,780,093 | B2 | 10/2017 | Kato |
| 9,991,265 | B2 | 6/2018 | Yamazaki et al. |
| 10,056,131 | B2 | 8/2018 | Atsumi et al. |
| 10,141,344 | B2 | 11/2018 | Yamazaki et al. |
| 10,319,723 | B2 | 6/2019 | Kato |
| 10,516,060 | B2 | 12/2019 | Yamazaki |
| 10,529,413 | B2 | 1/2020 | Atsumi et al. |
| 10,553,589 | B2 | 2/2020 | Yamazaki et al. |
| 11,233,055 | B2 | 1/2022 | Kato |
| 11,355,179 | B2 | 6/2022 | Atsumi et al. |
| 11,417,771 | B2 | 8/2022 | Yamazaki |
| 11,869,980 | B2 | 1/2024 | Yamazaki |
| 2011/0156027 | A1 | 6/2011 | Yamazaki et al. |
| 2012/0033488 | A1 | 2/2012 | Nagatsuka et al. |
| 2012/0057396 | A1 | 3/2012 | Yamazaki et al. |
| 2013/0070506 | A1 | 3/2013 | Kajigaya |
| 2013/0161713 | A1* | 6/2013 | Yamazaki ............ H10B 12/036 257/296 |
| 2013/0256657 | A1 | 10/2013 | Yamazaki et al. |
| 2016/0260718 | A1 | 9/2016 | Yamazaki et al. |
| 2016/0293605 | A1 | 10/2016 | Yamazaki et al. |
| 2016/0351243 | A1 | 12/2016 | Ishizu et al. |
| 2018/0286864 | A1 | 10/2018 | Yamazaki et al. |
| 2020/0035683 | A1* | 1/2020 | Sharma ................... H01L 24/17 |
| 2020/0176450 | A1 | 6/2020 | Yamazaki et al. |
| 2022/0149044 | A1 | 5/2022 | Kato |
| 2022/0293164 | A1 | 9/2022 | Atsumi et al. |
| 2024/0113231 | A1 | 4/2024 | Yamazaki |

FOREIGN PATENT DOCUMENTS

| | | |
|---|---|---|
| CN | 104716139 A | 6/2015 |
| JP | 2011-151383 A | 8/2011 |
| JP | 2012-033906 A | 2/2012 |
| JP | 2012-256400 A | 12/2012 |
| JP | 2012-256820 A | 12/2012 |
| JP | 2013-065638 A | 4/2013 |
| JP | 2013-149970 A | 8/2013 |
| JP | 2014-068050 A | 4/2014 |
| JP | 2015-008302 A | 1/2015 |
| JP | 2016-042590 A | 3/2016 |
| JP | 2016-225613 A | 12/2016 |
| JP | 2016-225617 A | 12/2016 |
| JP | 2017-092492 A | 5/2017 |
| JP | 2017-168836 A | 9/2017 |
| JP | 2018-085507 A | 5/2018 |
| JP | 2018-137464 A | 8/2018 |
| JP | 2018-201003 A | 12/2018 |
| KR | 2012-0094146 A | 8/2012 |
| KR | 2013-0099215 A | 9/2013 |
| KR | 2014-0072129 A | 6/2014 |
| KR | 2016-0138910 A | 12/2016 |
| KR | 2017-0109071 A | 9/2017 |
| WO | WO-2011/077967 | 6/2011 |
| WO | WO-2012/002186 | 1/2012 |
| WO | WO-2017/153862 | 9/2017 |

OTHER PUBLICATIONS

International Search Report (Application No. PCT/IB2019/060053) Dated Feb. 18, 2020.
Written Opinion (Application No. PCT/IB2019/060053) Dated Feb. 18, 2020.

\* cited by examiner

112

113

FIG. 14A
| Amorphous | Crystalline | Crystal |
|---|---|---|
| completely amorphous | •CAAC<br>•nc<br>•CAC | •single crystal<br>•poly crystal |
FIG. 14B
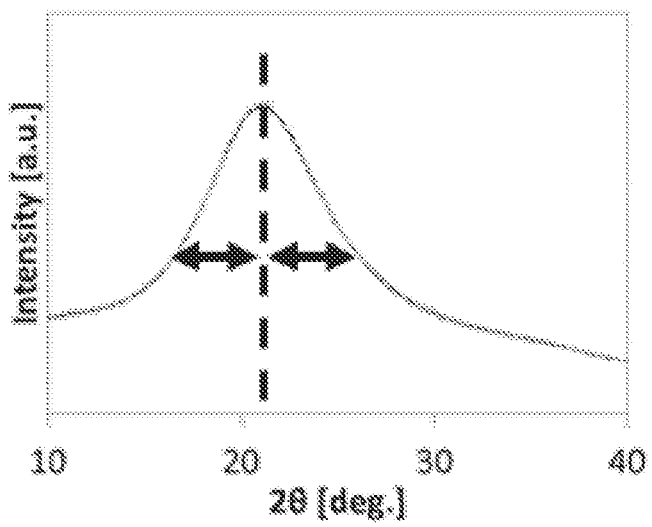
FIG. 14C
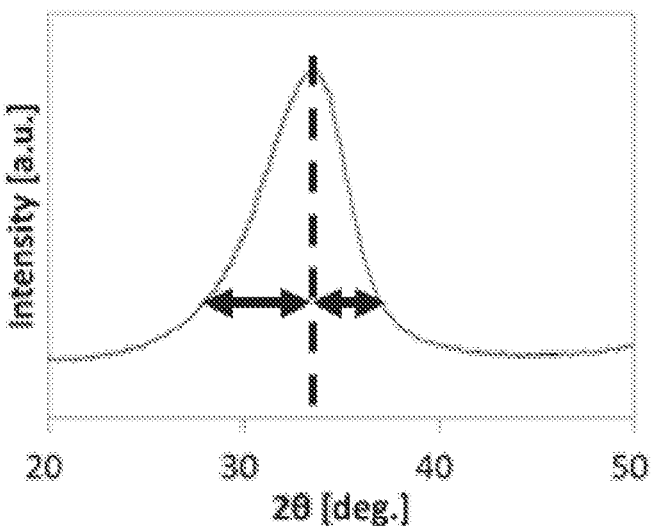

5500

5300

5200

5800

5700

MEMORY DEVICE, SEMICONDUCTOR DEVICE, AND ELECTRONIC DEVICE

TECHNICAL FIELD

One embodiment of the present invention relates to a memory device. In particular, one embodiment of the present invention relates to a memory device that can function by utilizing semiconductor characteristics.

One embodiment of the present invention relates to a semiconductor device. Note that in this specification and the like, a semiconductor device refers to all devices that can function by utilizing semiconductor characteristics. For example, an integrated circuit, a chip including an integrated circuit, an electronic component including a packaged chip, and an electronic device including an integrated circuit are examples of a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A DRAM (Dynamic Random Access Memory) is widely used as a memory device (also referred to as a memory) incorporated in various kinds of electronic devices. The DRAM is a memory device that includes memory cells each being composed of one transistor and one capacitor and stores data by accumulating electric charge in the capacitor.

A memory cell of a DRAM may include two transistors and one capacitor. Even when the capacitance of the capacitor is small, amplifying accumulated charge by a nearby transistor allows the operation of a memory (hereinafter referred to as a gain-cell memory cell).

In recent years, attention has been attracted to a transistor (also referred to as an oxide semiconductor transistor or an OS transistor), which includes a metal oxide in a region (hereinafter also referred to as a channel formation region), where a channel of the transistor is formed. The drain current of an OS transistor in the off state (also referred to as off-state current) is extremely low; thus, using an OS transistor in a memory cell of a DRAM enables long-term retention of charge accumulated in the capacitor.

An OS transistor is a thin film transistor and thus can be provided to be stacked. For example, a Si transistor formed on a single crystal silicon substrate can be used to form a first circuit and an OS transistor can be used to form a second circuit thereabove. For example, a peripheral circuit such as a driver circuit or a control circuit can be formed as the first circuit and a memory cell can be formed as the second circuit when an OS transistor is used for a DRAM, and consequently the chip area of the DRAM can be reduced.

Patent Document 1 discloses an example of a semiconductor device including a plurality of memory cells each using an OS transistor over a semiconductor substrate where a peripheral circuit is formed. Patent Document 2 discloses an example in which an OS transistor and a transistor other than an OS transistor (e.g., a Si transistor) are used in a gain-cell memory cell (where a capacitor may be omitted).

Note that in this specification and the like, a memory device or a semiconductor device including a gain-cell memory cell using an OS transistor is referred to as a NOSRAM (registered trademark, Nonvolatile Oxide Semiconductor Random Access Memory).

REFERENCES

Patent Documents

[Patent Document 1] Japanese Published Patent Application No. 2012-256820
[Patent Document 2] Japanese Published Patent Application No. 2012-256400

SUMMARY OF THE INVENTION

Problems to be Solved by the Invention

In a DRAM, accumulated charge can be amplified by a nearby transistor in a gain-cell memory cell, and the capacitance of the capacitor can be reduced accordingly. Alternatively, the capacitor is not necessarily formed (the capacitor may be omitted) when the gate capacitance of a transistor, the parasitic capacitance of a wiring, or the like is utilized.

However, one gain-cell memory cell requires at least two transistors, which has caused the problem that the number of memory cells that can be stored per unit area (arrangement density) is difficult to increase. That is, the problem has been that it is difficult to increase the memory density (the amount of data that can be stored per unit area) of the memory device by increasing the arrangement density of memory cells.

An object of one embodiment of the present invention is to provide a memory device including a gain-cell memory cell capable of storing a large amount of data per unit area. Another object of one embodiment of the present invention is to provide an electronic device including a gain-cell memory cell capable of storing a large amount of data per unit area.

Note that one embodiment of the present invention does not necessarily achieve all the above objects and only needs to achieve at least one of the objects. The descriptions of the above objects do not preclude the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a memory device including a semiconductor substrate and first to l-th layers (l is an integer greater than or equal to 1). The semiconductor substrate includes a peripheral circuit including a transistor formed in the semiconductor substrate, and a k-th layer (k is an integer greater than or equal to 1 and less than or equal to l) includes a memory cell array including a thin film transistor formed in the k-th layer. The first layer is stacked above the semiconductor substrate. A j-th layer (j is an integer greater than or equal to 2 and less than or equal to l) is stacked above a j−1-th layer.

Another embodiment of the present invention is a memory device including a semiconductor substrate and first to l-th layers (l is an integer greater than or equal to 1). The semiconductor substrate includes a peripheral circuit including a transistor formed in the semiconductor substrate, and a k-th layer (k is an integer greater than or equal to 1 and less than or equal to l) includes a memory cell array including a thin film transistor formed in the k-th layer. Each memory cell array includes a plurality of memory cells. The memory cell includes a first thin film transistor and a second thin film transistor. The first layer is stacked above the semiconductor substrate. A j-th layer (j is an integer greater than or equal to 2 and less than or equal to 1) is stacked above a j−1-th layer.

Another embodiment of the present invention is a memory device including a semiconductor substrate and first to l-th layers (l is an integer greater than or equal to 1). The semiconductor substrate includes a peripheral circuit including a transistor formed in the semiconductor substrate, and a k-th layer (k is an integer greater than or equal to 1 and less than or equal to 1) includes a memory cell array including a thin film transistor formed in the k-th layer. The peripheral circuit includes first to l-th word line driver circuits and first to l-th bit line driver circuits. The memory cell array included in the k-th layer is electrically connected to the k-th word line driver circuit. Each memory cell array is electrically connected to the bit line driver circuit. The first layer is stacked above the semiconductor substrate. A j-th layer (is an integer greater than or equal to 2 and less than or equal to 1) is stacked above a j−1-th layer.

Another embodiment of the present invention is a memory device including a semiconductor substrate and first to l-th layers (l is an integer greater than or equal to 1). The semiconductor substrate includes a peripheral circuit including a transistor formed in the semiconductor substrate, and a k-th layer (k is an integer greater than or equal to 1 and less than or equal to 1) includes a memory cell array including a thin film transistor formed in the k-th layer. The peripheral circuit includes first to l-th word line driver circuits and first to l-th bit line driver circuits. The memory cell array included in the k-th layer is electrically connected to the k-th word line driver circuit. Each memory cell array is electrically connected to the bit line driver circuit. Each memory cell array includes a plurality of memory cells. The memory cell includes a first thin film transistor and a second thin film transistor. The first layer is stacked above the semiconductor substrate. A j-th layer (j is an integer greater than or equal to 2 and less than or equal to 1) is stacked above a j−1-th layer.

In the above embodiment, the thin film transistor includes a metal oxide in a channel formation region.

In the above embodiment, each of the thin film transistors includes a front gate and a back gate.

In the above embodiment, the thin film transistor includes a metal oxide in a channel formation region and each of the thin film transistors includes a front gate and a back gate.

Effect of the Invention

One embodiment of the present invention can provide a memory device including a gain-cell memory cell capable of storing a large amount of data per unit area. Another embodiment of the present invention can provide an electronic device including a gain-cell memory cell capable of storing a large amount of data per unit area.

Note that the descriptions of the effects do not preclude the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 14A is a diagram showing the classification of crystal structures of IGZO. FIG. 14B is a diagram showing an XRD spectrum of quartz glass. FIG. 14C is a diagram showing an XRD spectrum of crystalline IGZO.

MODE FOR CARRYING OUT THE INVENTION

Figure 1:
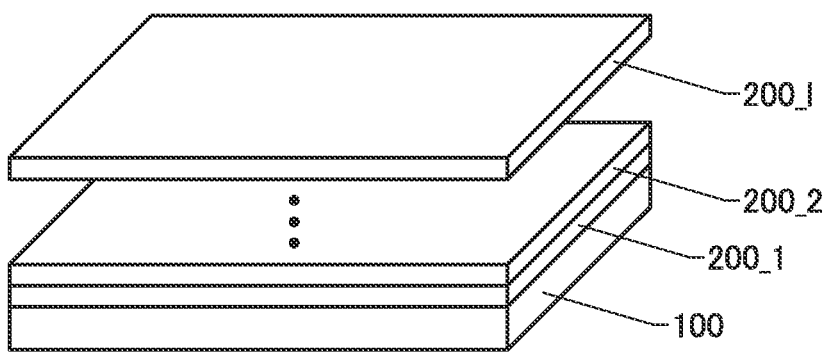
FIG. 1 is a perspective view illustrating a structure example of a memory device.

Embodiments will be described below with reference to the drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Thus, they are not necessarily limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the terms "electrode" and "wiring" do not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitor" has a structure in which two electrodes face each other with an insulator (dielectric) therebetween. This specification and the like include a case where a "capacitor element" is the above-described "capacitor". That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel formation region is included between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Unless otherwise specified, an off-state current in this specification and the like refers to a drain current of a transistor in an off state (also referred to as a non-conducting state or a cutoff state). Unless otherwise specified, the off state of an n-channel transistor refers to a state where voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, an on-state current sometimes refers to a current that flows between a source and a drain when a transistor is in an on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is called an oxide semiconductor in some cases. That is, in the case where a metal oxide has at least one of an amplifying function, a rectifying function, and a switching function, the metal oxide can be called a metal oxide semiconductor. In other words, a transistor containing a metal oxide in a channel formation region can be referred to as an "oxide semiconductor transistor" or an "OS transistor".

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

In this embodiment, structure examples of a memory device according to one embodiment of the present invention will be described. The memory device according to one embodiment of the present invention is a memory device that can function by utilizing semiconductor characteristics, and is also called a memory. The memory device according to one embodiment of the present invention has a structure in which a plurality of layers including OS transistors are stacked above a layer including a transistor formed on a semiconductor substrate.

FIG. 1 is a schematic perspective view illustrating a structure example of a memory device 10 according to one embodiment of the present invention. The memory device 10 includes a layer 100 and a layer 200_1 to a layer 200_1 (l is an integer greater than or equal to 1). Note that in this specification and the like, a reference numeral such as "_1" or "_2" is used to distinguish a plurality of components having similar functions. In other words, description is made using the reference numeral of the layer 200 when a given layer among the layer 200_1 to the layer 200_1 is referred to, whereas description is made using the reference numeral of the layer 2001, the layer 200_2, or the like when one of them needs to be specified.

As illustrated in FIG. 1, the memory device 10 has a structure in which the layer 2001 is stacked above the layer 100 and the layer 200_2 is stacked above the layer 200_1. Similarly, a layer 200_3 (not illustrated) to the layer 200_1 are sequentially stacked. In this embodiment, the case where l is 2 is described below for easy understanding.

<Schematic Perspective View of Memory Device>

Figure 2:
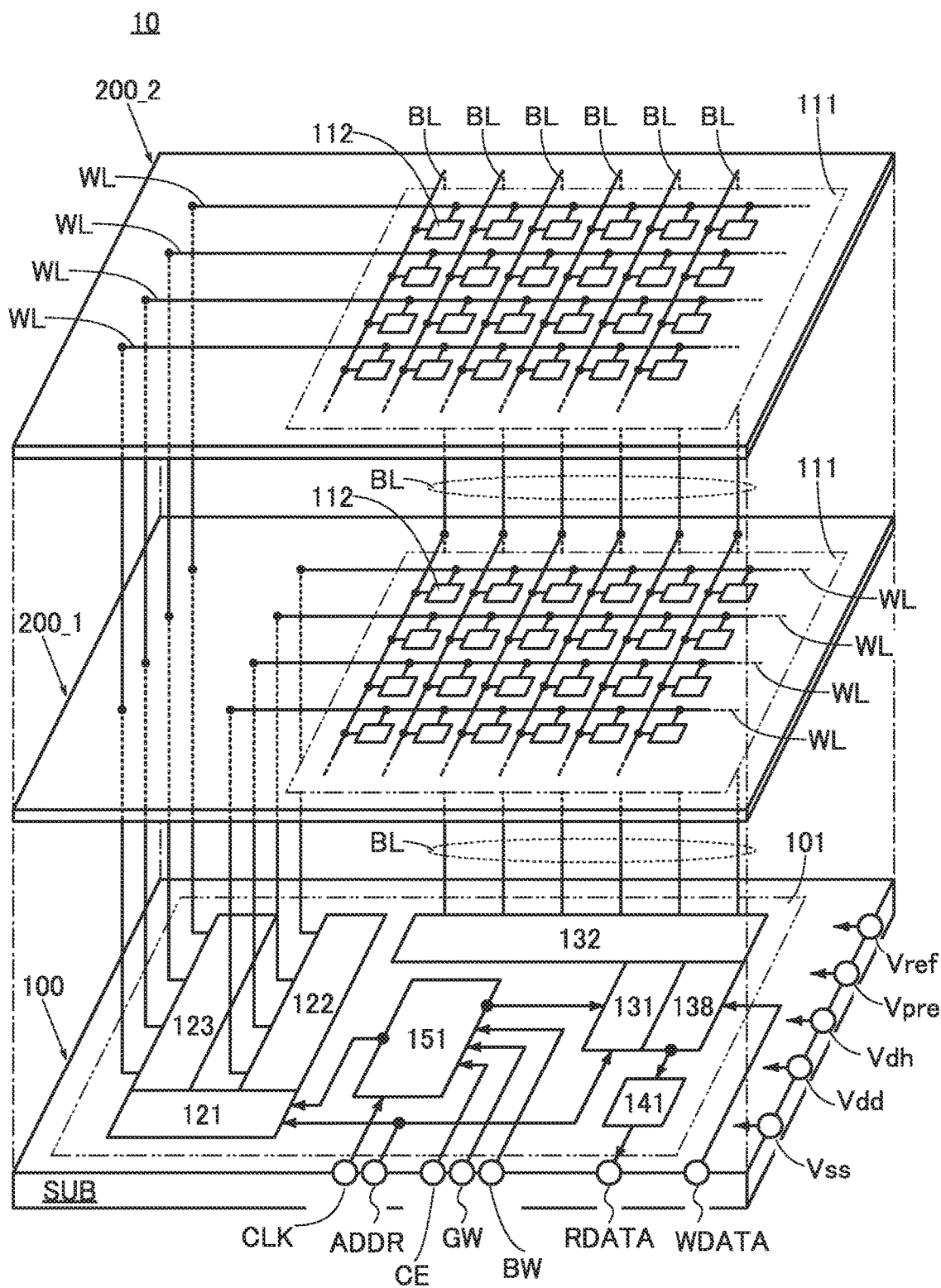
FIG. 2 is a schematic perspective view illustrating a structure example of a memory device.

FIG. 2 is a schematic perspective view illustrating a structure example of the memory device 10 according to one embodiment of the present invention.

The memory device 10 illustrated in FIG. 2 includes the layer 100, the layer 2001, and the layer 200_2. The layer 200_1 is stacked above the layer 100, and the layer 200_2 is stacked above the layer 2001.

In each of the layer 100, the layer 2001, and the layer 200_2, a circuit that can function by utilizing semiconductor characteristics is provided; specifically, a peripheral circuit 101 is provided in the layer 100, and memory cell arrays 111 are provided in the layer 200_1 and the layer 200_2. Note that in the drawings described in this specification and the like, the flow of main signals is indicated by an arrow or a line, and a power supply line and the like are omitted in some cases.

The peripheral circuit 101 includes a row decoder 121, a word line driver circuit 122, a word line driver circuit 123, a column decoder 131, a bit line driver circuit 132, a page buffer 138, an output circuit 141, and a control logic circuit 151. The peripheral circuit 101 has a function of a driver circuit and a control circuit for the memory cell array 111.

The peripheral circuit 101 is formed with transistors formed on a semiconductor substrate SUB. There is no particular limitation in the semiconductor substrate SUB as long as a channel region of a transistor can be formed thereon. For example, a single crystal silicon substrate, a single crystal germanium substrate, a compound semiconductor substrate (such as a SiC substrate or a GaN substrate), an SOI (Silicon on Insulator) substrate, or the like can be used.

As the SOI substrate, the following substrate may be used: an SIMOX (Separation by Implanted Oxygen) substrate which is formed in such a manner that after an oxygen ion is implanted into a mirror-polished wafer, an oxide layer is formed at a certain depth from the surface and defects generated in a surface layer are eliminated by high-temperature annealing, or an SOI substrate formed by using a Smart-Cut method in which a semiconductor substrate is cleaved by utilizing growth of a minute void, which is formed by implantation of a hydrogen ion, by thermal treatment; an ELTRAN method (a registered trademark: Epitaxial Layer Transfer). A transistor formed using a single crystal substrate contains a single crystal semiconductor in a channel formation region.

In this embodiment, a case in which a single crystal silicon substrate is used as the semiconductor substrate SUB will be described. A transistor formed on a single crystal silicon substrate is referred to as a Si transistor. The peripheral circuit 101 formed using Si transistors can operate at high speed.

The memory cell array 111 includes a plurality of memory cells 112, and the memory cell 112 is formed using an OS transistor. The OS transistor is a thin film transistor, and thus, the memory cell array 111 can be stacked over the semiconductor substrate SUB.

Here, an oxide semiconductor has a bandgap of 2.5 eV or larger, preferably 3.0 eV or larger; thus, an OS transistor has a low leakage current due to thermal excitation and also has extremely low off-state current.

A metal oxide used in a channel formation region of the OS transistor is preferably an oxide semiconductor containing at least one of indium (In) and zinc (Zn). Typical examples of such an oxide semiconductor include an In-M-Zn oxide (an element M is Al, Ga, Y, or Sn, for example). Reducing both impurities serving as electron donors, such as moisture or hydrogen, and oxygen vacancies can make an oxide semiconductor i-type (intrinsic) or substantially i-type. Such an oxide semiconductor can be referred to as a highly purified oxide semiconductor. Note that the details of an OS transistor will be described in Embodiment 3.

The memory cell 112 has a function of storing data by accumulating and retaining charge. The memory cell 112 may have a function of storing binary (high level or low level) data or may have a function of storing data of four or more levels. The memory cell 112 may have a function of storing analog data.

An OS transistor has an extremely low off-state current and thus is suitably used as a transistor included in the memory cell 112. An off-state current per micrometer of channel width of an OS transistor can be, for example, lower than or equal to 100 zA/µm, lower than or equal to 10 zA/µm, lower than or equal to 1 zA/µm, or lower than or equal to 10 yA/µm. The use of an OS transistor in the memory cell 112 enables data stored in the memory cell 112 to be retained for a long time.

Since a feature of an OS transistor is the on-state current less likely to increase even at high temperature, the memory device 10 can operate even when the temperature of the installation environment is high. The data stored in the memory cell 112 is less likely to be lost even at high temperatures caused by heat generation by the peripheral circuit 101. The use of an OS transistor can increase the reliability of the memory device 10.

A transistor other than an OS transistor may be used as the transistor used in the memory cell 112 as long as its off-state current is low. For example, a transistor including a semiconductor with a wide bandgap in a channel formation region can be used. The semiconductor with a wide bandgap refers to a semiconductor whose bandgap is larger than or equal to 2.2 eV in some cases, and examples thereof are silicon carbide, gallium nitride, diamond, and the like.

As illustrated in FIG. 2, in the memory cell array 111, the memory cells 112 are arranged in a matrix, and each of the memory cells 112 is electrically connected to a wiring WL and a wiring BL. The memory cell 112 is selected by a potential applied to the wiring WL, and data is written to the selected memory cell 112 through the wiring BL. Alternatively, the memory cell 112 is selected by a potential applied to the wiring WL, and data is read from the selected memory cell 112 through the wiring BL. In other words, the wiring WL has a function of a word line of the memory cell 112, and the wiring BL has a function of a bit line of the memory cell 112.

Note that the wiring WL and the wiring BL illustrated in FIG. 2 are each include a plurality of wirings. For example, the wiring WL includes a plate line PL, a write word line WWL, a read word line RWL, a wiring BG1, and a wiring BG2, and the wiring BL includes a read bit line RBL and a write bit line WBL (see FIG. 3 and FIG. 4).

The memory cell array 111 provided in the layer 200_1 is electrically connected to the word line driver circuit 122 through the wiring WL, and the memory cell array 111 provided in the layer 200_2 is electrically connected to the word line driver circuit 123 through the wiring WL. The memory cell array 111 provided in the layer 200_1 and the memory cell array 111 provided in the layer 200_2 are electrically connected to the bit line driver circuit 132 through the wiring BL.

The electrical connection of the memory cell array 111 to the word line driver circuit 122, the word line driver circuit 123, and the bit line driver circuit 132 is described later with reference to FIG. 4, and the peripheral circuit 101 is described with reference to FIG. 3.

<Block Diagram of Memory Device>

Figure 3:
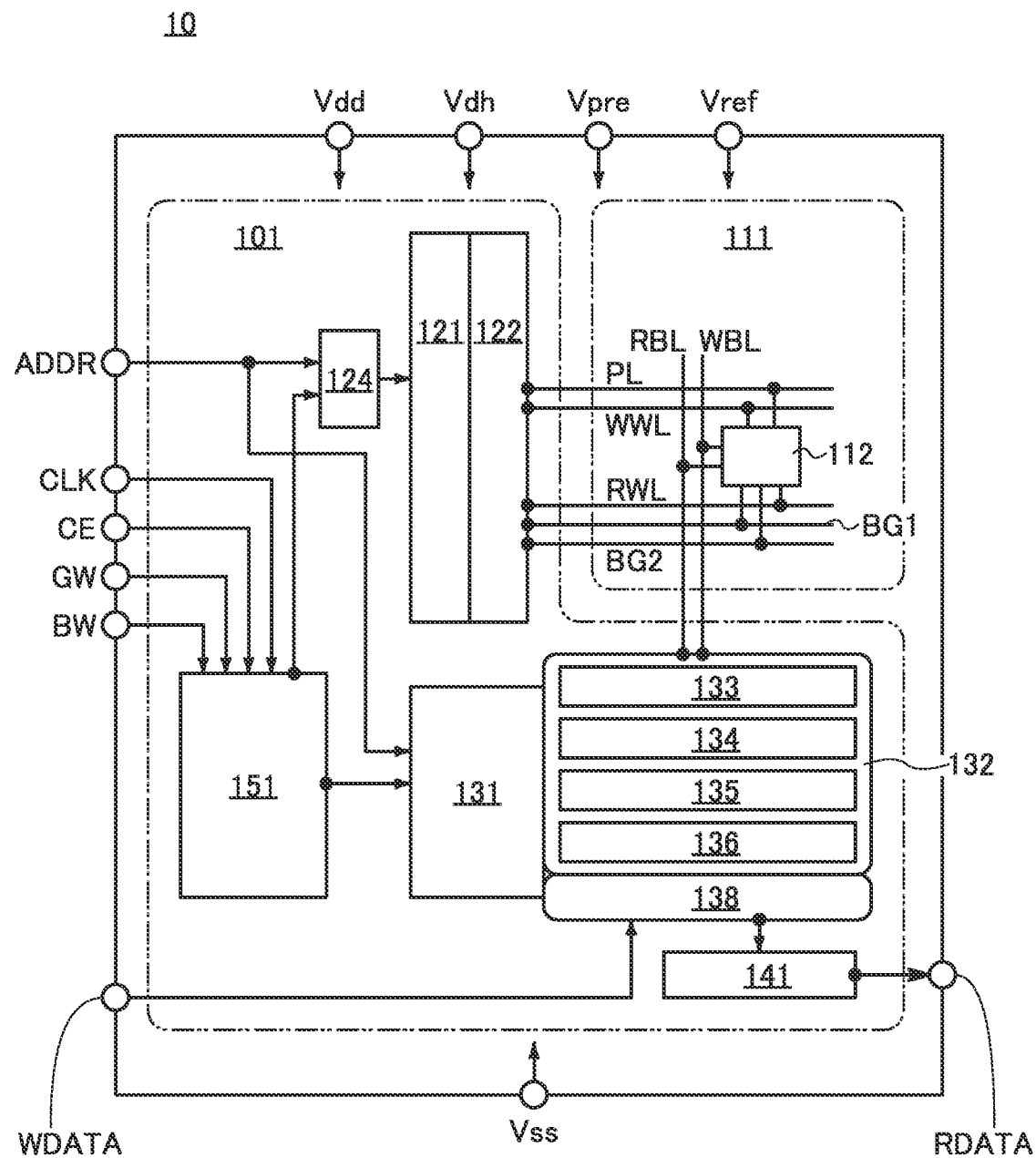
FIG. 3 is a block diagram illustrating a structure example of a memory device.

FIG. 3 is a block diagram illustrating a structure example of the memory device 10. In the block diagram of FIG. 3, only one memory cell 112 included in the memory cell array 111 is typically illustrated while the memory cell array 111 provided in the layer 200_2 and the word line driver circuit 123 are omitted.

As illustrated in FIG. 3, the memory device 10 includes the peripheral circuit 101 and the memory cell array 111. The peripheral circuit 101 includes the row decoder 121, the word line driver circuit 122, the column decoder 131, the bit line driver circuit 132, the page buffer 138, the output circuit 141, and the control logic circuit 151.

The memory cell array 111 includes a plurality of memory cells 112 (only one is illustrated in FIG. 3). The memory cell 112 is electrically connected to the word line driver circuit 122 through the plate line PL, the write word line WWL, the read word line RWL, the wiring BG1, and the wiring BG2 and is electrically connected to the bit line driver circuit 132 through the read bit line RBL and the write bit line WBL.

A potential Vss, a potential Vdd, a potential Vdh, a pre-charge potential Vpre, and a reference potential Vref are input to the memory device 10. The potential Vdh is a high power supply potential of the write word line WWL.

A clock signal CLK, a chip enable signal CE, a global write enable signal GW, a byte write enable signal BW, an address signal ADDR, and a data signal WDATA are input to the memory device 10, and the memory device 10 outputs a data signal RDATA. Note that these signals are digital signals represented by a high level or a low level (represented by High or Low, H or L, 1 or 0, or the like in some cases).

Note that in this embodiment, a potential Vdd is used to express the high level of a digital signal and a potential Vss is used to express the low level. A potential Vdh is used for the high level of the write word line WWL and the potential Vss is used for the low level. Each of the byte write enable signal BW, the address signal ADDR, the data signal WDATA, and the data signal RDATA is a signal having a plurality of bits.

In this specification and the like, as for a signal having a plurality of bits, for example, in the case where the byte write enable signal BW has four bits, the signal is represented by the byte write enable signal BW[3:0]. This means that the byte write enable signal includes BW[0] to BW[3]. In the case where one bit needs to be specified, for example, the signal is represented by the byte write enable signal BW[0]. When the signal is represented by the byte write enable signal BW, it means having a given bit.

For example, the byte write enable signal BW can have four bits, and each of the data signal WDATA and the data signal RDATA can have 32 bits. In other words, the byte write enable signal BW, the data signal WDATA, and the data signal RDATA are represented by the byte write enable signal BW[3:0], a data signal WDATA[31:0], and a data signal RDATA[31:0], respectively.

Note that in the memory device 10, each of the above circuits, signals, and potentials can be appropriately selected as needed. Alternatively, another circuit, another signal, or another potential may be added.

The control logic circuit 151 processes the chip enable signal CE and the global write enable signal GW and generates control signals for the row decoder 121 and the column decoder 131. For example, in the case where the chip enable signal CE is at a high level and the global write enable signal GW is at a low level, the row decoder 121 and the column decoder 131 perform reading operation; in the case where the chip enable signal CE is at a high level and the global write enable signal GW is at a high level, the row decoder 121 and the column decoder 131 perform writing operation; and in the case where the chip enable signal CE is at a low level, the row decoder 121 and the column decoder 131 can perform standby operation regardless of whether the global write enable signal GW is at a high level or a low level. Signals processed by the control logic circuit 151 are not limited to them, and other signals may be input as necessary.

Furthermore, the control logic circuit 151 processes the byte write enable signal BW[3:0] to control writing operation. Specifically, in the case where the byte write enable signal BW[0] is at a high level, the row decoder 121 and the column decoder 131 perform writing operation of the data signal WDATA[7:0]. Similarly, in the case where the byte write enable signal BW[1] is at a high level, writing operation of the data signal WDATA[15:8] is performed; in the case where the byte write enable signal BW[2] is at a high level, writing operation of the data signal WDATA[23:16] is performed; and in the case where the byte write enable signal BW[3] is at a high level, writing operation of the data signal WDATA[31:24] is performed.

An address signal ADDR is input to the row decoder 121 and the column decoder 131 in addition to the above control signals generated by the control logic circuit 151.

The row decoder 121 decodes the address signal ADDR and generates control signals for the word line driver circuit 122. The word line driver circuit 122 has a function of driving the plate line PL, the write word line WWL, the read word line RWL, the wiring BG1, and the wiring BG2 or a function of applying a predetermined potential. The word line driver circuit 122 selects the write word line WWL or the read word line RWL of a row which is an access target, on the basis of a control signal of the row decoder 121. The word line driver circuit 122 may have a function of selecting the wiring BG1 or the wiring BG2.

In the case where the memory cell array 111 is divided into a plurality of blocks, a predecoder 124 may be provided. The predecoder 124 has a function of decoding the address signal ADDR and determining a block to be accessed.

The column decoder 131, the bit line driver circuit 132, and page buffer 138 have a function of writing data input by the data signal WDATA to the memory cell array 111, a function of reading data from the memory cell array 111, a function of amplifying the read data and outputting the amplified data to the output circuit 141, and the like.

The output circuit 141 outputs, as the data signal RDATA, data read from the memory cell array 111 and stored in the page buffer 138 by the column decoder 131 and the bit line driver circuit 132.

In the example of FIG. 3, the bit line driver circuit 132 includes a pre-charge circuit 133, a sense amplifier circuit 134, an output MUX (multiplexer) circuit 135, and a write driver circuit 136. Note that the pre-charge circuit 133, the sense amplifier circuit 134, the output MUX circuit 135, and the write driver circuit 136 will be described later.

<Memory Cell Array>

Figure 4:
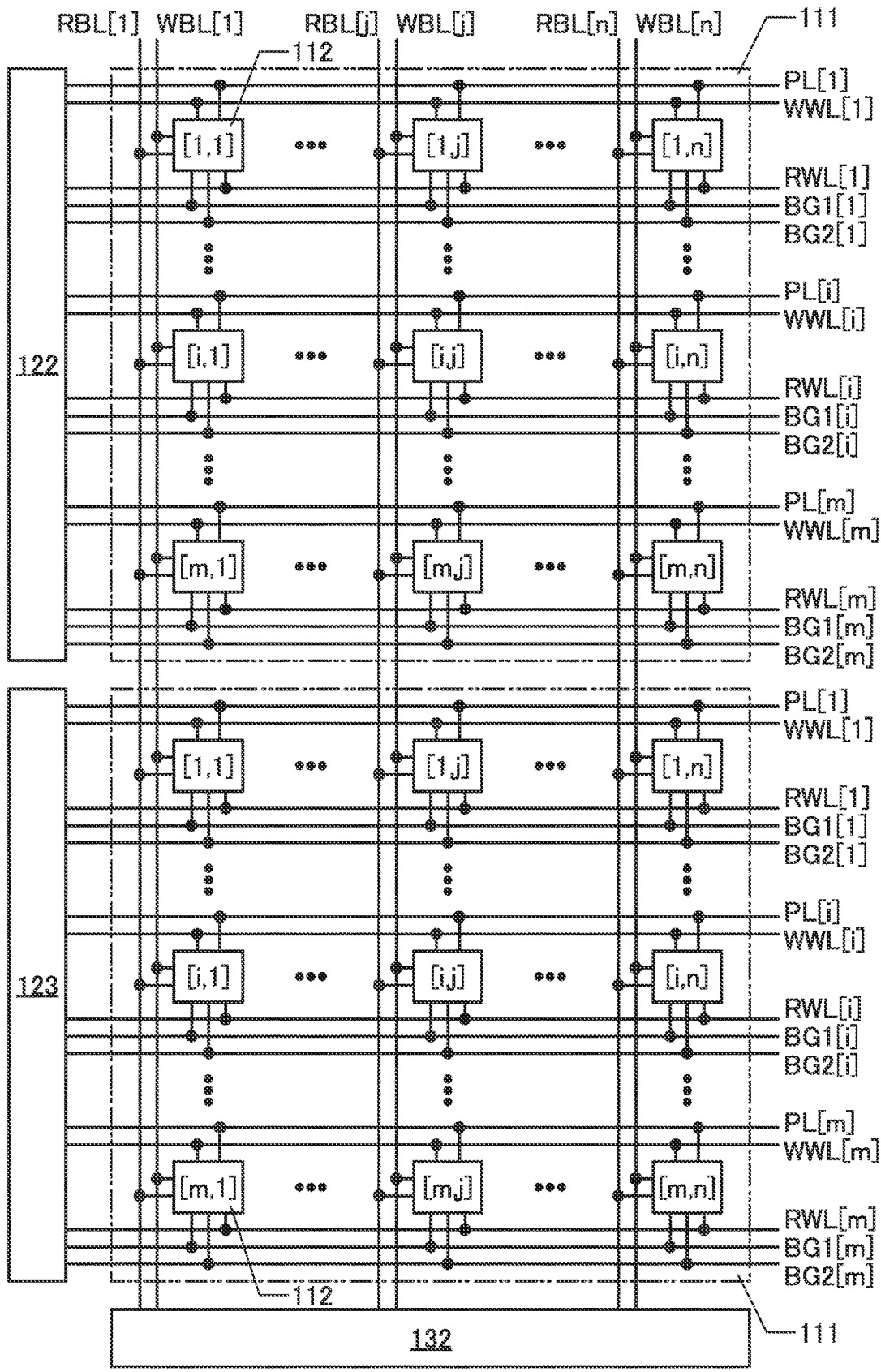
FIG. 4 is a block diagram illustrating a structure example of a memory cell array.

FIG. 4 is a block diagram illustrating a structure example of the memory cell array 111. FIG. 4 illustrates two memory cell arrays 111, the word line driver circuit 122, the word line driver circuit 123, and the bit line driver circuit 132. FIG. 4 illustrates a state where the memory cell array 111 is electrically connected to the word line driver circuit 122 through the plate line PL, the write word line WWL, the read word line RWL, the wiring BG1, and the wiring BG2, a state where the memory cell array 111 is electrically connected to the word line driver circuit 123 through the wiring WL, and a state where the memory cell array 111 is electrically connected to the bit line driver circuit 132 through the read bit line RBL and the write bit line WBL.

Here, the memory cell array 111 electrically connected to the word line driver circuit 122 through the wiring WL is the memory cell array 111 provided in the layer 2001, and the memory cell array 111 electrically connected to the word line driver circuit 123 through the wiring WL is the memory cell array 111 provided in the layer 200_2.

One memory cell array 111 includes m×n memory cells 112 in total; m memory cells (m is an integer greater than or equal to 1) in a column and n memory cells (n is an integer greater than or equal to 1) in a row, and the memory cells 112 are arranged in a matrix. Although the memory cell array 111 provided in the layer 2001 is the same as that provided in the layer 200_2 in FIG. 4, the memory cell array 111 provided in the layer 200_1 may differ from the memory cell array 111 provided in the layer 200_2 in the number of memory cells 112 or the like.

The addresses of the memory cells 112 are also illustrated in FIG. 4, and [1, 1], [i, 1], [m, 1], [1, j], [i, j], [m, j], [1, n], [i, n], and [m, n], (i is an integer greater than or equal to 1 and less than or equal to m, and j is an integer greater than or equal to 1 and less than or equal to n) are the addresses of the memory cells 112. For example, the memory cell 112 represented by [i, j] is the memory cell 112 placed in the i-th row and the j-th column.

As in the addresses, [1], [i], [m], [j], and [n] added to the plate line PL, the write word line WWL, the read word line RWL, the wiring BG1, the wiring BG2, the read bit line RBL, and the write bit line WBL are also the numbers representing the row or column.

The memory cell 112 placed in the i-th row and the j-th column is electrically connected to a plate line PL[i], a write word line WWL[i], a read word line RWL[i], a wiring BG1[i], a wiring BG2[i], a read bit line RBL[j], and a write bit line WBL[j]. The memory cell 112 placed in the i-th row and the j-th column is electrically connected to the word line driver circuit 122 or the word line driver circuit 123 through the plate line PL[i], the write word line WWL[i], the read word line RWL[i], the wiring BG1[i], and the wiring BG2[i] and electrically connected to the bit line driver circuit 132 through the read bit line RBL[j] and the write bit line WBL[j].

In other words, the memory device 10 includes 2×m plate lines PL, 2×m write word lines WWL, 2×m read word lines RWL, 2×m wirings BG1, 2×m wirings BG2, n read bit lines RBL, and n write bit lines WBL.

<Memory Cell>

Figure 5A:
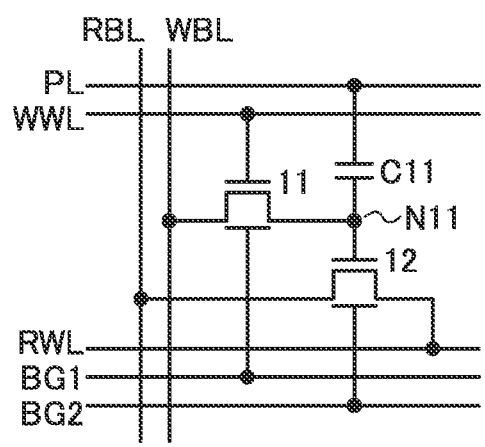
FIG. 5A and FIG. 5B are circuit diagrams illustrating structure examples of memory cells.

FIG. 5A is a circuit diagram illustrating a structure example of the memory cell 112.

The memory cell 112 includes a transistor 11, a transistor 12, and a capacitor C11. Here, the transistor 11 and the transistor 12 are sometimes referred to as a write transistor and a read transistor, respectively. The transistor 11 and the transistor 12 each include a front gate (simply referred to as a gate in some cases) and a back gate.

One of a source and a drain of the transistor 11 is electrically connected to the write bit line WBL, the other of the source and the drain of the transistor 11 is electrically connected to the front gate of the transistor 12 and one terminal of the capacitor C11, the front gate of the transistor 11 is electrically connected to the write word line WWL, and the back gate of the transistor 11 is electrically connected to the wiring BG1.

One of a source and a drain of the transistor 12 is electrically connected to the read bit line RBL, the other of the source and the drain of the transistor 12 is electrically connected to the read word line RWL, and the back gate of the transistor 12 is electrically connected to the wiring BG2. The other terminal of the capacitor C11 is electrically connected to the plate line PL.

Here, the wiring BG1 functions as a wiring for applying a predetermined potential to the back gate of the transistor 11, the wiring BG2 functions as a wiring for applying a predetermined potential to the back gate of the transistor 12, and the plate line PL functions as a wiring for applying a predetermined potential to the other terminal of the capacitor C11.

A connection portion where the other of the source and the drain of the transistor 11, the front gate of the transistor 12, and one terminal of the capacitor C11 are electrically connected is referred to as a node N11. The transistor 11 has a function of a switch that switches conduction and non-conduction between the node N11 and the write bit line WBL. The memory cell 112 may have a structure without the capacitor C11.

Data writing is performed in such a manner that a high-level potential is applied to the write word line WWL to bring the transistor 11 into a conduction state, and thus the node N11 and the write bit line WBL are electrically connected. Specifically, when the transistor 11 is in a conduction state, a potential corresponding to data written to the write bit line WBL is applied, and the potential is written to the node N11. After that, a low-level potential is applied to the write word line WWL to bring the transistor 11 into a non-conduction state, whereby the potential of the node N11 is retained.

Data reading is performed in such a manner that a predetermined potential is applied to the read bit line RBL, and after that, the read bit line RBL is brought into an electrically floating state, and a low-level potential is applied to the read word line RWL. Hereinafter, applying a predetermined potential to the read bit line RBL to bring the read bit line RBL into a floating state is expressed as pre-charging the read bit line RBL.

For example, by pre-charging the potential Vdd to the read bit line RBL, the transistor 12 has a potential difference between the source and the drain, and the current flowing between the source and the drain of the transistor 12 is determined depending on a potential retained at the node N11. Thus, the potential retained at the node N11 can be read by reading a change in potential of the read bit line RBL at the time when the read bit line RBL is in a floating state.

A row where the memory cells 112 to which data is to be written are arranged is selected by the write word line WWL to which a high-level potential is applied, and a row where the memory cells 112 from which data is to be read are arranged is selected by the read word line RWL to which a low-level potential is applied. By contrast, a row where the memory cells 112 to which data is not written are arranged can be in a non-selected state by applying a low-level potential to the write word line WWL, and a row where the memory cells 112 from which data is not read are arranged can be in a non-selected state by applying, to the read word line RWL, the same potential as a potential pre-charged to the read bit line RBL.

In the memory cell 112, charge is accumulated and retained in the node N11, whereby data can be stored. In this embodiment, binary data can be stored in the node N11.

The memory cell 112 is a gain-cell memory cell including two transistors and one capacitor (or including two transistors). A gain-cell memory cell can operate as a memory by amplifying accumulated charge by the closest transistor even when the capacitance of accumulated charge is small. The memory cell 112 is the above NOSRAM.

<Transistor>

The transistor 11 and the transistor 12 are transistors containing a metal oxide in their channel formation regions (OS transistors). For example, in the channel formation regions of the transistor 11 and the transistor 12, a metal oxide containing any one of an indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, a metal oxide formed of indium, gallium, and zinc is preferable.

Since the OS transistor has extremely low off-state current, a potential written to the node N11 can be retained for a long time when the OS transistor is used as the transistor 11. In other words, data written to the memory cell 112 can be retained for a long time.

When an OS transistor is used as the transistor 11, the capacitance of the capacitor C11 can be made small. The gate capacitance of a transistor, the parasitic capacitance of a wiring, or the like can be used as the capacitor C11, for example. Hence, forming a capacitor separately from the transistors and the wirings is not needed in the memory cell 112, and the memory cell 112 may have a structure without the capacitor C11. When the memory cell 112 does not include the capacitor C11, the area of the memory cell 112 can be made small.

Since OS transistors are thin film transistors, the memory cell array 111 can be stacked over the peripheral circuit 101 when OS transistors are used as the transistor 11 and the transistor 12.

The back gates of the transistor 11 and the transistor 12 are described. When predetermined potentials are applied to the back gates of the transistor 11 and the transistor 12 through the wiring BG1 and the wiring BG2, respectively, the threshold voltages of the transistor 11 and the transistor 12 can be increased or decreased.

Specifically, the threshold voltages negatively shift when a high potential is applied to the back gates of the transistor 11 and the transistor 12, and the threshold voltages positively shifts when a low potential is applied to the back gates of the transistor 11 and the transistor 12. By shifting the threshold voltages negatively, the on-state current of the transistors can be increased, and the memory cell 112 can operate at high speed. By shifting the threshold voltages positively, the off-state current of the transistors can be decreased, and the memory cell 112 can retain data for a long time.

In the memory cell 112 illustrated in FIG. 5A, the back gate of the transistor 11 is electrically connected to the wiring BG1 and the back gate of the transistor 12 is electrically connected to the wiring BG2, and accordingly the off-state current of the transistor 11 can be decreased by applying a low potential to the wiring BG1, and the on-state current of the transistor 12 can be increased by applying a high potential to the wiring BG2. The transistor 11 and the transistor 12 can be transistors for desired purposes. Alternatively, the wiring BG1 and the wiring BG2 may be combined into one wiring, and the same potential may be applied to the back gate of the transistor 11 and the back gate of the transistor 12.

The wiring BG2 may be driven using the word line driver circuit 122 or the word line driver circuit 123. The word line driver circuit 122 or the word line driver circuit 123 can increase the on-state current of the transistor 12 in reading operation by applying a high potential to the wiring BG2 of a row which is a reading target. By contrast, the off-state current of the transistor 12 which is not subjected to reading operation can be decreased by applying a low potential to the wiring BG2 of a row other than a row which is a reading target.

When the on-state current of the transistor 12 included in the memory cell 112 where a data reading operation is performed is increased, the reading operation of the memory cell 112 can be performed at high speed. When the off-state current of the transistors 12 included in the other memory cells 112 is reduced, current that leaks to the read bit line RBL can be low. The reduction in the current that leaks to the read bit line RBL can increase the accuracy of the reading operation.

<Memory Cell 2>

Figure 5B:
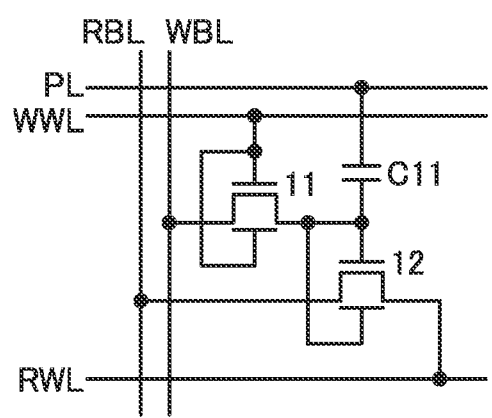

The back gate of the transistor 11 may be electrically connected to the front gate of the transistor 11, and the back gate of the transistor 12 may be electrically connected to the front gate of the transistor 12. FIG. 5B is a circuit diagram illustrating a structure example of the memory cell 113.

The memory cell 113 includes the transistor 11, the transistor 12, and the capacitor C11.

One of the source and the drain of the transistor 11 is electrically connected to the write bit line WBL. The other of the source and the drain of the transistor 11 is electrically connected to the front gate of the transistor 12, the back gate of the transistor 12, and one terminal of the capacitor C11. The front gate of the transistor 11 is electrically connected to the write word line WWL and the back gate of the transistor 11.

One of the source and the drain of the transistor 12 is electrically connected to the read bit line RBL, and the other of the source and the drain of the transistor 12 is electrically connected to the read word line RWL. The other terminal of the capacitor C11 is electrically connected to the plate line PL.

When the back gate of the transistor 11 is electrically connected to the front gate of the transistor 11, the on-state current of the transistor 11 can be increased. When the back gate of the transistor 12 is electrically connected to the front gate of the transistor 12, the on-state current of the transistor 12 can be increased. That is, the memory cell 113 can operate at high speed.

The transistor 11 and the transistor 12 may each be a transistor without a back gate. When the transistor 11 and the transistor 12 are each a transistor only with a front gate, the manufacturing process of the transistors can be simplified.

Structure Example of Bit Line Driver Circuit

Figure 6:
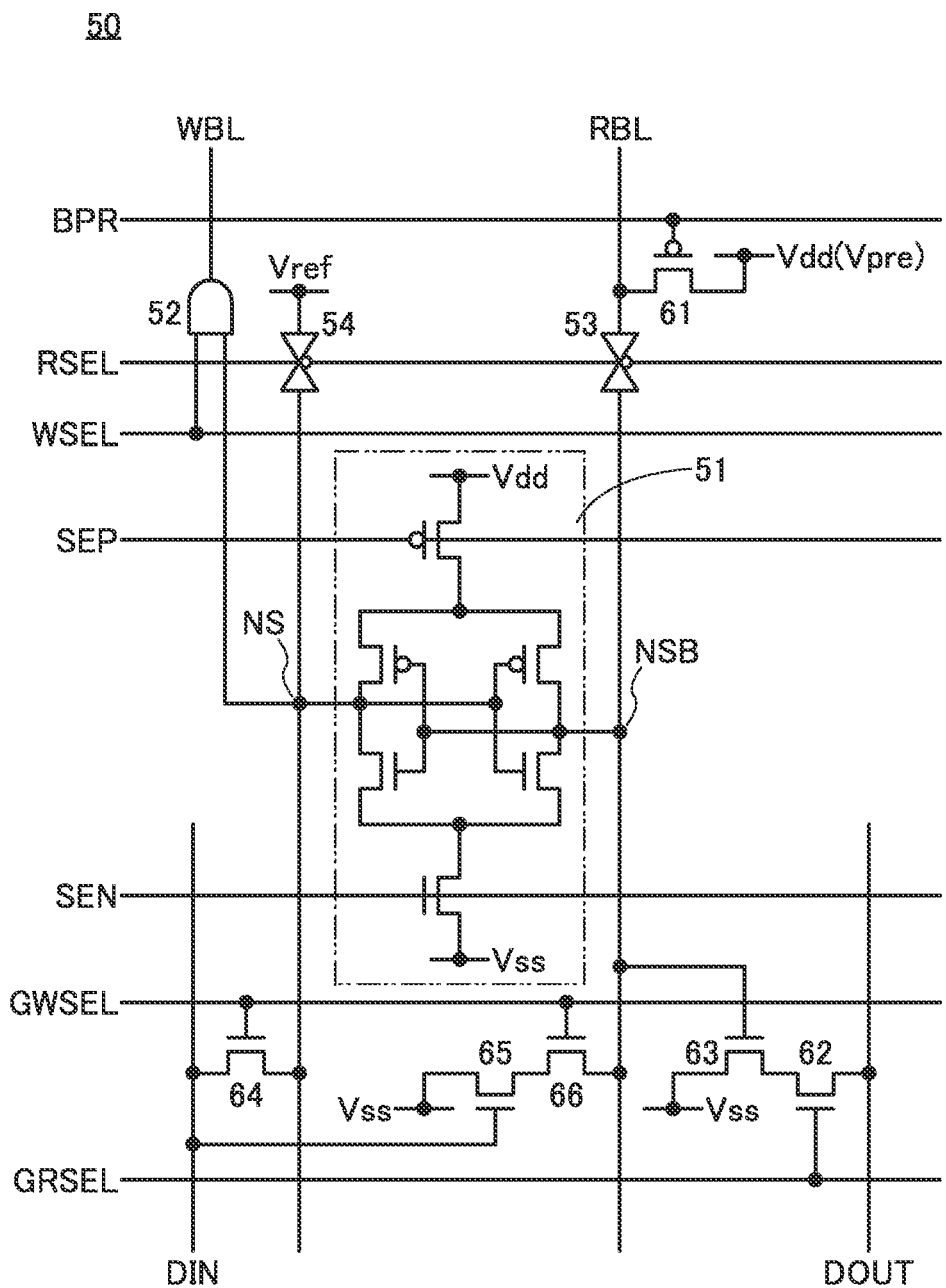
FIG. 6 is a circuit diagram illustrating a structure example of a circuit included in a bit line driver circuit.

In the bit line driver circuit 132, a circuit 50 illustrated in FIG. 6 is provided for each column. FIG. 6 is a circuit diagram illustrating a structure example of the circuit 50. Note that in this embodiment, the memory cell array 111 includes 128 memory cells 112 in one row (n=128).

The circuit 50 includes a transistor 61 to a transistor 66, a sense amplifier circuit 51, an AND circuit 52, an analog switch 53, and an analog switch 54.

The circuit 50 operates in response to a signal SEN, a signal SEP, a signal BPR, a signal RSEL[3:0], a signal WSEL, a signal GRSEL[3:0], and a signal GWSEL[15:0]. Note that a 1-bit signal of any of the 4-bit signal RSEL[3:0] is input to one circuit 50. The same applies to the other signals having a plurality of bits (GRSEL[3:0] and the like).

The bit line driver circuit 132 writes data DIN[31:0] to the memory cell array 111 and reads data DOUT[31:0] from the memory cell array 111. One circuit 50 has a function of writing 1-bit data of any of the 32-bit data DIN[31:0] to the memory cell array 111 and reading 1-bit data of any of the 32-bit data DOUT[31:0] from the memory cell array 111.

Note that the data DIN[31:0] and the data DOUT[31:0] are internal signals: the data DIN[31:0] is a signal supplied from a page buffer 138 to the bit line driver circuit 132, and the data DOUT[31:0] is a signal supplied from the bit line driver circuit 132 to the page buffer 138. The data signal WDATA is input to the page buffer 138 from the outside of the memory device 10, and the page buffer 138 outputs the data signal RDATA to the outside of the memory device 10 through the output circuit 141.

The page buffer 138 is preferably capable of storing at least the amount of (n-bit) data that can be stored in one row in the memory cell array 111. In this embodiment, it is preferable that data of 128 bits or more can be stored.

«Pre-Charge Circuit»

A transistor 61 is included in the pre-charge circuit 133. The read bit line RBL is pre-charged to the pre-charge potential Vpre by the transistor 61. Note that in this embodiment, the case where the potential VDD (high level) is used as the pre-charge potential Vpre is described (denoted by Vdd (Vpre) in FIG. 6 and FIG. 7). The signal BPR is a pre-charge signal, and the conduction state of the transistor 61 is controlled by the signal BPR.

«Sense Amplifier Circuit»

The sense amplifier circuit 51 forms the sense amplifier circuit 134. In a reading operation, the sense amplifier circuit 51 determines whether data input to the read bit line RBL is at a high level or a low level. In addition, the sense amplifier circuit 51 functions as a latch circuit that temporarily retains the data DIN input from the write driver circuit 136 in a writing operation.

The sense amplifier circuit 51 illustrated in FIG. 6 is a latch sense amplifier. The sense amplifier circuit 51 includes two inverter circuits, and an input node of one of the inverter circuits is connected to an output node of the other of the inverter circuits. When the input node of the one of the inverter circuits is a node NS and the output node is a node NSB, complementary data is retained at the node NS and the node NSB.

The signal SEN and the signal SEP are each a sense amplifier enable signal for activating the sense amplifier circuit 51, and a reference potential Vref is a read determining potential. The sense amplifier circuit 51 determines whether the potential of the node NSB at the time of the activation is at a high level or a low level on the basis of the reference potential Vref.

The AND circuit 52 controls electrical continuity between the node NS and the write bit line WBL. The analog switch 53 controls electrical continuity between the node NSB and the read bit line RBL, and the analog switch 54 controls electrical continuity between the node NS and a wiring for supplying the reference potential Vref.

Thus, the analog switch 53 conducts the potential of the read bit line RBL to the node NSB; the sense amplifier circuit 51 determines that the read bit line RBL is at a low level when the potential of the read bit line RBL becomes lower than the reference potential Vref. The sense amplifier circuit 51 determines that the read bit line RBL is at a high level when the potential of the read bit line RBL does not become lower than the reference potential Vref.

The signal WSEL is a write selection signal, which controls the AND circuit 52. The signal RSEL[3:0] is a read selection signal, which controls the analog switch 53 and the analog switch 54.

«Output MUX Driver Circuit»

The transistor 62 and the transistor 63 are included in an output MUX circuit 135. The signal GRSEL[3:0] is a global read selection signal and controls the output MUX circuit 135. The output MUX circuit 135 has a function of selecting, from 128 read bit lines RBL, 32 read bit lines RBL from which data is to be read. The output MUX circuit 135 functions as a multiplexer of 128 input and 32 output.

The output MUX circuit 135 reads the data DOUT [31:0] from the sense amplifier circuit 134 and outputs the data to the page buffer 138.

«Write Driver Circuit»

The transistor 64 to the transistor 66 form the write driver circuit 136. The signal GWSEL[15:0] is a global write selection signal and controls the write driver circuit 136. The write driver circuit 136 has a function of writing the data DIN[31:0] to the sense amplifier circuit 134.

The write driver circuit 136 has a function of selecting a column where the data DIN[31:0] is to be written. The write driver circuit 136 writes data in byte units, half-word units, or word units in response to the signal GWSEL[15:0].

The circuit 50 is electrically connected to the data DIN[h] (h is an integer greater than or equal to 0 and less than or equal to 31) in every four columns. In addition, the circuit 50 is electrically connected to the data DOUT[h] in every four columns.

Operation Example of Memory Cell

Figure 7:
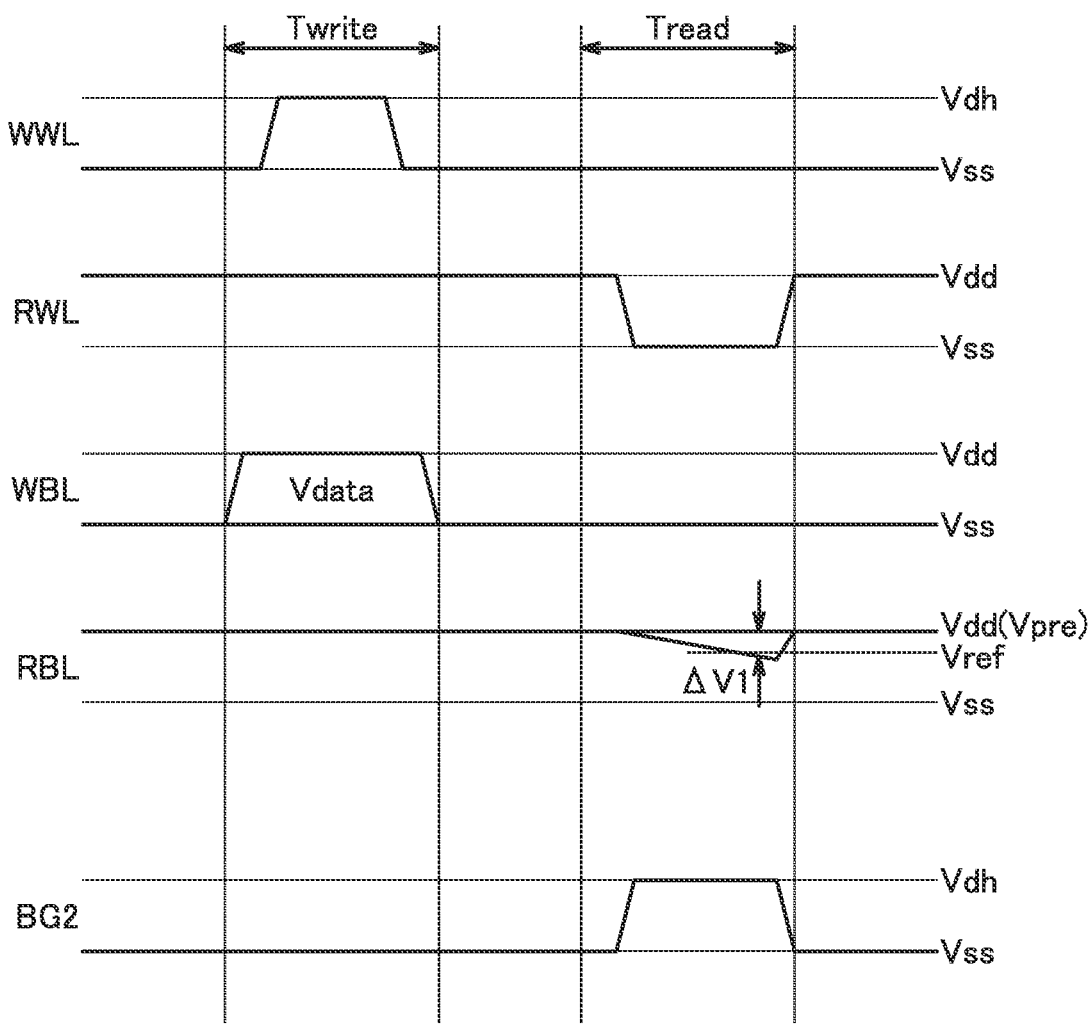
FIG. 7 is a timing chart showing an operation example of a memory cell.

FIG. 7 is a timing chart showing an operation example of the memory cell 112. FIG. 7 shows the relationship between potentials of the write word line WWL, the read word line RWL, the read bit line RBL, and the write bit line WBL in the writing operation and reading operation of the memory cell 112. The case where the wiring BG2 is driven using the word line driver circuit 122 or the word line driver circuit 123 is also described later.

In FIG. 7, Period Twrite is a period during which writing operation is performed, and Period Tread is a period during which reading operation is performed. A potential of each of the read word line RWL, the read bit line RBL, and the write bit line WBL at high level is the potential Vdd, and a potential thereof at a low level is the potential Vss. A potential of the write word line WWL at high level is the potential Vdh, and a potential of the write word line WWL at low level is the potential Vss.

«Write Operation»

In Period Twrite, a potential Vdata corresponding to data to be written is applied to the write bit line WBL. When the potential Vdh is applied to the write word line WWL of a row where the memory cells 112 to which the data is to be written are arranged in a state where the potential Vdata corresponding to the data to be written is applied to the write bit line WBL, the transistor 11 is brought into a conduction state, and the potential Vdata corresponding to the data to be written is written to the node N11.

Furthermore, in Period Twrite, the potential Vdd is applied to the read word line RWL and the read bit line RBL.

«Reading Operation»

In Period Tread, the read bit line RBL is pre-charged with the potential Vdd. When the potential Vss is applied to the read word line RWL of a row where the memory cells 112 from which data is to be read are arranged in a state where the read bit line RBL is in a floating state, in the case where the data written to the node N11 is at a high level, the transistor 12 is brought into a conduction state, and the potential of the read bit line RBL starts to be decreased.

When the potential of the read bit line RBL is decreased by ΔVi and becomes lower than the reference potential Vref, the sense amplifier circuit 51 determines that the read bit line RBL is at a low level.

In the case where the data written to the node N11 is at a low level even when the potential Vss is applied to the read word line RWL of a row where the memory cells 112 from which data is to be read are arranged in a state where the read bit line RBL is in a floating state, the transistor M12 is not brought into a conduction state, and thus the potential of the read bit line RBL is not changed. In this case, the sense amplifier circuit 51 determines that the read bit line RBL is at a high level.

In Period Tread, the potential Vss is applied to the write bit line WBL and the write word line WWL.

In the case where the wiring BG2 is driven using the word line driver circuit 122 or the word line driver circuit 123, for example, a high-level potential of the wiring BG2 can be the potential Vdh, and a low-level potential of the wiring BG2 can be the potential Vss.

In Period Twrite, the potential Vss is applied to the wiring BG2, and in Period Tread, the potential Vdh is applied to the wiring BG2 of a row where the memory cells 112 from which data is to be read are arranged.

When the potential Vdh is applied to the wiring BG2, the on-state current of the transistor 12 included in the memory cell 112 from which data is to be read can be increased. Furthermore, when the potential Vss is applied to the wiring BG2, the off-state current of the transistor 12 can be reduced.

As described above, the memory device 10 includes a gain-cell memory cell formed using an n-channel transistor, and the high level and the low level of the write word line WWL, the read word line RWL, the write bit line WBL, and the read bit line RBL are represented by three kinds of potentials (the potential Vss, the potential Vdd, and the potential Vdh). In other words, the memory device 10 can be operated with a small number of power sources. The cost of an electronic device including the memory device 10 can be reduced.

In a gain-cell structure, at least two transistors are required for one memory cell, which has made it difficult to increase the number of memory cells per unit area. However, when an OS transistor is used as a transistor included in the memory cell 112, a plurality of memory cell arrays 111 can be stacked over the semiconductor substrate SUB where the peripheral circuit 101 is formed. That is, the amount of data that can be stored per unit area can be increased.

A gain-cell memory cell can operate as a memory by amplifying accumulated charge by the closest transistor even when the capacitance of accumulated charge is small. When an OS transistor with an extremely low off-state current is used as a transistor included in the memory cell 112, the capacitance of the capacitor C11 can be made small. Since the gate capacitance of a transistor, the parasitic capacitance of a wiring, or the like can be used as the capacitor C11, the capacitor C11 may be omitted. That is, the area of the memory cell 112 can be made small.

Note that this embodiment can be implemented in combination with the other embodiments described in this specification as appropriate.

Embodiment 2

Examples of the memory device of the above embodiment are described below with reference to FIG. 8A, FIG. 8B, FIG. 9A, FIG. 9B, and FIG. 10 to FIG. 13. First, a structure example of a memory cell included in the memory device is described.

<Structure Example of Memory Cell>

Figure 8A:
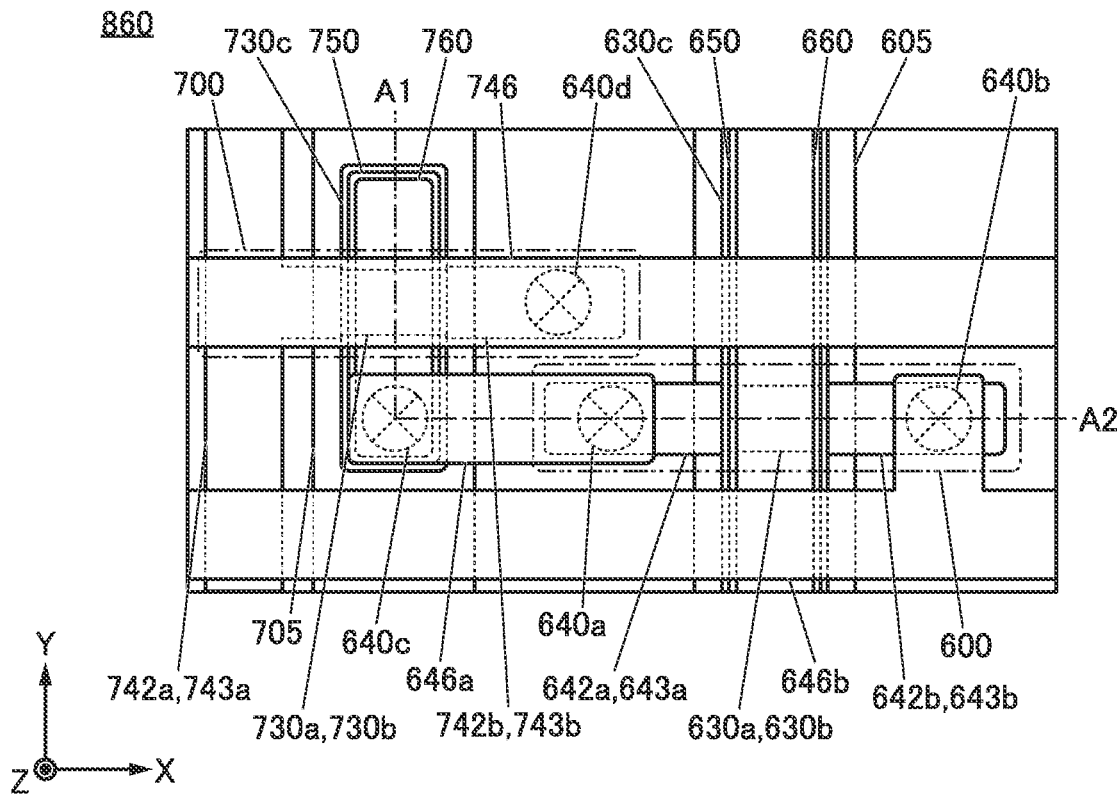
FIG. 8A and FIG. 8B are a top view and a cross-sectional view of a memory device according to one embodiment of the present invention.
Figure 8B:
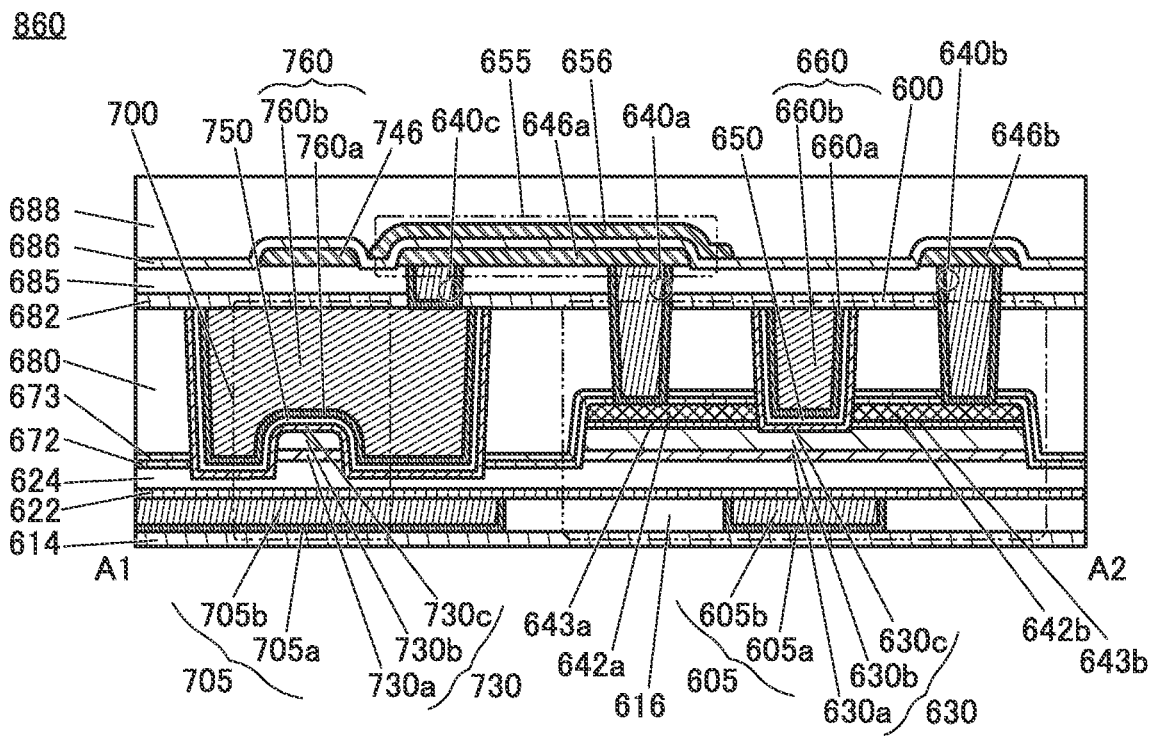

FIG. 8A and FIG. 8B illustrate the structure of a memory cell 860 included in the memory device of one embodiment of the present invention. FIG. 8A is a top view of the memory cell 860 and its periphery. FIG. 8B is a cross-sectional view of the memory cell 860, and FIG. 8B corresponds to a portion indicated by a dashed-dotted line A1-A2 in FIG. 8A. FIG. 8B illustrates a cross section of a transistor 600 in the channel length direction and a cross section of a transistor 700 in the channel width direction. Note that for clarity of the drawing, some components are omitted in the top view in FIG. 8A. Note that the X direction, the Y direction, and the Z direction illustrated in FIG. 8A are directions orthogonal to or intersecting with each other. Here, it is preferable that the X direction and the Y direction be parallel or substantially parallel to a substrate surface and the Z direction be perpendicular or substantially perpendicular to the substrate surface.

The memory cell 860 described in this embodiment includes the transistor 600, the transistor 700, and a capacitor 655. The memory cell 860 corresponds to the memory cell 112 described in the above embodiment, and the transistor 600, the transistor 700, and the capacitor 655 correspond to the transistor 11, the transistor 12, and the capacitor C11 described in the above embodiment, respectively. Thus, one of a source and a drain of the transistor 600, a gate of the transistor 700, and one electrode of the capacitor 655 are electrically connected to each other.

As illustrated in FIG. 8A and FIG. 8B, in the memory cell 860, the transistor 600 and the transistor 700 are placed over an insulator 614; an insulator 680 is placed over part of the transistor 600 and part of the transistor 700; an insulator 682 is placed over the transistor 600, the transistor 700, and the insulator 680; an insulator 685 is placed over the insulator 682; the capacitor 655 is placed over the insulator 685; and an insulator 688 is placed over the capacitor 655. The insulator 614, the insulator 680, the insulator 682, the insulator 685, and the insulator 688 function as interlayer films.

Here, the transistor 600 includes an insulator 616 over the insulator 614; conductors 605 (a conductor 605a and a conductor 605b) placed to be embedded in the insulator 616; an insulator 622 over the insulator 616 and the conductor 605; an insulator 624 over the insulator 622; an oxide 630a over the insulator 624; an oxide 630b over the oxide 630a; an oxide 643a and an oxide 643b over the oxide 630b; a conductor 642a over the oxide 643a; a conductor 642b over the oxide 643b; an insulator 672 in contact with part of the insulator 624, a side surface of the oxide 630a, a side surface of the oxide 630b, a side surface of the oxide 643a, a side surface of the conductor 642a, a top surface of the conductor 642a, a side surface of the oxide 643b, a side surface of the conductor 642b, and a top surface of the conductor 642b; an insulator 673 over the insulator 672; an oxide 630c over the oxide 630b; an insulator 650 over the oxide 630c; and conductors 660 (a conductor 660a and a conductor 660b) that are positioned over the insulator 650 and overlap with the oxide 630c. The oxide 630c is in contact with the side surface of the oxide 643a, the side surface of the oxide 643b, the side surface of the conductor 642a, and the side surface of the conductor 642b. Here, as illustrated in FIG. 8B, a top surface of the conductor 660 is placed to be substantially aligned with a top surface of the insulator 650, a top surface of the oxide 630c, and a top surface of the insulator 680. The insulator 682 is in contact with the top surfaces of the conductor 660, the insulator 650, the oxide 630c, and the insulator 680.

Hereinafter, the oxide 630a, the oxide 630b, and the oxide 630c may be collectively referred to as an oxide 630. The oxide 643a and the oxide 643b may be collectively referred to as an oxide 643. The conductor 642a and the conductor 642b may be collectively referred to as a conductor 642.

In the transistor 600, the conductor 660 functions as a gate, and the conductor 642a and the conductor 642b function as a source and a drain. The conductor 605 functions as a back gate. In the transistor 600, the conductor 660 functioning as a gate is formed in a self-aligned manner to fill an opening formed in the insulator 680 and the like. As described above, in the memory device according to this embodiment, the conductor 660 can be surely placed in a region between the conductor 642a and the conductor 642b without position alignment.

The transistor 700 includes the insulator 616 over the insulator 614; conductors 705 (a conductor 705a and a conductor 705b) placed to be embedded in the insulator 616; the insulator 622 over the insulator 616 and the conductor 705; the insulator 624 over the insulator 622; an oxide 730a over the insulator 624; an oxide 730b over the oxide 730a; an oxide 743a and an oxide 743b over the oxide 730b; a conductor 742a over the oxide 743a; a conductor 742b over the oxide 743b; the insulator 672 in contact with part of the insulator 624, a side surface of the oxide 730a, a side surface of the oxide 730b, a side surface of the oxide 743a, a side surface of the conductor 742a, a top surface of the conductor 742a, a side surface of the oxide 743b, a side surface of the conductor 742b, and a top surface of the conductor 742b; an insulator 673 over the insulator 672; an oxide 730c over the oxide 730b; an insulator 750 over the oxide 730c; and conductors 760 (a conductor 760a and a conductor 760b) that are positioned over the insulator 750 and overlap with the oxide 730c. The oxide 730c is in contact with the side surface of the oxide 743a, the side surface of the oxide 743b, the side surface of the conductor 742a, and the side surface of the conductor 742b. Here, as illustrated in FIG. 8B, a top surface of the conductor 760 is placed to be substantially aligned with a top surface of the insulator 750, a top surface of the oxide 730c, and the top surface of the insulator 680. The insulator 682 is in contact with the top surfaces of the conductor 760, the insulator 750, the oxide 730c, and the insulator 680.

Hereinafter, the oxide 730a, the oxide 730b, and the oxide 730c may be collectively referred to as an oxide 730. The oxide 743a and the oxide 743b may be collectively referred to as an oxide 743. The conductor 742a and the conductor 742b may be collectively referred to as a conductor 742.

In the transistor 700, the conductor 760 functions as a gate, and the conductor 742a and the conductor 742b function as a source and a drain. The conductor 705 functions as a back gate. In the transistor 700, the conductor 760 functioning as a gate is formed in a self-aligned manner to fill an opening formed in the insulator 680 and the like. As described above, in the memory device according to this embodiment, the conductor 760 can be surely placed in a region between the conductor 742a and the conductor 742b without position alignment.

Here, the transistor 700 and the transistor 600 are formed in the same layer and have similar structures. Thus, although a cross section of the transistor 700 in the channel length direction is not illustrated, the cross section has a structure similar to that of the cross section of the transistor 600 in the channel length direction illustrated in FIG. 8B). That is, the oxide 743 and the conductor 742, which are not illustrated in the cross-sectional view, have structures similar to those of the oxide 643 and the conductor 642 illustrated in FIG. 8B. Note that although a cross section of the transistor 600 in the channel width direction is not illustrated, the cross section has a structure similar to that of the cross section of the transistor 700 in the channel width direction illustrated in FIG. 8B.

Thus, the oxide 730 has a structure similar to that of the oxide 630 and the description of the oxide 630 can be referred to. The conductor 705 has a structure similar to that of the conductor 605, and thus the description of the conductor 605 can be referred to. The oxide 743 has a structure similar to that of the oxide 643, and thus the description of the oxide 643 can be referred to. The conductor 742 has a structure similar to that of the conductor 642, and thus the description of the conductor 642 can be referred to. The insulator 750 has a structure similar to that of the insulator 650, and thus the description of the insulator 650 can be referred to. The conductor 760 has a structure similar to that of the conductor 660, and thus the description of the conductor 660 can be referred to. Unless otherwise specified, as described above, the description of the structure of the transistor 600 can be referred to for the structure of the transistor 700 in the following description.

Here, in the transistor 600 and the transistor 700, a metal oxide functioning as an oxide semiconductor (hereinafter also referred to as an oxide semiconductor) is preferably used as the oxide 630 and the oxide 730 each including a channel formation region.

For example, a metal oxide having an energy gap of 2 eV or more, preferably 2.5 eV or more is preferably used as the metal oxide functioning as an oxide semiconductor. With the use of a metal oxide having a wide energy gap, the leakage current in the non-conduction state (off-state current) of the transistor 600 can be extremely low.

As an oxide semiconductor, a metal oxide such as an In-M-Zn oxide (an element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used as the oxide semiconductor.

The transistor 600 and the transistor 700 using an oxide semiconductor in their channel formation regions have an extremely low leakage current (off-state current) in a non-conduction state; thus, a memory device with low power consumption can be provided. The off-state current of each of the transistor 600 and the transistor 700 hardly increases even in a high-temperature environment. Specifically, the off-state current hardly increases even at an environment temperature higher than or equal to room temperature and lower than or equal to 200° C. Thus, a memory device can achieve stable operation and high reliability even in a high temperature environment.

Since the off-state current of the transistor 600 is extremely low, the capacitance value of the capacitor 655 can be set small. Accordingly, the area occupied by the memory cell 860 can be small and integration of the memory device can be achieved.

As illustrated in FIG. 8A, the conductor 742*a*, the conductor 660, the conductor 605, and the conductor 705 preferably extend in the Y direction. With such a structure, the conductor 742*a* functions as the read word line RWL described in the above embodiment. The conductor 660 functions as the write word line WWL described in the above embodiment. The conductor 605 functions as the wiring BG1 described in the above embodiment. The conductor 705 functions as the wiring BG2 described in the above embodiment.

The capacitor 655 includes a conductor 646*a* over the insulator 685, an insulator 686 covering the conductor 646*a*, and a conductor 656 placed over the insulator 686 to overlap with at least part of the conductor 646*a*. Here, the conductor 646*a* functions as the one electrode of the capacitor 655 and the conductor 656 functions as the other electrode of the capacitor 655. The insulator 686 functions as a dielectric of the capacitor 655.

Furthermore, the conductor 656 preferably extends in the Y direction to function as the plate line PL described in the above embodiment.

In addition, openings are formed in the insulator 672, the insulator 673, the insulator 680, the insulator 682, and the insulator 685, and conductors 640 (a conductor 640*a*, a conductor 640*b*, a conductor 640*c*, and a conductor 640*d*) functioning as plugs are embedded in the openings. The conductor 640 is provided so as to be exposed on a top surface of the insulator 685.

A bottom surface of the conductor 640*a* is in contact with the conductor 642*a* and a top surface is in contact with the conductor 646*a*. A bottom surface of the conductor 640*c* is in contact with the conductor 760 and a top surface is in contact with the conductor 646*a*. In this manner, one of the source and the drain of the transistor 600, the gate of the transistor 700, and the one electrode of the capacitor 655 are electrically connected to each other.

The conductor 640*b* is provided so that its bottom surface is in contact with the conductor 642*b*. A conductor 646*b* is provided in contact with a top surface of the conductor 640*b*. The conductor 646*b* and the conductor 646*a* are formed in the same layer and have similar structures. As illustrated in FIG. 8A, the conductor 646*b* preferably extends in the X direction. With such a structure, the conductor 646*b* functions as the write bit line WBL described in the above embodiment.

Although not illustrated in the cross-sectional view, the conductor 640*d* is provided so that its bottom surface is in contact with the conductor 742*b*. A conductor 746 is provided in contact with a top surface of the conductor 640*d*. The conductor 746 and the conductor 646*a* are formed in the same layer and have similar structures. As illustrated in FIG. 8A, the conductor 746 preferably extends in the X direction. With such a structure, the conductor 746 functions as the read bit line RBL described in the above embodiment.

In the case where the transistor 600 and the transistor 700 are formed in the same layer as illustrated in FIG. 8B, the transistor 600 and the transistor 700 can be formed in the same step. Accordingly, the manufacturing process of the memory device can be shortened and productivity can be improved.

Note that although the transistor 600, the transistor 700, and the capacitor 655 in the memory cell 860 are provided such that the channel width direction of the transistor 600 and the channel length direction of the transistor 700 are parallel to each other, the memory device described in this embodiment is not limited thereto. The memory cell 860 illustrated in FIG. 8 and the like is a structure example of the memory device, and the transistors, capacitors, or the like having appropriate structures are placed as appropriate depending on a circuit structure or a driving method.

[Specific Structure of Memory Cell]

The structure of the memory cell 860 according to one embodiment of the present invention is described in detail below. Hereinafter, the description of the components of the transistor 600 can be referred to for the components of the transistor 700.

As illustrated in FIG. 8, the oxide 630 preferably includes the oxide 630*a* over the insulator 624, the oxide 630*b* over the oxide 630*a*, and the oxide 630*c* that is placed over the oxide 630*b* and is at least partly in contact with a top surface of the oxide 630*b*. Here, a side surface of the oxide 630*c* is preferably provided in contact with the oxide 643*a*, the oxide 643*b*, the conductor 642*a*, the conductor 642*b*, the insulator 672, the insulator 673, and the insulator 680.

Including the oxide 630*a* under the oxide 630*b* makes it possible to inhibit diffusion of impurities into the oxide 630*b* from the components formed below the oxide 630*a*. Moreover, including the oxide 630*c* over the oxide 630*b* makes it possible to inhibit diffusion of impurities into the oxide 630*b* from the components formed above the oxide 630*c*.

Note that the transistor 600 has a structure in which three layers of the oxide 630*a*, the oxide 630*b*, and the oxide 630*c* are stacked in a channel formation region and its vicinity; however, the present invention is not limited thereto. For example, a single layer of the oxide 630*b*, a two-layer structure of the oxide 630*b* and the oxide 630*a*, a two-layer structure of the oxide 630*b* and the oxide 630*c*, or a stacked-layer structure of four or more layers may be employed. For example, a stacked-layer structure of four layers including the oxide 630*c* with a two-layer structure may be provided.

In addition, the oxide 630 preferably has a stacked-layer structure of oxide layers which differ in the atomic ratio of metal atoms. Specifically, the atomic proportion of the element M in the constituent elements in the metal oxide used as the oxide 630*a* is preferably higher than the atomic proportion of the element M in the constituent elements in the metal oxide used as the oxide 630*b*. In addition, the atomic ratio of the element M to In in the metal oxide used as the oxide 630*a* is preferably higher than the atomic ratio of the element M to In in the metal oxide used as the oxide 630*b*. Furthermore, the atomic ratio of In to the element M in the metal oxide used as the oxide 630*b* is preferably higher than the atomic ratio of In to the element M in the metal oxide used as the oxide 630*a*. A metal oxide that can be used as the oxide 630*a* or the oxide 630*b* can be used as the oxide 630*c*. Note that the atomic ratio of In to the element M in the metal oxide used as the oxide 630*c* may be greater than the atomic ratio of In to the element M in the metal oxide used as the oxide 630*b*.

Specifically, when gallium is used as the element M, for example, for the oxide 630*a*, a metal oxide having In:Ga:Zn=1:3:4 [atomic ratio] or a composition in the vicinity thereof, or 1:1:0.5 [atomic ratio] or a composition in the vicinity thereof is used.

As the oxide 630*b*, a metal oxide having In:Ga:Zn=4:2:3 [atomic ratio] or a composition that is a neighborhood thereof or 1:1:1 [atomic ratio] or a composition that is a neighborhood thereof is used. As the oxide 630*b*, a metal oxide having In:Ga:Zn=5:1:3 [atomic ratio] or a composition that is a neighborhood thereof or In:Ga:Zn=10:1:3 [atomic ratio] or a composition that is a neighborhood thereof may be used. As the oxide 630*b*, an In—Zn oxide (e.g., In:Zn=2:1 [atomic ratio] or a composition that is a neighborhood thereof, In:Zn=5:1 [atomic ratio] or a composition that is a neighborhood thereof, or In:Zn=10:1 [atomic ratio] or a composition that is a neighborhood thereof) may be used. As the oxide 630*b*, an In oxide may be used.

As the oxide 630*c*, a metal oxide having In:Ga:Zn=1:3:4 [atomic ratio or a composition that is a neighborhood thereof], Ga:Zn=2:1 [atomic ratio] or a composition that is a neighborhood thereof, or Ga:Zn=2:5 [atomic ratio] or a composition that is a neighborhood thereof is used. A single layer or stacked layers of the material that can be used for the oxide 630*b* may be used for the oxide 630*c*. Specific examples of the oxide 630*c* having a stacked-layer structure include a stacked-layer structure of In:Ga:Zn=4:2:3 [atomic ratio] or a composition that is a neighborhood thereof and In:Ga:Zn=1:3:4 [atomic ratio] or a composition that is a neighborhood thereof, a stacked-layer structure of Ga:Zn=2:1 [atomic ratio] or a composition that is a neighborhood thereof and In:Ga:Zn=4:2:3 [atomic ratio] or a composition that is a neighborhood thereof, a stacked-layer structure of Ga:Zn=2:5 [atomic ratio] or a composition that is a neighborhood thereof and In:Ga:Zn=4:2:3 [atomic ratio] or a composition that is a neighborhood thereof, and a stacked-layer structure of gallium oxide and In:Ga:Zn=4:2:3 [atomic ratio] or a composition that is a neighborhood thereof.

Moreover, an increase in the proportion of indium in the oxides 630*b* and 630*c* can increase the on-state current, field-effect mobility, or the like of the transistor, which is preferable. The above-described composition that is a neighborhood includes ±30% of an intended atomic ratio.

The oxide 630*b* may have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit extraction of oxygen from the oxide 630*b* by the source electrode or the drain electrode. In addition, the amount of oxygen extracted from the oxide 630*b* can be reduced even when heat treatment is performed; thus, the transistor 600 is stable at high temperatures (what is called thermal budget) in a manufacturing process.

In addition, the oxide 630*c* is preferably provided in the opening provided in the interlayer films including the insulator 680. Thus, the insulator 650 and the conductor 660 include a region that overlaps with a stacked-layer structure of the oxide 630*b* and the oxide 630*a* with the oxide 630*c* therebetween. With this structure, the oxide 630*c* and the insulator 650 can be sequentially deposited and thus, the interface between the oxide 630 and the insulator 650 can be kept clean. Thus, the influence of interface scattering on carrier conduction is small, and the transistor 600 can have a high on-state current and excellent frequency characteristics.

An oxide semiconductor with a low carrier concentration is preferably used as the oxide 630 (e.g., the oxide 630*b*). In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in an oxide semiconductor reacts with oxygen bonded to a metal atom to be water, and thus sometimes forms an oxygen vacancy (also referred to as Vo) in the oxide semiconductor. In some cases, a defect where hydrogen enters an oxygen vacancy (hereinafter, sometimes referred to as VoH) functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

VoH can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Accordingly, in the case where an oxide semiconductor is used as the oxide 630, VoH in the oxide 630 is preferably reduced as much as possible so that the oxide 630 becomes a highly purified intrinsic or substantially highly purified intrinsic oxide. In order to obtain such an oxide semiconductor with sufficiently reduced VoH, it is preferable to remove impurities such as moisture and hydrogen in the oxide semiconductor (this treatment is sometimes referred to as dehydration treatment or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

The hydrogen concentration of the oxide 630b, which is measured by secondary ion mass spectrometry (SIMS), can be lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$, for example. The oxide 630 with sufficiently reduced impurities such as hydrogen is used for the channel formation region of the transistor 600, whereby the transistor can have normally-off characteristics, stable electrical characteristics, and improved reliability.

When an oxide semiconductor is used for the oxide 630, the carrier concentration of the oxide semiconductor in a region functioning as a channel formation region is preferably lower than or equal to $1 \times 10^{18}$ cm$^3$, further preferably lower than $1 \times 10^{17}$ cm$^3$, still further preferably lower than $1 \times 10^{16}$ cm$^3$, yet still further preferably lower than $1 \times 10^{13}$ cm$^3$, yet still further preferably lower than $1 \times 10^{12}$ cm 3. Note that the lower limit of the carrier concentration of the oxide semiconductor in the region functioning as the channel formation region is not particularly limited and can be, for example, $1 \times 10^{-9}$ cm 3.

Thus, it is preferable to use a material inhibiting diffusion of impurities (hereinafter, also referred to as a material having a barrier property against impurities) for each of the insulator 614, the insulator 622, the insulator 672, the insulator 673, and the insulator 682 to reduce diffusion of impurities such as hydrogen into the oxide 630. A barrier property in this specification and the like means a function of inhibiting diffusion of a particular substance (also referred to as a function of less easily transmitting the substance). Alternatively, a barrier property in this specification and the like means a function of trapping and fixing (also referred to as gettering) a particular substance. In this specification and the like, an insulating film having a barrier property is referred to as a barrier insulating film in some cases.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

For example, as the insulator 614, aluminum oxide or hafnium oxide is preferably used. Accordingly, impurities such as water or hydrogen can be inhibited from being diffused to the transistor 600 side from the substrate side. In addition, oxygen contained in the insulator 624 and the like can be inhibited from being diffused to the substrate side.

The conductor 605 is provided to overlap with the oxide 630 and the conductor 660. Furthermore, the conductor 605 is preferably embedded in the insulator 616.

When the conductor 605 functions as a back gate, by changing a potential applied to the conductor 605 not in conjunction with but independently of a potential applied to the conductor 660, the threshold voltage (Vth) of the transistor 600 can be adjusted. In particular, by applying a negative potential to the conductor 605, Vth of the transistor 600 can be further increased, and the off-state current can be reduced. Thus, a drain current at the time when a potential applied to the conductor 660 is 0 V can be lower in the case where a negative potential is applied to the conductor 605 than in the case where a negative potential is not applied to the conductor 605.

As illustrated in FIG. 8A, the conductor 605 is preferably provided to be larger than a region of the oxide 630 that does not overlap with the conductor 642a or the conductor 642b. It is particularly preferable that the conductor 605 extend beyond an end portion of the oxide 630 that intersects with the channel width direction, as illustrated in FIG. 8B. That is, the conductor 605 and the conductor 660 preferably overlap with each other with the insulators therebetween on an outer side of the side surface of the oxide 630 in the channel width direction. A large conductor 605 can sometimes reduce local charging (referred to as charge up) in treatment using plasma of a fabrication step after the formation of the conductor 605. Note that one embodiment of the present invention is not limited thereto. The conductor 605 overlaps with at least the oxide 630 positioned between the conductor 642a and the conductor 642b.

When a bottom surface of the insulator 624 is used as a reference, the level of a bottom surface of the conductor 660 in a region where the oxide 630a and the oxide 630b do not overlap with the conductor 660 is preferably placed lower than the level of a bottom surface of the oxide 630b.

As illustrated in the drawing, when a structure in which the conductor 660, which functions as a gate, covers the side surface and the top surface of the oxide 630b in the channel formation region with the oxide 630c and the insulator 650 therebetween is employed, electric fields generated from the conductor 660 are likely to affect the entire channel formation region generated in the oxide 630b. Thus, the on-state current of the transistor 600 can be increased and the frequency characteristics can be improved. In this specification, a transistor structure in which a channel formation region is electrically surrounded by electric fields of the first gate and the second gate is referred to as a surrounded channel (S-channel) structure.

The conductor 605a is preferably a conductor that inhibits passage of oxygen and impurities such as water or hydrogen. For example, titanium, titanium nitride, tantalum, or tantalum nitride can be used. For the conductor 605b, a conductive material containing tungsten, copper, or aluminum as its main component is preferably used. Although the conductor 605 is illustrated as having two layers, a multilayer structure with three or more layers may be employed.

The insulator 616, the insulator 680, the insulator 685, and the insulator 688 preferably have a lower permittivity than the insulator 614. When a material with a low permittivity is used for the interlayer film, the parasitic capacitance generated between wirings can be reduced. For each of the insulator 616, the insulator 680, the insulator 685, and the insulator 688, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 616, the insulator 680, the insulator 685, and the insulator 688 may be deposited by a CVD method or an ALD method using a compound gas containing no hydrogen atom or having a low hydrogen atom content.

A gas containing a molecule including a silicon atom is mainly used as a deposition gas for depositing the above insulating films. In order to reduce hydrogen contained in the above insulating films, the molecule including a silicon atom preferably contains as few hydrogen atoms as possible; further preferably, the molecule including a silicon atom contains no hydrogen atom. A deposition gas other than a gas containing a molecule including a silicon atom preferably includes as few hydrogen atoms as possible, further preferably includes no hydrogen atom.

In the case where the molecule containing a silicon atom is expressed as $Si_x$—$R_y$, a functional group R can be at least one of an isocyanate group (—N=C=O), a cyanate group (—O—C=N), a cyano group (—C=N), a diazo group (=$N_2$), an azide group (—$N_3$), a nitroso group (—NO), and a nitro group (—$NO_2$). For example, $1 \leq x \leq 3$ and $1 \leq y \leq 8$ are employed. For example, tetraisocyanatesilane, tetracyanatesilane, tetracyanosilane, hexaisocyanatesilane, or octaisocyanatesilane can be used as the molecule including a silicon atom. The examples here each show the molecule in which functional groups of the same kind are bonded to the silicon atom; however, this embodiment is not limited to these examples. Different kinds of functional groups may be bonded to the silicon atom.

A halogen (chlorine, bromine, iodine, or fluorine) can be used for the functional group R, for example. For example, $1 \leq x \leq 2$ and $1 \leq y \leq 6$ are employed. Examples of such a molecule including a silicon atom are tetrachlorosilane ($SiCl_4$), hexachlorodisilane ($Si_2Cl_6$), and the like. Although an example of using chlorine as the functional group is described here, halogens other than chlorine, such as bromine, iodine, or fluorine, may be used as the functional group. In addition, different kinds of halogens may be bonded to the silicon atom.

The insulator 622 and the insulator 624 have a function of a gate insulator.

Here, it is preferable that the insulator 624 in contact with the oxide 630 release oxygen by heating. In this specification, oxygen that is released by heating is referred to as excess oxygen in some cases. For example, silicon oxide, silicon oxynitride, or the like is used as appropriate for the insulator 624. When an insulator containing oxygen is provided in contact with the oxide 630, oxygen vacancies in the oxide 630 can be reduced and the reliability of the transistor 600 can be improved.

As the insulator 624, specifically, an oxide material from which part of oxygen is released by heating is preferably used. An oxide from which oxygen is released by heating is an oxide film in which the number of released oxygen molecules is greater than or equal to $1.0 \times 10^{18}$ molecules/$cm^3$, preferably greater than or equal to $1.0 \times 10^{19}$ molecules/$cm^3$, further preferably greater than or equal to $2.0 \times 10^{19}$ molecules/$cm^3$ or greater than or equal to $3.0 \times 10^{20}$ molecules/$cm^3$ in thermal desorption spectroscopy analysis (TDS analysis). Note that the temperature of the film surface in the TDS analysis is preferably within the range of 100° C. to 700° C., or 100° C. to 400° C.

The insulator 622 preferably functions as a barrier insulating film that inhibits impurities such as water or hydrogen from entering the transistor 600 from the substrate side. For example, the insulator 622 preferably has lower hydrogen permeability than the insulator 624. Surrounding the insulator 624, the oxide 630, and the like by the insulator 622, the insulator 672, and the like can inhibit entry of impurities such as water or hydrogen into the transistor 600 from the outside.

Furthermore, it is preferable that the insulator 622 have a function of inhibiting diffusion of oxygen (e.g., at least one of an oxygen atom, an oxygen molecule, and the like) (through which the above oxygen is less likely to pass). For example, the insulator 622 preferably has lower oxygen permeability than the insulator 624. The insulator 622 preferably has a function of inhibiting diffusion of oxygen or impurities, in which case diffusion of oxygen contained in the oxide 630 into a layer under the insulator 622 can be reduced. Moreover, the conductor 605 can be inhibited from reacting with oxygen contained in the insulator 624 and the oxide 630.

As the insulator 622, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 622 is formed using such a material, the insulator 622 functions as a layer that inhibits release of oxygen from the oxide 630 and entry of impurities such as hydrogen from the periphery of the transistor 600 into the oxide 630.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material, such as aluminum oxide, hafnium oxide, tantalum oxide, zirconium oxide, lead zirconate titanate (PZT), strontium titanate ($SrTiO_3$), or (Ba,Sr)$TiO_3$ (BST), may be used as the insulator 622. In the case where the insulator 622 has a stacked-layer structure, a three-layer structure in which zirconium oxide, aluminum oxide, and zirconium oxide are formed in this order, or a four-layer structure in which zirconium oxide, aluminum oxide, zirconium oxide, and aluminum oxide are formed in this order is employed, for example. For the insulator 622, a compound containing hafnium and zirconium may be used. With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

Note that the insulator 622 and the insulator 624 may each have a stacked-layer structure of two or more layers. In such a case, without limitation to a stacked-layer structure formed of the same material, a stacked-layer structure formed of different materials may be employed.

The oxide 643 (the oxide 643a and the oxide 643b) may be placed between the oxide 630b and the conductor 642 (the conductor 642a and the conductor 642b) which functions as the source electrode or the drain electrode. This structure in which the conductor 642 and the oxide 630 are not in contact with each other can inhibit the conductor 642 from absorbing oxygen in the oxide 630. That is, preventing oxidation of the conductor 642 can inhibit the decrease in conductivity of the conductor 642. Thus, the oxide 643 preferably has a function of inhibiting oxidation of the conductor 642.

Accordingly, the oxide 643 preferably has a function of inhibiting passage of oxygen. It is preferable to place the oxide 643 having a function of inhibiting passage of oxygen between the oxide 630b and the conductor 642, which functions as the source electrode and the drain electrode, in which case the electrical resistance between the conductor 642 and the oxide 630b is reduced. Such a structure improves the electrical characteristics of the transistor 600 and the reliability of the transistor 600.

A metal oxide containing the element M may be used as the oxide 643. In particular, aluminum, gallium, yttrium, or tin is preferably used as the element M. The concentration of the element M in the oxide 643 is preferably higher than that in the oxide 630*b*. Alternatively, gallium oxide may be used as the oxide 643. A metal oxide such as an In-M-Zn oxide may be used as the oxide 643. Specifically, the atomic ratio of the element M to In in the metal oxide used as the oxide 643 is preferably greater than the atomic ratio of the element M to In in the metal oxide used as the oxide 630*b*. The thickness of the oxide 643 is preferably greater than or equal to 0.5 nm and less than or equal to 5 nm, further preferably greater than or equal to 1 nm and less than or equal to 3 nm. The oxide 643 preferably has crystallinity. In the case where the oxide 643 has crystallinity, release of oxygen from the oxide 630 can be favorably inhibited. When the oxide 643 has a hexagonal crystal structure, for example, release of oxygen from the oxide 630 can sometimes be inhibited.

Note that the oxide 643 is not necessarily provided. In that case, contact between the conductor 642 (the conductor 642*a* and the conductor 642*b*) and the oxide 630 may make oxygen in the oxide 630 diffuse into the conductor 642, resulting in oxidation of the conductor 642. It is highly possible that oxidation of the conductor 642 lowers the conductivity of the conductor 642. Note that diffusion of oxygen in the oxide 630 into the conductor 642 can be interpreted as absorption of oxygen in the oxide 630 by the conductor 642.

When oxygen in the oxide 630 is diffused into the conductor 642 (the conductor 642*a* and the conductor 642*b*), a layer is sometimes formed between the conductor 642*a* and the oxide 630*b*, and between the conductor 642*b* and the oxide 630*b*. The layer contains more oxygen than the conductor 642 does, and thus presumably has an insulating property. In this case, a three-layer structure of the conductor 642, the layer, and the oxide 630*b* can be regarded as a three-layer structure of a metal, an insulator, and a semiconductor and is sometimes referred to as a MIS (Metal-Insulator-Semiconductor) structure or a diode junction structure having an MIS structure as its main part.

The above layer is not necessarily formed between the conductor 642 and the oxide 630*b*, but the layer may be formed between the conductor 642 and the oxide 630*c*, or formed between the conductor 642 and the oxide 630*b* and between the conductor 642 and the oxide 630*c*, for example.

The conductor 642 (the conductor 642*a* and the conductor 642*b*) functioning as the source electrode and the drain electrode is provided over the oxide 643. The thickness of the conductor 642 is greater than or equal to 1 nm and less than or equal to 50 nm, preferably greater than or equal to 2 nm and less than or equal to 25 nm, for example.

For the conductor 642, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten nitride, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 672 is provided in contact with a top surface of the conductor 642 and preferably functions as a barrier insulating film. The insulator 673 functioning as a barrier insulating film is preferably provided over the insulator 672. With such a structure, absorption of excess oxygen contained in the insulator 680 by the conductor 642 can be inhibited. Furthermore, by inhibiting oxidation of the conductor 642, an increase in the contact resistance between the transistor 600 and a wiring can be inhibited. Consequently, the transistor 600 can have favorable electrical characteristics and reliability.

Thus, the insulator 672 and the insulator 673 preferably have a function of inhibiting diffusion of oxygen. For example, the insulator 672 preferably has a function of further inhibiting diffusion of oxygen as compared to the insulator 680. An insulator containing an oxide of one or both of aluminum and hafnium is preferably deposited as the insulator 672, for example. As the insulator 673, for example, silicon nitride or silicon nitride oxide is used.

Impurities such as water or hydrogen can be inhibited from being diffused to the transistor 600 side from the insulator 680 and the like, which are provided with the insulator 672 and the insulator 673 therebetween. In this manner, the transistor 600 is preferably surrounded by the insulator 672 and the insulator 673 having a function of inhibiting diffusion of oxygen and impurities such as water or hydrogen.

The insulator 650 functions as a gate insulator. The insulator 650 is preferably placed in contact with the top surface of the oxide 630*c*. For the insulator 650, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

Like the insulator 624, the insulator 650 is preferably formed using an insulator from which oxygen is released by heating. When an insulator from which oxygen is released by heating is provided as the insulator 650 in contact with the top surface of the oxide 630*c*, oxygen can be efficiently supplied to the channel formation region of the oxide 630*b*. Furthermore, as in the insulator 624, the concentration of impurities such as water or hydrogen in the insulator 650 is preferably reduced. The thickness of the insulator 650 is preferably greater than or equal to 1 nm and less than or equal to 20 nm.

Furthermore, a metal oxide may be provided between the insulator 650 and the conductor 660. The metal oxide preferably inhibits diffusion of oxygen from the insulator 650 into the conductor 660. Providing the metal oxide that inhibits diffusion of oxygen inhibits diffusion of oxygen from the insulator 650 into the conductor 660. That is, a reduction in the amount of oxygen supplied to the oxide 630 can be inhibited. In addition, oxidation of the conductor 660 due to oxygen from the insulator 650 can be inhibited.

The metal oxide has a function of part of the gate insulator in some cases. Therefore, when silicon oxide, silicon oxynitride, or the like is used for the insulator 650, a metal oxide that is a high-k material with a high relative permittivity is preferably used as the metal oxide. When the gate insulator has a stacked-layer structure of the insulator 650 and the metal oxide, the stacked-layer structure can be thermally stable and have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, it is possible to use a metal oxide containing one kind or two or more kinds selected from hafnium, aluminum, gallium, yttrium, zirconium, tungsten, titanium, tantalum, nickel, germanium, magnesium, and the like. It is particularly preferable to use an insulator containing an oxide of one or both of aluminum and hafnium, such as aluminum oxide, hafnium oxide, or an oxide containing aluminum and hafnium (hafnium aluminate).

Alternatively, the metal oxide has a function of part of the gate in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

The bottom surface and a side surface of the conductor 660 are in contact with the insulator 650. Although the conductor 660 has a two-layer structure in FIG. 8, the conductor 660 may have a single-layer structure or a stacked-layer structure of three or more layers.

For the conductor 660*a*, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 660*a* has a function of inhibiting diffusion of oxygen, the conductivity of the conductor 660*b* can be inhibited from being lowered because of oxidation due to oxygen contained in the insulator 650. As a conductive material having a function of inhibiting diffusion of oxygen, for example, tantalum, tantalum nitride, ruthenium, ruthenium oxide, or the like is preferably used.

For the conductor 660*b*, a conductive material containing tungsten, copper, or aluminum as its main component is preferably used. The conductor 660 also functions as a wiring and thus is a conductor with high conductivity is preferably used as the conductor 660*b*. For example, a conductive material containing tungsten, copper, or aluminum as its main component can be used. Moreover, the conductor 660*b* may have a stacked-layer structure, for example, a stacked-layer structure of the above conductive material and titanium or titanium nitride.

For the insulator 680, for example, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably used. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable. The insulator 680 may have a stacked-layer structure of the above materials, for example, a structure in which silicon oxynitride deposited by a CVD method is stacked over silicon oxide deposited by a sputtering method. Furthermore, silicon nitride may be stacked thereover.

Here, the insulator 680 preferably contains excess oxygen. For example, silicon oxide, silicon oxynitride, or the like is used as appropriate for the insulator 680. When the insulator 680 containing excess oxygen is provided in contact with the oxide 630, oxygen vacancies in the oxide 630 can be reduced and the reliability of the transistor 600 can be improved. In order that the insulator 680 contains excess oxygen, deposition of the insulator 682 is performed by a sputtering method in an oxygen-containing atmosphere, for example. The insulator 682 is deposited by a sputtering method in an oxygen-containing atmosphere, whereby oxygen can be added to the insulator 680 during the deposition.

The concentration of impurities such as water or hydrogen in the insulator 680 is preferably reduced. In addition, the top surface of the insulator 680 may be planarized.

The insulator 682 preferably functions as a barrier insulating film that inhibits impurities such as water or hydrogen from entering the insulator 680 from the above. The insulator 682 preferably functions as a barrier insulating film that inhibits passage of oxygen. As the insulator 682, an insulator such as aluminum oxide, silicon nitride, or silicon nitride oxide is used, for example. For example, as the insulator 682, aluminum oxide having a high barrier property against oxygen is used.

As illustrated in FIG. 8B, the insulator 682 is directly in contact with the oxide 630*c*. Owing to this structure, diffusion of oxygen contained in the insulator 680 into the conductor 660 can be inhibited. Therefore, oxygen contained in the insulator 680 can be supplied to the oxide 630*a* and the oxide 630*b* efficiently through the oxide 630*c*; hence, oxygen vacancies in the oxide 630*a* and the oxide 630*b* can be reduced and the electrical characteristics and the reliability of the transistor 600 can be improved.

The insulator 685 functioning as an interlayer film is preferably provided over the insulator 682. As in the insulator 624 and the like, the concentration of impurities such as water or hydrogen in the insulator 685 is preferably reduced.

For the conductor 640, a conductive material containing tungsten, copper, or aluminum as its main component is preferably used. In addition, the conductor 640 may have a stacked-layer structure. Note that the conductor 640 has a circular shape in the top view in FIG. 8A; however, the shape of the conductor is not limited thereto. For example, in the top view, the conductor 640 may have an almost circular shape such as an elliptical shape, a polygonal shape such as a quadrangular shape, or a polygonal shape such as a quadrangular shape with rounded corners.

In the case where the conductor 640 has a stacked-layer structure, a conductive material having a function of inhibiting passage of oxygen and impurities such as water or hydrogen is preferably used. For example, tantalum, tantalum nitride, titanium, titanium nitride, ruthenium, ruthenium oxide, or the like is preferably used. A single layer or stacked layers of the conductive material having a function of inhibiting passage of oxygen and impurities such as water or hydrogen may be used. With the use of the conductive material, entry of impurities diffused from the insulator 680 and the like, such as water or hydrogen, into the oxide 630 through the conductor 640 can be further reduced. In addition, oxygen added to the insulator 680 can be prevented from being absorbed by the conductor 640.

In addition, the conductor 646a is placed to be in contact with a top surface of the conductor 640a, a top surface of the conductor 640c, and the conductor 646b is placed to be in contact with a top surface of the conductor 640b, and a top surface of the conductor 640c, and the conductor 746 is placed to be in contact with a top surface of the conductor 640d. For the conductor 646a, the conductor 646b, and the conductor 746, a conductive material containing tungsten, copper, or aluminum as its main component is preferably used. The conductor 646a, the conductor 646b, and the conductor 746 may each have a stacked-layer structure, for example, may be stacked layers of titanium or titanium nitride and the above conductive material. Note that the conductor may be formed to be embedded in an opening provided in an insulator.

The insulator 686 is provided to cover the insulator 685, the conductor 646a, the conductor 646b, and the conductor 746. The insulator 686 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide.

For example, for the insulator 686, a stacked-layer structure using a material with high dielectric strength such as silicon oxynitride and a high permittivity (high-k) material may be employed. In the capacitor 655 having such a structure, a sufficient capacitance can be ensured owing to the high permittivity (high-k) insulator, and the dielectric strength can be increased owing to the insulator with high dielectric strength, so that the electrostatic breakdown of the capacitor 655 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

The conductor 656 is placed to overlap with at least part of the conductor 646a with the insulator 686 therebetween. For the conductor 656, a conductor that can be used as the conductor 646 is used.

The insulator 688 functioning as an interlayer film is preferably provided over the insulator 686 and the conductor 656. As in the insulator 624 and the like, the concentration of impurities such as water or hydrogen in the insulator 688 is preferably reduced.

«Modification Example of Memory Cell»

Figure 9A:
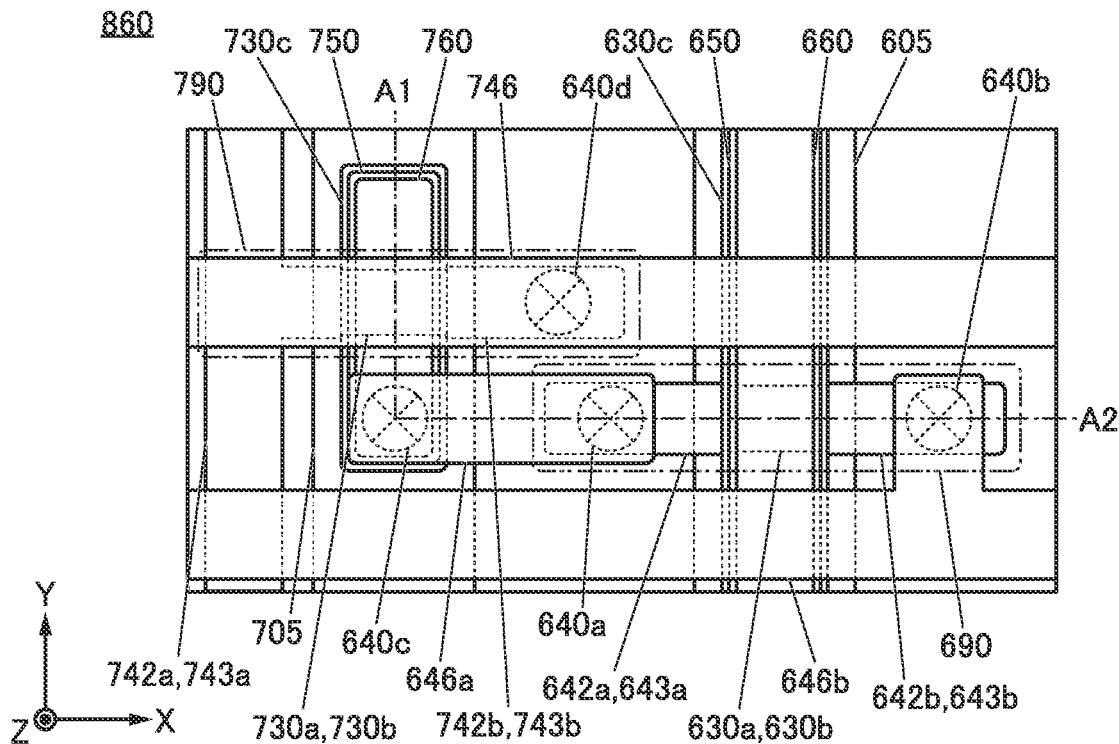
FIG. 9A and FIG. 9B are a top view and a cross-sectional view of a memory device according to one embodiment of the present invention.
Figure 9B:
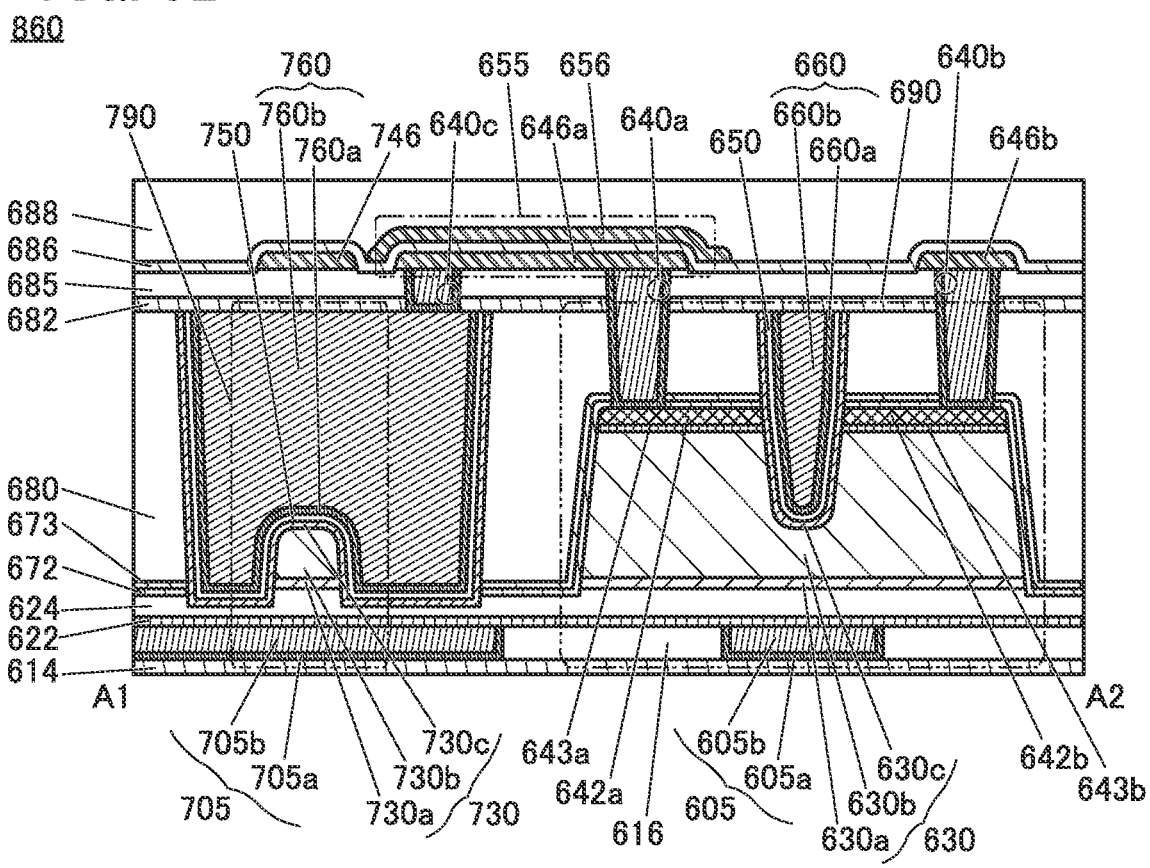

A modification example of the memory cell will be described below with reference to FIG. 9. FIG. 9A is a top view of the memory cell 860 and its periphery. FIG. 9B is a cross-sectional view of the memory cell 860, and FIG. 9B corresponds to a portion indicated by a dashed-dotted line A1-A2 in FIG. 9A. FIG. 9B illustrates a cross section of a transistor 690 in the channel length direction and a cross section of a transistor 790 in the channel width direction. Note that for clarity of the drawing, some components are omitted in the top view in FIG. 9A. Note that the X direction, the Y direction, and the Z direction illustrated in FIG. 9A are directions orthogonal to or intersecting with each other. Here, it is preferable that the X direction and the Y direction be parallel or substantially parallel to a substrate surface and the Z direction be perpendicular or substantially perpendicular to the substrate surface.

The memory cell 860 illustrated in FIG. 9 is different from the memory cell 860 illustrated in FIG. 8 in that a transistor 690 and a transistor 790 are used instead of the transistor 600 and the transistor 700. Here, the transistor 790 and the transistor 690 are formed in the same layer and have similar structures. Hereinafter, the description of the components of the transistor 690 can be referred to for the components of the transistor 790.

The transistor 690 is different from the transistor 600 in that the oxide 630c is formed in a U-shape along an opening portion formed in the insulator 680, the insulator 672, the insulator 673, the conductors 642 (the conductor 642a and the conductor 642b), and the oxide 630b.

For example, in the case where the channel length of the transistor is reduced (typically greater than or equal to 5 nm and less than 60 nm, preferably greater than or equal to 10 nm and less than or equal to 30 nm), the above-described structure of the transistor 600 can make the effective L length longer. For example, in the case where the distance between the conductor 642a and the conductor 642b is 20 nm, the effective L length can be greater than or equal to 40 nm and less than or equal to 60 nm, i.e., approximately two to three times the distance between the conductor 642a and the conductor 642b or the minimum feature size. Thus, the memory cell 860 illustrated in FIG. 9 has a structure including the transistor 690, the transistor 790, and the capacitor 655, which are excellent in miniaturization.

«Metal Oxide»

As the oxide 630, a metal oxide functioning as an oxide semiconductor is preferably used. A metal oxide that can be used as the oxide 630 of the present invention is described below.

The metal oxide preferably contains at least indium or zinc. In particular, indium and zinc are preferably contained. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also referred to as a metal oxide in some cases. A metal oxide containing nitrogen may be referred to as a metal oxynitride.

As an oxide semiconductor (metal oxide), a CAC-OS (Cloud-Aligned Composite Oxide Semiconductor), a CAAC-OS (c-axis Aligned Crystal Semiconductor), a polycrystalline oxide semiconductor, an nc-OS (nanocrystalline oxide semiconductor), an amorphous-like oxide semiconductor (a-like OS), an amorphous oxide semiconductor, or the like can be used. The details will be described in a later embodiment.

[Impurities]

Here, the influence of each impurity in the metal oxide will be described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. Moreover, when the channel formation region includes oxygen vacancies, the transistor tends to have normally-on characteristics.

The above-described defect states may include a trap state. Charges trapped by the trap states in the metal oxide take a long time to disappear and may behave like fixed charges. Thus, a transistor whose channel formation region includes a metal oxide having a high density of trap states has unstable electrical characteristics in some cases.

If the impurities exist in the channel formation region of the oxide semiconductor, the crystallinity of the channel formation region may decrease, and the crystallinity of an oxide provided in contact with the channel formation region may decrease. Low crystallinity of the channel formation region tends to result in deterioration in stability or reliability of the transistor. Moreover, if the crystallinity of the oxide provided in contact with the channel formation region is low, an interface state may be formed and the stability or reliability of the transistor may deteriorate.

Therefore, the reduction in concentration of impurities in and around the channel formation region of the oxide semiconductor is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1 \times 10^{18}$ atoms/cm$^3$, preferably lower than or equal to $2 \times 10^{16}$ atoms/cm$^3$ in and around the channel formation region of the oxide semiconductor. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the impurities to the element M is lower than 0.10, preferably lower than 0.05 in and around the channel formation region of the oxide semiconductor. Here, the concentration of the element M used in the calculation of the concentration ratio may be a concentration in a region whose concertation of the impurities is calculated or may be a concentration in the oxide semiconductor.

A metal oxide with a low impurity concentration has a low density of defect states and thus has a low density of trap states in some cases.

In the case where hydrogen enters an oxygen vacancy in the metal oxide, the oxygen vacancy and the hydrogen are bonded to each other to form VoH in some cases. The VoH serves as a donor and an electron serving as a carrier is generated in some cases. In other cases, bonding of part of hydrogen to oxygen bonded to a metal atom generates electrons serving as carriers.

Thus, a transistor including an oxide semiconductor which contains a large amount of hydrogen is likely to be normally on. Moreover, hydrogen in an oxide semiconductor is easily transferred by a stress such as heat or an electric field; thus, a large amount of hydrogen in an oxide semiconductor might reduce the reliability of a transistor.

Accordingly, the amount of VoH in the metal oxide is preferably reduced as much as possible so that the metal oxide becomes a highly purified intrinsic or substantially highly purified intrinsic metal oxide. In order to obtain such an oxide semiconductor with sufficiently reduced VoH, it is important to remove impurities such as moisture and hydrogen in the oxide semiconductor (this treatment is sometimes referred to as dehydration treatment or dehydrogenation treatment) and supply oxygen to the oxide semiconductor to fill oxygen vacancies (this treatment is sometimes referred to as oxygen adding treatment). When an oxide semiconductor with sufficiently reduced impurities such as VoH is used for a channel formation region of a transistor, stable electrical characteristics can be given.

An oxide semiconductor with a low carrier concentration is preferably used for a transistor. In the case where the carrier concentration of the oxide semiconductor is lowered, the impurity concentration in the oxide semiconductor is lowered to decrease the density of defect states. In this specification and the like, a state with a low impurity concentration and a low density of defect states is referred to as a highly purified intrinsic or substantially highly purified intrinsic state. Examples of the impurities in the oxide semiconductor include hydrogen, nitrogen, alkali metal, alkaline earth metal, iron, nickel, and silicon.

In particular, hydrogen contained in an oxide semiconductor reacts with oxygen bonded to a metal atom to be water, and thus sometimes forms an oxygen vacancy in the oxide semiconductor. If the channel formation region in the oxide semiconductor includes an oxygen vacancy, the transistor sometimes has normally-on characteristics. In some cases, a defect where hydrogen enters an oxygen vacancy functions as a donor and generates an electron serving as a carrier. In other cases, bonding of part of hydrogen to oxygen bonded to a metal atom generates electrons serving as carriers. Thus, a transistor including an oxide semiconductor which contains a large amount of hydrogen is likely to be normally on.

A defect where hydrogen enters an oxygen vacancy (VoH) can serve as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When an oxide semiconductor with sufficiently reduced impurities such as hydrogen is used for a channel formation region of a transistor, stable electrical characteristics can be given.

The carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet still further preferably lower than $1\times10^{13}$ cm$^{-3}$, yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

One embodiment of the present invention can provide a memory device or a semiconductor device with high reliability. One embodiment of the present invention can provide a memory device or a semiconductor device with favorable electrical characteristics. One embodiment of the present invention can provide a memory device or a semiconductor device that can be miniaturized or highly integrated. One embodiment of the present invention can provide a memory device or a semiconductor device with low power consumption.

«Other Semiconductor Materials»

Note that a semiconductor material that can be used for the oxide 630 is not limited to the above metal oxides. A semiconductor material which has a band gap (a semiconductor material that is not a zero-gap semiconductor) may be used for the oxide 630. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 630, a transition metal chalcogenide functioning as a semiconductor is preferably used, for example. Specific examples of the transition metal chalcogenide which can be used for the oxide 630 include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), zirconium selenide (typically ZrSe$_2$).

<Structure Example of Memory Cell Arrangement>

Next, an arrangement example of the memory cells 860 will be described with reference to FIG. 10 and FIG. 11.

Figure 10:
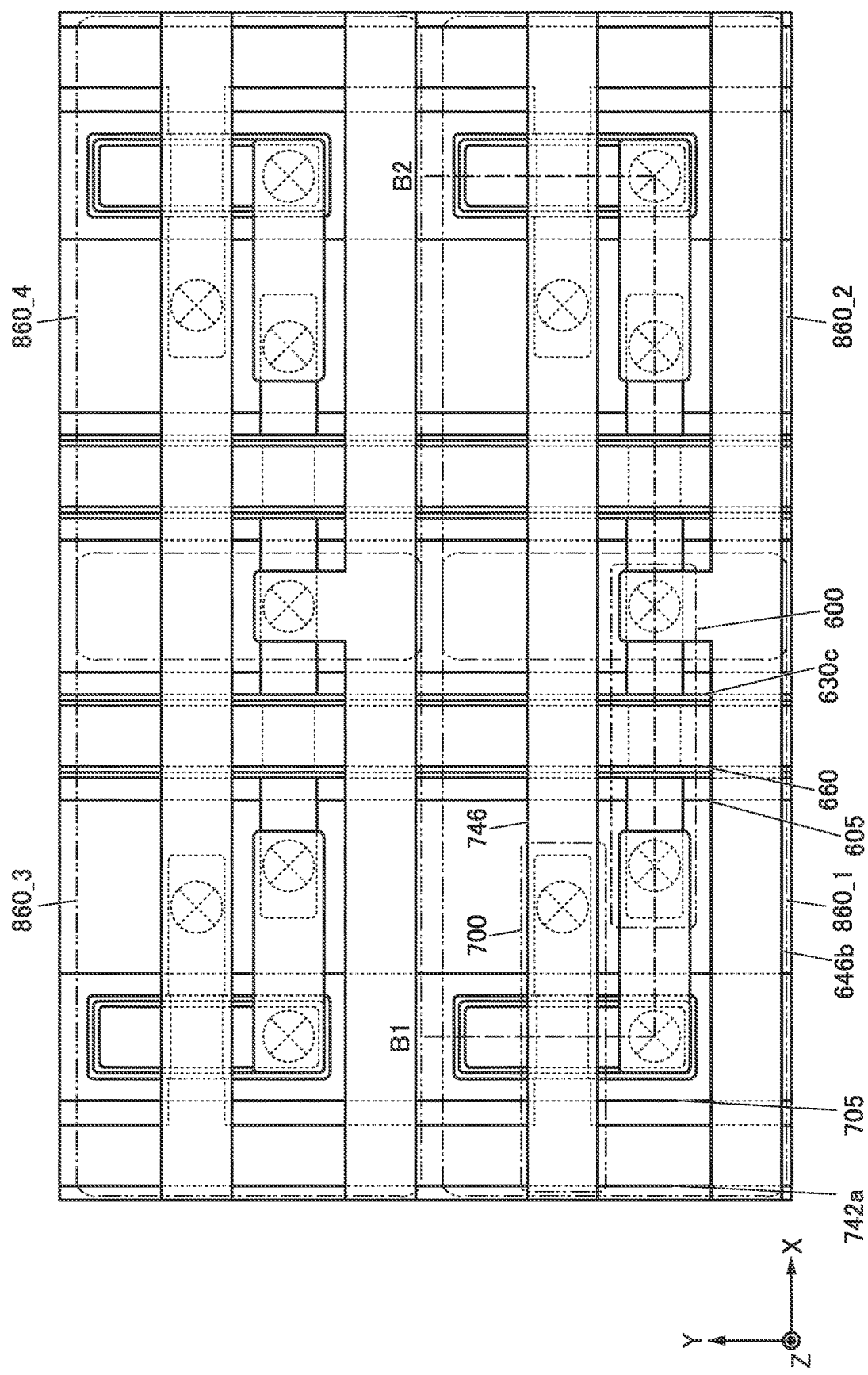
FIG. 10 is a top view of a memory device according to one embodiment of the present invention.
Figure 11:
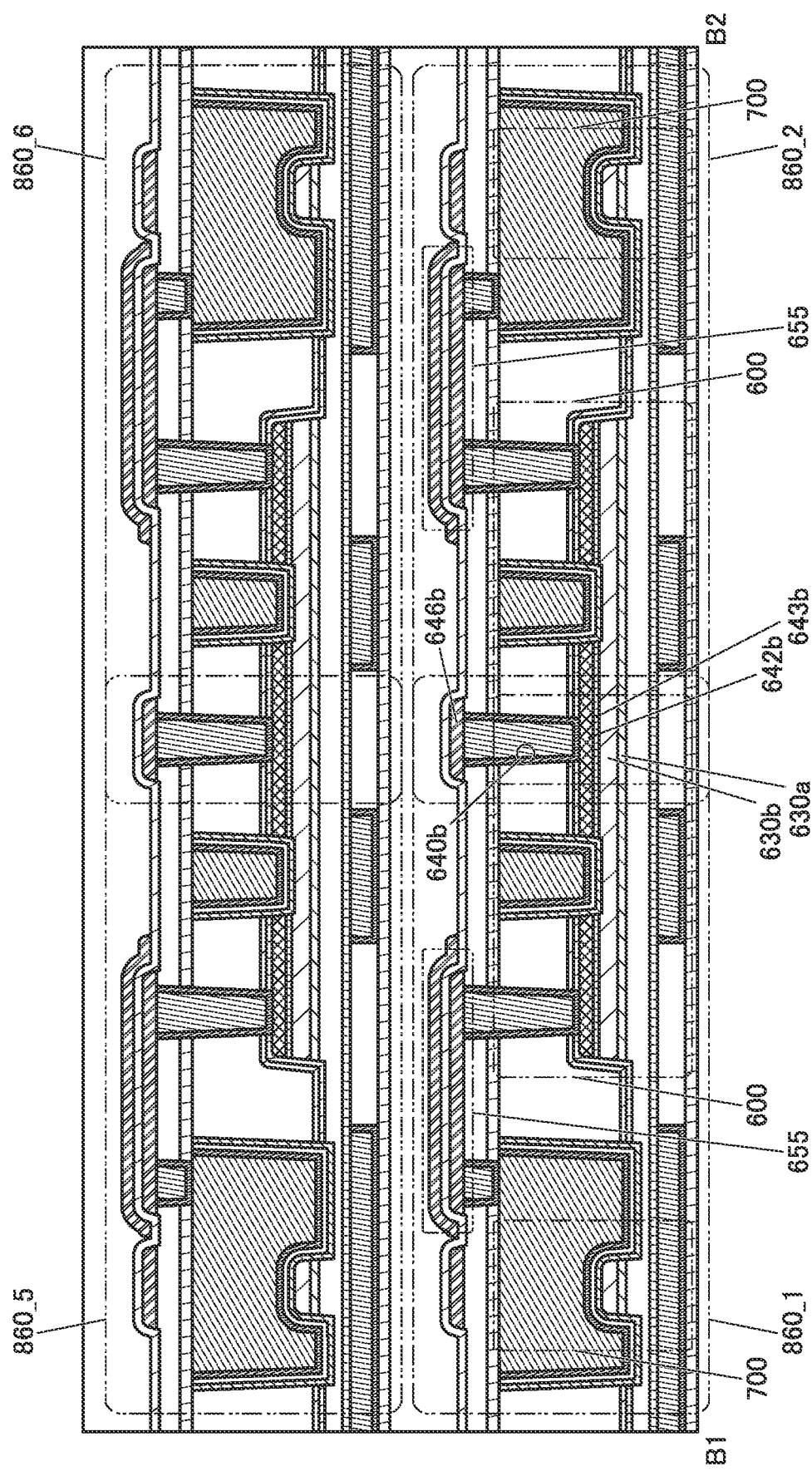
FIG. 11 is a cross-sectional view of a memory device according to one embodiment of the present invention.

FIG. 10 and FIG. 11 illustrate a memory cell block in which 2×2×2 memory cells 860 described above are arranged. FIG. 10 is a top view of the memory cell block. FIG. 11 is a cross-sectional view of the memory cell block, and FIG. 11 corresponds to a portion indicated by a dashed-dotted line B1-B2 in FIG. 10. FIG. 11 illustrates a cross section of a transistor 600 in the channel length direction and a cross section of a transistor 700 in the channel width direction. Note that for clarity of the drawing, some components are omitted in the top view in FIG. 10. Note that the X direction, the Y direction, and the Z direction illustrated in FIG. 10 are directions orthogonal to or intersecting with each other. Here, it is preferable that the X direction and the Y direction be parallel or substantially parallel to a substrate surface and the Z direction be perpendicular or substantially perpendicular to the substrate surface.

In the memory cell block illustrated in FIG. 10 and FIG. 11, a memory cell 860_2 is placed adjacent to a memory cell 860_1 in the X direction. A memory cell 860_3 and a memory cell 860_4 are placed adjacent to the memory cell 860_1 and the memory cell 860_2, respectively, in the Y direction. A memory cell 860_5 and a memory cell 860_6 are placed adjacent to the memory cell 860_1 and the memory cell 860_2, respectively, in the Z direction.

As illustrated in FIG. 10 and FIG. 11, the components of the memory cell 860_1 and the components of the memory cell 860_2 can be placed axisymmetrically. In this case, the transistor 600 of the memory cell 860_1 and the transistor 600 of the memory cell 860_2 may be formed using the same oxide 630a and the same oxide 630b. As illustrated in FIG. 10 and FIG. 11, the oxide 643b, the conductor 642b, the conductor 640b, and the conductor 646b can also be shared by the transistor 600 of the memory cell 860_1 and the transistor 600 of the memory cell 860_2. When the oxide 643b, the conductor 642b, the conductor 640b, and the conductor 646b which function as the wirings and the like connected to the memory cell 860_1 and the memory cell 860_2 are shared in such a manner, the area occupied by the memory cell can be further reduced.

As illustrated in FIG. 10, the conductor 646b which is shared by the memory cell 860_1 and the memory cell 860_2 extends in the X direction. In this manner, the write bit line WBL can extend in the X direction. As illustrated in FIG. 10, the conductor 746 of the memory cell 860_1 is provided to extend to the memory cell 860_2. In this manner, the read bit line RBL can extend in the X direction.

As illustrated in FIG. 10, the conductor 660 of the memory cell 860_1 is provided to extend to the memory cell 860_3. In this manner, the write word line WWL can extend in the Y direction. As illustrated in FIG. 10, the conductor 742a of the memory cell 860_1 is provided to extend to the memory cell 860_3. In this manner, the read word line RWL can extend in the Y direction. As illustrated in FIG. 10, the conductor 605 of the memory cell 8601 is provided to extend to the memory cell 860_3. In this manner, the wiring BGT can extend in the Y direction. As illustrated in FIG. 10, the conductor 705 of the memory cell 8601 is provided to extend to the memory cell 860_3. In this manner, the wiring BG2 can extend in the Y direction.

Note that as illustrated in FIG. 11, the memory cell 860_5 and the memory cell 860_6, which have structures similar to those of the memory cell 860_1 and the memory cell 8602, can be provided as the upper layers of the memory cell 860_1 and the memory cell 860_2.

Although FIG. 10 illustrates the structure in which the oxide 630c extends overlapping with the conductor 660, the memory device described in this embodiment is not limited thereto. For example, a structure may be employed in which the oxide 630c is patterned for each memory cell 860 and the oxide 630c is separately provided for each transistor 600. In the case where the oxide 630c has a stacked-layer structure of two layers, for example, a structure may be employed in which one of the upper layer and the lower layer of the oxide 630c may be separately provided for each transistor 600.

<Structure Example of Memory Device>

Figure 12:
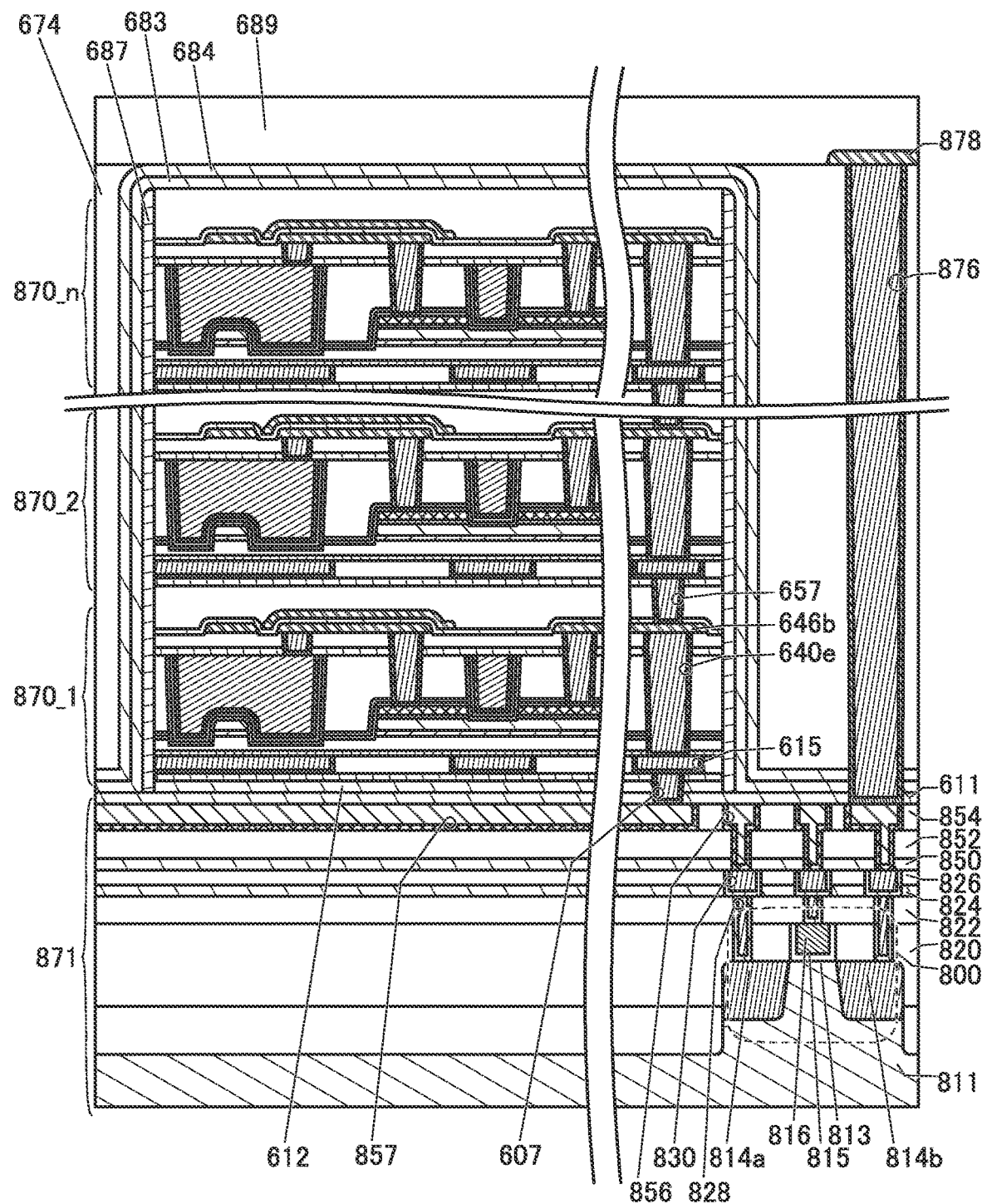
FIG. 12 is a cross-sectional view of a memory device according to one embodiment of the present invention.

Next, an example of a memory device in which the above-described memory cells 860 are stacked is described with reference to FIG. 12. FIG. 12 is a cross-sectional view of a memory device in which a plurality of memory cell layers 870 including the memory cells 860 are stacked over a silicon layer 871. The memory device illustrated in FIG. 12 corresponds to the memory device 10 illustrated in FIG. 1 and the like, the silicon layer 871 corresponds to the layer 100, and the memory cell layer 870 corresponds to the layer 200.

First, the silicon layer 871 is described. A plurality of transistors 800 are provided in the silicon layer 871, and form the peripheral circuit 101 (e.g., the bit line driver circuit 132 and the like) illustrated in FIG. 2.

The transistor 800 is provided over a substrate 811 and includes a conductor 816 functioning as a gate, an insulator 815 functioning as a gate insulator, a semiconductor region 813 formed of part of the substrate 811, and a low-resistance region 814a and a low-resistance region 814b functioning as a source region and a drain region. The transistor 800 may be a p-channel transistor or an n-channel transistor.

Here, in the transistor 800 illustrated in FIG. 12, the semiconductor region 813 (part of the substrate 811) where a channel is formed has a convex shape. Furthermore, the conductor 816 is provided to cover a side surface and a top surface of the semiconductor region 813 with the insulator 815 therebetween. Note that a material adjusting the work function may be used for the conductor 816. Such a transistor 800 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 800 illustrated in FIG. 12 is an example and the structure is not limited thereto; an appropriate transistor is used in accordance with a circuit structure or a driving method.

Wiring layers provided with an interlayer film, a wiring, a plug, and the like may be provided between the structure bodies. A plurality of wiring layers can be provided in accordance with the design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 820, an insulator 822, an insulator 824, and the insulator 826 are stacked over the transistor 800 in this order as interlayer films. A conductor 828, a conductor 830, and the like, which function as a plug or a wiring, are embedded in the insulator 820, the insulator 822, the insulator 824, and the insulator 826.

The insulator functioning as an interlayer film may function as a planarization film that covers an uneven shape thereunder. For example, a top surface of the insulator 822 may be planarized by planarization treatment using a chemical mechanical polishing (CMP) method or the like to improve planarity.

A wiring layer may be provided over the insulator 826 and the conductor 830. For example, in FIG. 12, an insulator 850, an insulator 852, and an insulator 854 are stacked in this order. Furthermore, a conductor 856 is formed in the insulator 850, the insulator 852, and the insulator 854. The conductor 856 functions as a plug or a wiring.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance generated between wirings can be reduced. Accordingly, a material is preferably selected depending on the function of an insulator.

For example, for the insulator 820, the insulator 822, the insulator 826, the insulator 852, the insulator 854, and the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by insulators having a function of inhibiting passage of oxygen and impurities such as hydrogen, the electrical characteristics of the transistor can be stable. Thus, an insulator having a function of inhibiting passage of oxygen and impurities such as hydrogen is used for the insulator 824, the insulator 850, or the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

As the conductors that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor with high electrical conductivity, typified by polycrystalline silicon containing an impurity element such as phosphorus, or silicide such as nickel silicide may be used.

For example, for the conductor 828, the conductor 830, the conductor 856, and the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

An insulator 611 and an insulator 612 are placed over the silicon layer 871, and a memory cell layer 870_1 to a memory cell layer 870_n (n is a natural number greater than or equal to 1) are stacked over the insulator 611 and the insulator 612. Although not particularly limited, n described above is greater than or equal to 1 and less than or equal to 200, preferably greater than or equal to 1 and less than or equal to 100, further preferably greater than or equal to 1 and less than or equal to 10.

In each of the memory cell layers 870, the memory cells 860 and a variety of wirings are arranged in a matrix as in FIG. 10.

As illustrated in FIG. 12, the conductor 646b extending in each memory cell layer 870 is connected to the conductors 646b in the upper and lower adjacent layers at end portions of the memory cell layers 870 through the conductor 615, the conductor 640e, and the conductor 657. Here, the conductor 615 and the conductor 605 are formed in the same layer and have similar structures. The conductor 640e is placed to fill an opening formed in the insulator 622, the insulator 624, the insulator 672, the insulator 673, the insulator 680, the insulator 682, and the insulator 685 (see FIG. 8B), and has a structure similar to that of the conductor 640b or the like. The conductor 657 is placed to fill an opening formed in the insulator 686, the insulator 688, and the insulator 614, and has a structure similar to that of the conductor 640b or the like. The conductor 640e is provided in contact with a bottom surface of the conductor 646b, the conductor 615 is provided in contact with a bottom surface of the conductor 640e, the conductor 657 is provided in contact with a bottom surface of the conductor 615, and a bottom surface of the conductor 657 is in contact with a top surface of the conductor 646b in one lower below. In such a manner, the conductor 646b is connected to the conductor 646b in the upper and lower adjacent layers at the end portions of the memory cell layers 870.

As illustrated in FIG. 12, the conductor 607 is placed to be embedded in the insulator 611 and the insulator 612 under the conductor 615 in the undermost memory cell layer 8701. The conductor 607 is in contact with a conductor 857 provided in the same layer as the conductor 856. In this manner, the write bit line WBL connected to the memory cell 860 is connected to the bit line driver circuit 132 through the conductor 857. The read bit lines RBL connected to the memory cells 860 by a method similar to that described above can be connected to the bit line driver circuit 132 through the conductor 857, which is not illustrated. In this manner, as illustrated in FIG. 2 of the above embodiment, the wirings BL can be connected to the bit line driver circuit 132 by being joined together at the end portions of the memory cell arrays.

A structure is preferable in which the memory cell layer 8701 to the memory cell layer 870_n are sealed with the insulator 611, the insulator 612, an insulator 687, the insulator 683, and an insulator 684. Here, the insulator 611 is placed over the silicon layer 871, and the insulator 612 is placed over the insulator 611. The memory cell layer 870_1 to the memory cell layer 870_n are placed over the insulator 612, and the insulator 612 is formed in the same pattern as those of the memory cell layer 870_1 to the memory cell layer 870_n in a top view. The insulator 687 is placed in contact with a top surface of the insulator 611, a side surface of the insulator 612, and side surfaces of the memory cell layer 8701 to the memory cell layer 870_n. That is, the insulator 687 is formed in a sidewall shape along the memory cell layer 870_1 to the memory cell layer 870_n. The insulator 683 is placed to cover the insulator 611, the insulator 687, and the memory cell layer 870_1 to the memory cell layer 870_n. In addition, the insulator 684 is placed to cover the insulator 683.

For the insulator 611, the insulator 612, the insulator 687, the insulator 683, and the insulator 684, a barrier material is preferably used in a similar manner to that of the insulator 682 and the like.

Here, each of the memory cell layers 870 is sealed with the insulator 614, the insulator 687, and the insulator 682. The same material is preferably used for the insulator 614, the insulator 687, and the insulator 682. The insulator 614, the insulator 687, and the insulator 682 are preferably deposited by a deposition method using the same conditions. When the insulator 614, the insulator 687, and the insulator 682 having the same film property are in contact with each other, a sealing structure with high hermeticity can be formed.

In addition, a material having a function of trapping and fixing hydrogen is preferably used for the insulator 614, the insulator 687, and the insulator 682. Specifically, it is possible to use a metal oxide such as aluminum oxide, hafnium oxide, gallium oxide, or indium gallium zinc oxide.

The insulator 614, the insulator 687, and the insulator 682 that form the sealing structure are provided in contact with the insulator 680. Thus, the hydrogen concentration in the oxide semiconductor included in the memory cell 860 can be lowered by trapping and fixing hydrogen entering the insulator 680.

The insulator 614, the insulator 687, and the insulator 682 that form the structure in which the memory cell layer 870 is sealed are further covered with the insulator 611, the insulator 612, and the insulator 683. For example, as illustrated in FIG. 12, the insulator 611 and the insulator 683 are in contact with each other outside the memory cell layer 870_1 to the memory cell layer 870_n, whereby the second sealing structure is formed.

Here, a material having a function of inhibiting diffusion of hydrogen and oxygen is preferably used for the insulator 611, the insulator 612, and the insulator 683. It is particularly preferable to use silicon nitride or silicon nitride oxide as a sealing material because of their high barrier properties against hydrogen.

It is preferable that the insulator 684 with high coverage be provided above the insulator 683 that covers the transistor 600. Note that for the insulator 684, the same material as those for the insulator 612 and the insulator 683 is preferably used.

When the insulator 612 and the insulator 683 are deposited by a sputtering method, for example, the sealing structure can be formed of the films having relatively low hydrogen concentrations.

On the other hand, films that are deposited by a sputtering method have relatively low coverage. In view of this, the insulator 611 and the insulator 684 are deposited by a CVD method or the like which enables high coverage, whereby higher hermeticity can be achieved.

Accordingly, the insulator 612 and the insulator 683 preferably have lower hydrogen concentration than the insulator 611 and the insulator 684.

When the memory cell layer 870_1 to the memory cell layer 870_n are sealed with the barrier insulating film in the above-described manner, diffusion of hydrogen into the oxide semiconductor included in each memory cell 860 can be reduced, so that a memory device with high reliability can be provided.

Note that a material with a barrier property against oxygen may be used for the insulator 611, the insulator 612, the insulator 614, the insulator 682, the insulator 687, the insulator 683, and the insulator 684. When the above sealing structure has a barrier property against oxygen, excess oxygen contained in the insulator 680 can be inhibited from diffusing outward and can be efficiently supplied to the transistor 600.

An insulator 674 is preferably provided so that the memory cell layer 870_1 to the memory cell layer 870_n, the insulator 684, and the like are embedded therein. An insulator that can be used as the insulator 680 is used as the insulator 674. As illustrated in FIG. 12, top surfaces of the insulator 674 and the insulator 684 are preferably substantially level with each other.

As illustrated in FIG. 12, an opening may be provided in the insulator 674, the insulator 684, the insulator 683, and the insulator 611 and a conductor 876 may be placed in the opening. A bottom surface of the conductor 876 is in contact with the conductor 856. A conductor 878 functioning as a wiring may be provided in contact with a top surface of the conductor 876. Furthermore, an insulator 689 functioning as an interlayer film is preferably provided to cover the memory cell layer 870_n, the insulator 674, and the conductor 878. With such a structure, the wiring (the conductor 878) in the upper layer and the circuit of the silicon layer 871 can be electrically connected to each other without the memory cell layer 870 therebetween.

Figure 13:
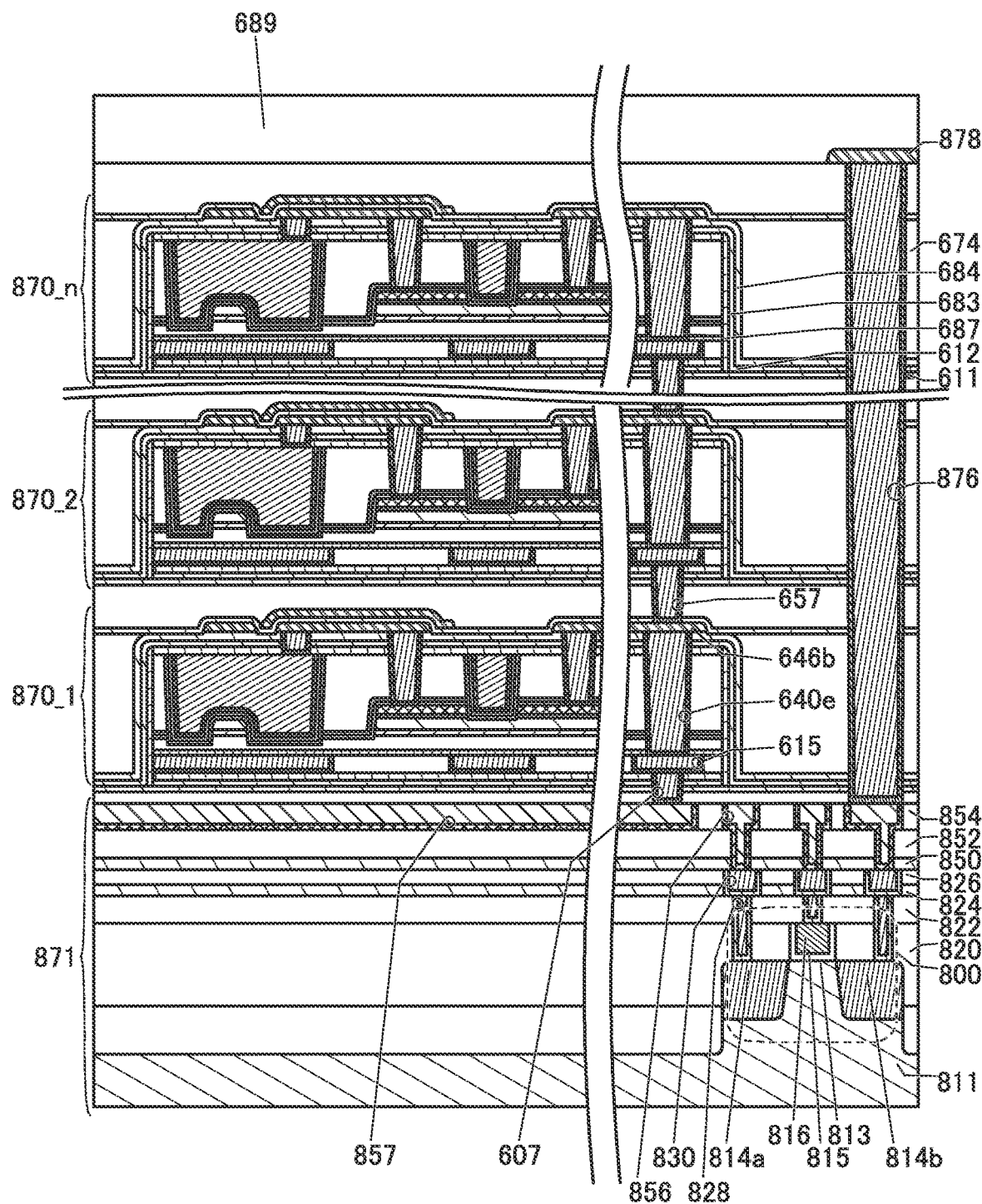
FIG. 13 is a cross-sectional view of a memory device according to one embodiment of the present invention.

Although FIG. 12 illustrates the structure in which the memory cell layer 870_1 to the memory cell layer 870_n are collectively sealed with the insulator 611, the insulator 612, the insulator 687, the insulator 683, and the insulator 684, the memory device of this embodiment is not limited thereto. For example, as illustrated in FIG. 13, each of the memory cell layers 870 may be sealed with the insulator 611, the insulator 612, the insulator 687, the insulator 683, and the insulator 684. Here, the insulator 612 and the insulator 611 are placed under the insulator 614.

The insulator 687 is placed in contact with side surfaces of the insulator 680, the insulator 673, the insulator 672, the insulator 624, the insulator 622, the insulator 616, and the insulator 614. The insulator 683 is provided to cover the insulator 680 and the insulator 687, and the insulator 684 is placed over the insulator 683. In this case, the capacitor 655 and the insulator 688 provided above the insulator 682 are placed over the insulator 684.

Note that at least part of this embodiment can be implemented in combination with the other embodiments and example described in this specification as appropriate.

Embodiment 3

In this embodiment, the compositions of a CAC-OS (Cloud-Aligned Composite Oxide Semiconductor) and a CAAC-OS (c-axis Aligned Crystal Oxide Semiconductor) which are metal oxides that can be used in the OS transistor described in the above embodiment is described.

<Composition of Metal Oxide>

The CAC-OS or the CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

<Structure of Metal Oxide>

Oxide semiconductors can be classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. Here, the classification of the crystal structures of an oxide semiconductor will be explained with FIG. 14A. FIG. 14A is a diagram showing the classification of the crystal structures of an oxide semiconductor, typically IGZO (a metal oxide containing In, Ga, and Zn).

As shown in FIG. 14A, IGZO is roughly classified into Amorphous, Crystalline, and Crystal. Amorphous includes completely amorphous structure. In addition, Crystalline includes CAAC (c-axis-aligned crystalline), nc (nanocrystalline), and CAC (Cloud-Aligned Composite). Crystal includes single crystal and poly crystal.

Note that the structure shown in the thick frame in FIG. 14A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as crystalline IGZO), are shown in FIG. 14B and FIG. 14C. FIG. 14B shows an XRD spectrum of quartz glass and FIG. 14C shows an XRD spectrum of crystalline IGZO. Note that the crystalline IGZO shown in FIG. 14C has a composition of In:Ga:Zn=4: 2:3 [atomic ratio]. Furthermore, the crystalline IGZO shown in FIG. 14C has a thickness of 500 nm.

As indicated by arrows in FIG. 14B, the XRD spectrum of the quartz glass shows a substantially symmetrical peak. By contrast, as indicated by arrows in FIG. 14C, the XRD spectrum of the crystalline IGZO shows an asymmetrical peak. The asymmetrical peak of the XRD spectrum clearly shows the existence of a crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is found to be inhibited by the distortion of a lattice arrangement. This is probably because the CAAC-OS can tolerate distortion owing to a low density of arrangement of oxygen atoms in the a-b plane direction, an interatomic bond length changed by substitution of a metal element, and the like. Note that a crystal structure in which a clear crystal grain boundary (grain boundary) is observed is what is called a polycrystal. It is highly probable that the crystal grain boundary becomes a recombination center and traps carriers and thus decreases the on-state current or field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Entry of impurities, formation of defects, or the like might decrease the crystallinity of an oxide semiconductor, which means that the CAAC-OS is an oxide semiconductor having small amounts of impurities and defects (e.g., oxygen vacancies). Thus, an oxide semiconductor including a CAAC-OS is physically stable. Therefore, the oxide semiconductor including a CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is an oxide semiconductor having a structure between those of the nc-OS and an amorphous oxide semiconductor. The a-like OS contains a void or a low-density region. That is, the a-like OS has low crystallinity compared with the nc-OS and the CAAC-OS.

An oxide semiconductor has various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, the transistor having high field-effect mobility can be achieved. In addition, the transistor having high reliability can be achieved.

An oxide semiconductor with a low carrier concentration is preferably used for the transistor. In the case where the carrier concentration of an oxide semiconductor film is reduced, the impurity concentration in the oxide semiconductor film is reduced to reduce the density of defect states. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states.

Charge trapped by the trap states in the oxide semiconductor take a long time to be released and may behave like fixed charge. Thus, a transistor whose channel formation region is formed in an oxide semiconductor having a high density of trap states has unstable electrical characteristics in some cases.

Accordingly, in order to obtain stable electrical characteristics of the transistor, it is effective to reduce the concentration of impurities in the oxide semiconductor. In addition, in order to reduce the concentration of impurities in the oxide semiconductor, the impurity concentration in an adjacent film is also preferably reduced. Examples of impurities include hydrogen, nitrogen, an alkali metal, an alkaline earth metal, iron, nickel, and silicon.

<Impurities>

Here, the influence of each impurity in the oxide semiconductor will be described.

When silicon or carbon that is a Group 14 element is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are set to lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated, in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is set to lower than or equal to $1\times10^{18}$ atoms/cm$^3$, preferably lower than or equal to $2\times10^{16}$ atoms/cm$^3$.

Furthermore, when containing nitrogen, the oxide semiconductor easily becomes n-type by generation of electrons serving as carriers and an increase in carrier concentration. As a result, a transistor using an oxide semiconductor containing nitrogen for its channel formation region is likely to have normally-on characteristics. Thus, nitrogen in the oxide semiconductor is preferably reduced as much as possible; for example, the nitrogen concentration in the oxide semiconductor is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for a channel formation region of a transistor, stable electrical characteristics can be given.

Note that this embodiment can be implemented in combination with the other embodiments described in this specification as appropriate.

Embodiment 4

In this embodiment, examples of electronic components and electronic devices in which the memory device or the like described in the above embodiment is incorporated will be described.

<Electronic Components>

First, examples of electronic components in which the memory device 10 is incorporated will be described with reference to FIG. 15A and FIG. 15B.

Figure 15A:
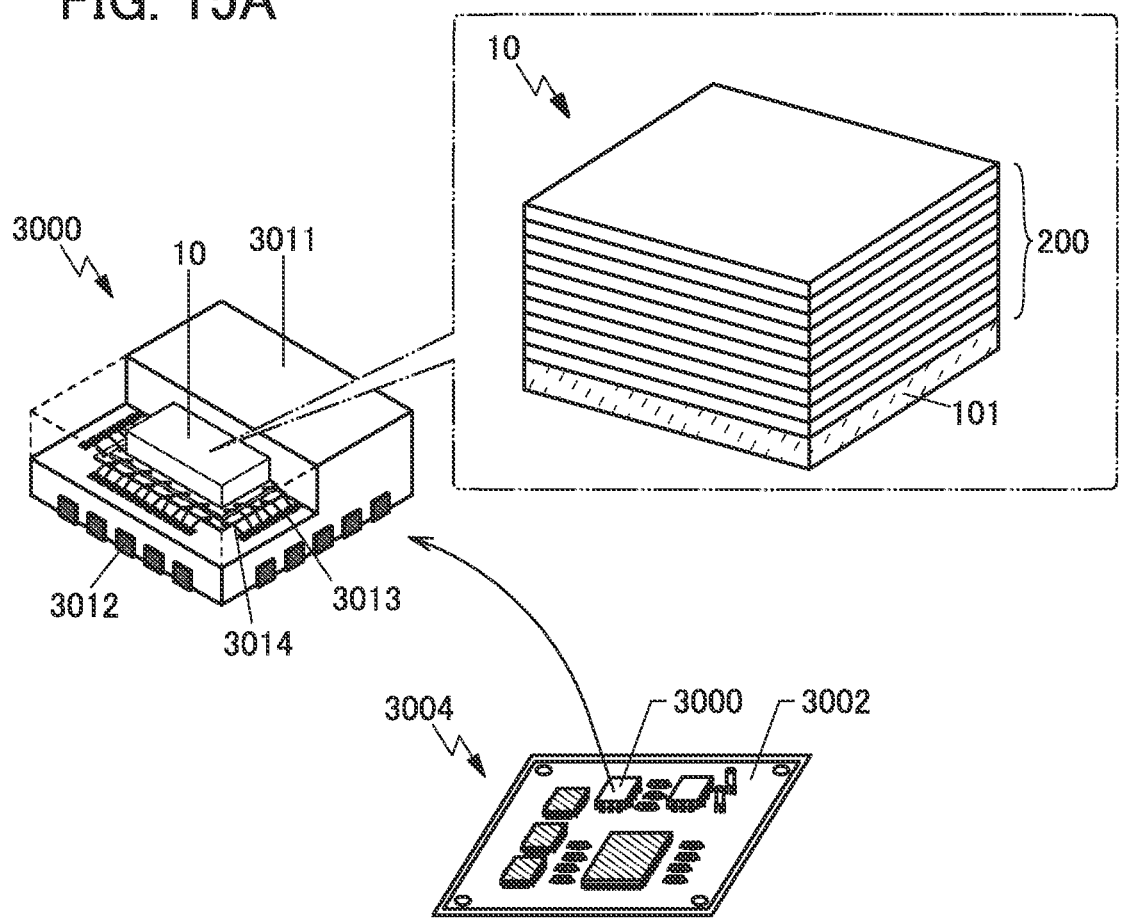
FIG. 15A and FIG. 15B are diagrams illustrating examples of electronic components.

FIG. 15A shows a perspective view of an electronic component 3000 and a substrate on which the electronic component 3000 is mounted (a mounting board 3004). The electronic component 3000 illustrated in FIG. 15A includes the memory device 10 in a mold 3011. FIG. 15A omits part of the electronic component 3000 to show the inside thereof. The electronic component 3000 includes a land 3012 outside the mold 3011. The land 3012 is electrically connected to an electrode pad 3013, and the electrode pad 3013 is electrically connected to the memory device 10 via a wire 3014. The electronic component 3000 is mounted on a printed circuit board 3002, for example. A plurality of such electronic components are combined and electrically connected to each other on the printed circuit board 3002, whereby the mounting board 3004 is completed.

Figure 15B:
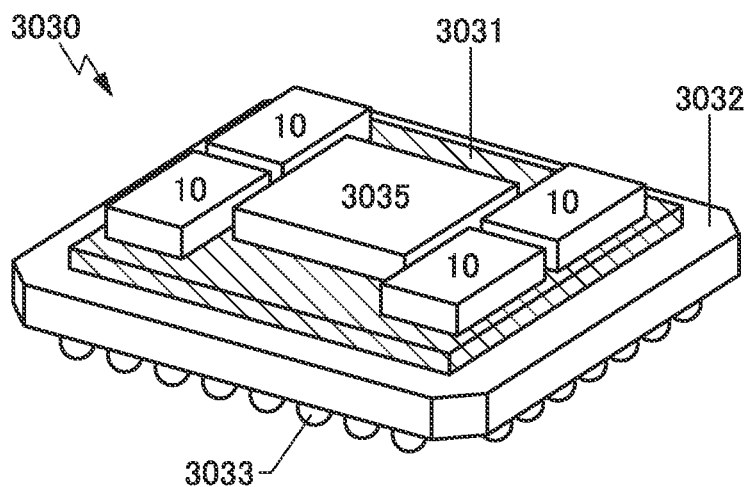

FIG. 15B shows a perspective view of an electronic component 3030. The electronic component 3030 is an example of a SiP (System in package) or an MCM (Multi Chip Module). In the electronic component 3030, an interposer 3031 is provided on a package substrate 3032 (a printed circuit board), and a semiconductor device 3035 and a plurality of memory devices 10 are provided on the interposer 3031.

The electronic component 3030 using the memory devices 10 as high bandwidth memory (HBM) is shown as an example. An integrated circuit (a semiconductor device) such as a CPU (Central Processing Unit), a GPU (Graphics Processing Unit), or an FPGA (Field Programmable Gate Array) can be used as the semiconductor device 3035.

As the package substrate 3032, a ceramic substrate, a plastic substrate, a glass epoxy substrate, or the like can be used. As the interposer 3031, a silicon interposer, a resin interposer, or the like can be used.

The interposer 3031 includes a plurality of wirings and has a function of electrically connecting a plurality of integrated circuits with different terminal pitches. The plurality of wirings are provided in a single layer or multiple layers. Moreover, the interposer 3031 has a function of electrically connecting an integrated circuit provided on the interposer 3031 to an electrode provided on the package substrate 3032. Accordingly, the interposer is referred to as a "redistribution substrate" or an "intermediate substrate" in some cases. A through electrode may be provided in the interposer 3031 and used for electrically connecting an integrated circuit and the package substrate 3032. For a silicon interposer, a TSV (Through Silicon Via) can also be used as the through electrode.

A silicon interposer is preferably used as the interposer 3031. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged side by side on an interposer.

A heat sink (a radiator plate) may be provided to overlap with the electronic component 3030. In the case of providing a heat sink, the heights of integrated circuits provided on the interposer 3031 are preferably equal to each other. For example, in the electronic component 3030 described in this embodiment, the heights of the memory devices 10 and the semiconductor device 3035 are preferably equal to each other.

To mount the electronic component 3030 on another substrate, an electrode 3033 may be provided on the bottom portion of the package substrate 3032. FIG. 15B shows an example in which the electrode 3033 is formed of a solder ball. Solder balls are provided in a matrix on the bottom portion of the package substrate 3032, whereby BGA (Ball Grid Array) mounting can be achieved. Alternatively, the electrode 3033 may be formed of a conductive pin. When conductive pins are provided in a matrix on the bottom portion of the package substrate 3032, PGA (Pin Grid Array) mounting can be achieved.

The electronic component 3030 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Next, examples of electronic devices each including the memory device 10 are described with reference to FIG. 16A to FIG. 16F, FIG. 17A, FIG. 17B, FIG. 18A to FIG. 18C, FIG. 20A, and FIG. 20B.

The memory device according to one embodiment of the present invention can be used in a variety of electronic devices. In particular, the memory device according to one embodiment of the present invention can be used as a memory incorporated in an electronic device. The description will be made below using an information terminal, a game machine, a household appliance, a moving vehicle, a parallel computer, a system including a server as examples of an electronic device in which the memory device according to one embodiment of the present invention can be used.

Figure 16A:
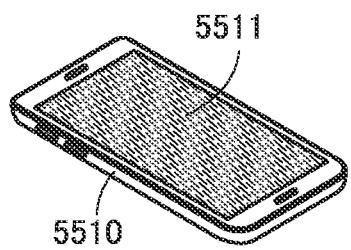
FIG. 16A, FIG. 16B, FIG. 16C, FIG. 16D, FIG. 16E, and FIG. 16F are drawings illustrating examples of electronic devices.

FIG. 16A illustrates an information terminal 5500 as an electronic device in which the memory device according to one embodiment of the present invention can be used, for example. The information terminal 5500 is a mobile phone (smartphone). The information terminal 5500 includes a housing 5510 and a display portion 5511, and a touch panel is provided in the display portion 5511 and a button is provided in the housing 5510 as input interfaces.

Figure 16B:
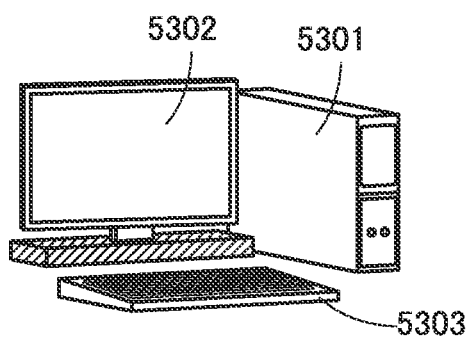

FIG. 16B illustrates a desktop information terminal 5300 as an electronic device in which the memory device according to one embodiment of the present invention can be used, for example. The desktop information terminal 5300 includes a main body 5301 of the information terminal, a display 5302, and a keyboard 5303.

Although FIG. 16A and FIG. 16B illustrate a smartphone and a desktop information terminal as examples, the memory device according to one embodiment of the present invention may be used in a different information terminal such as a PDA (Personal Digital Assistant), a notebook information terminal, or a workstation.

Figure 16C:
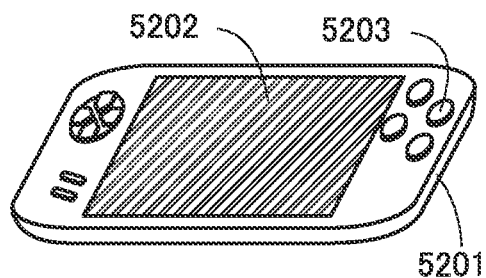

FIG. 16C illustrates a portable game machine 5200 as an electronic device in which the memory device according to one embodiment of the present invention can be used, for example. The portable game machine 5200 includes a housing 5201, a display portion 5202, a button 5203, and the like.

Although FIG. 16C illustrates a portable game machine as an example, the memory device according to one embodiment of the present invention may be used in a different game machine such as a home stationary game machine, an arcade game machine installed in an entertainment facility (e.g., a game center and an amusement park), or a throwing machine for batting practice installed in sports facilities.

Figure 16D:
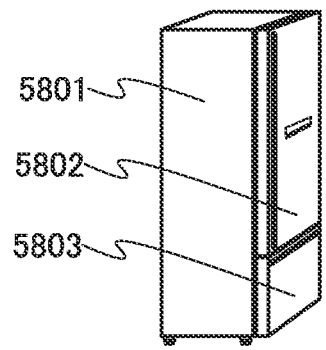

FIG. 16D illustrates an electric refrigerator-freezer 5800 as an electronic device in which the memory device according to one embodiment of the present invention can be used, for example. The electric refrigerator-freezer 5800 includes a housing 5801, a refrigerator door 5802, a freezer door 5803, and the like.

Although FIG. 16D illustrates an electric refrigerator-freezer as an example, the memory device according to one embodiment of the present invention may be used in a different household appliance such as a vacuum cleaner, a microwave oven, an electric oven, a rice cooker, a water heater, an IH cooker, a water server, a heating-cooling combination appliance such as an air conditioner, a washing machine, a drying machine, and an audio visual appliance, a digital camera, or a digital video camera.

Figure 16E:
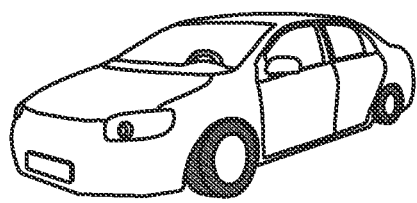
Figure 16F:
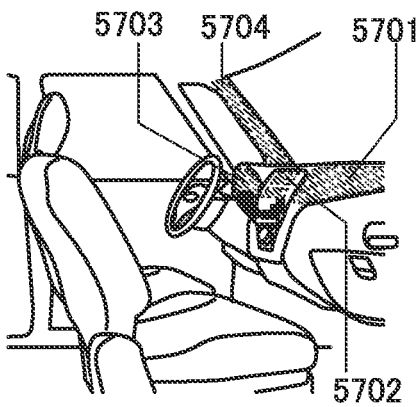

FIG. 16E illustrates an automobile 5700 as an electronic device in which the memory device according to one embodiment of the present invention can be used, for example. FIG. 16F illustrates the periphery of a windshield inside an automobile. FIG. 16F illustrates a display panel 5701, a display panel 5702, and a display panel 5703 that are attached to a dashboard and a display panel 5704 that is attached to a pillar.

The display panel 5701 to the display panel 5703 can provide various kinds of information by displaying a speedometer, a tachometer, a mileage, a fuel meter, a gearshift indicator, an air-conditioning setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided for the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Although FIG. 16E and FIG. 16F illustrate the automobile and the display panel attached to the periphery of the windshield of the automobile as examples, the memory device according to one embodiment of the present invention may be used in a different moving vehicle such as a train, a monorail train, a ship, or a flying object (a helicopter, an unmanned aircraft (a drone), an airplane, and a rocket).

Figure 17A:
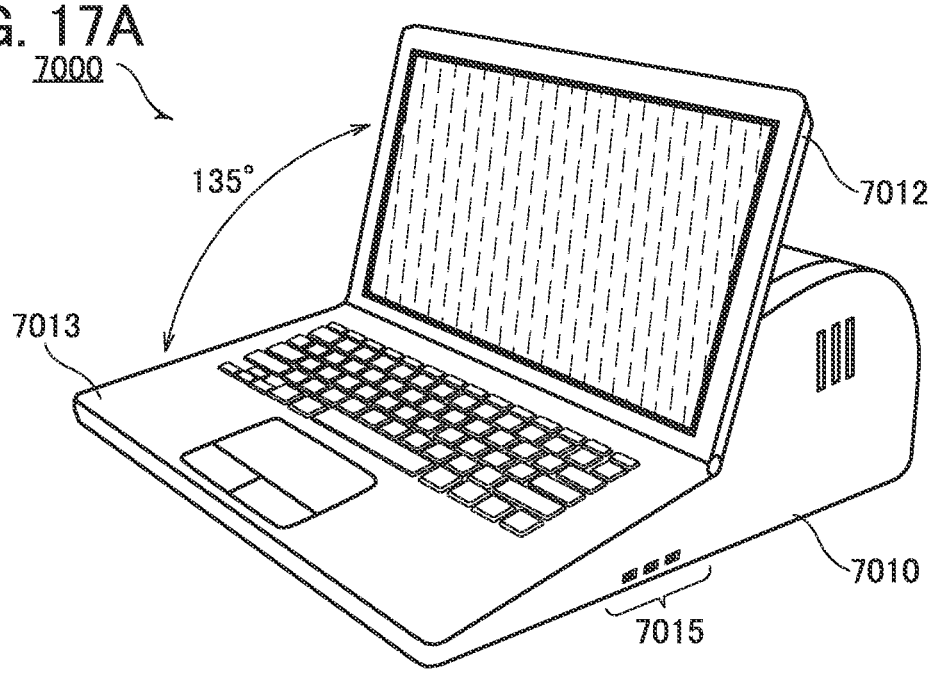
FIG. 17A and FIG. 17B are diagrams illustrating an electronic device.
Figure 17B:
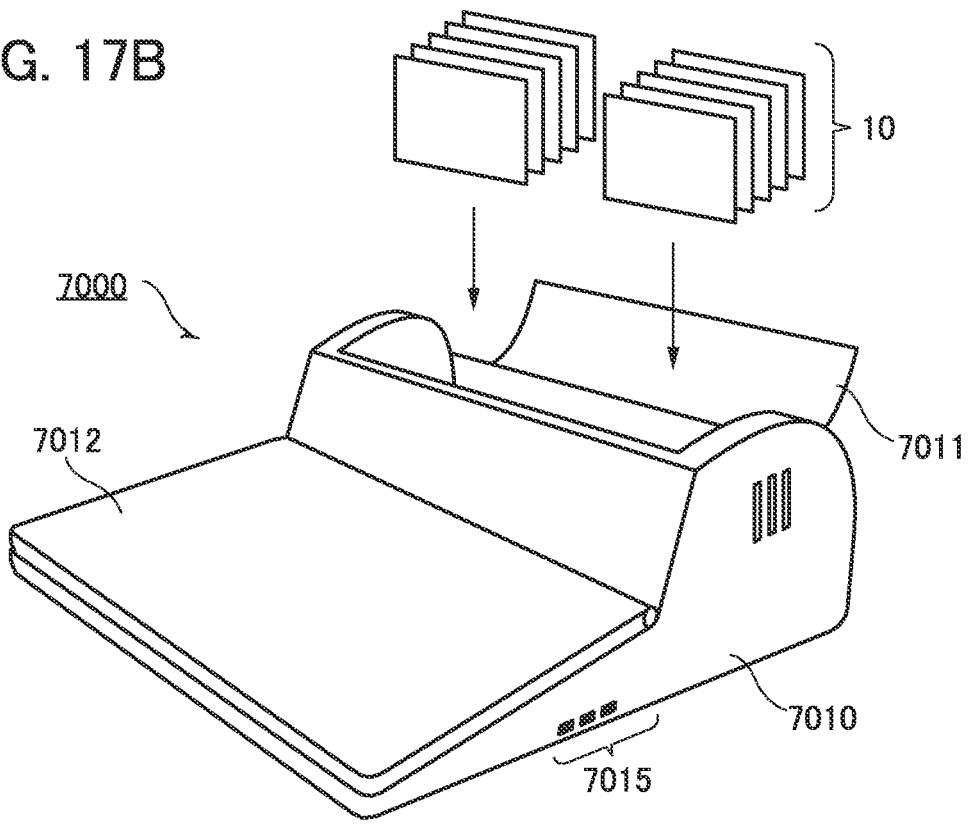

FIG. 17A and FIG. 17B illustrate an information terminal 7000 as an electronic device in which the memory device according to one embodiment of the present invention can be used. The information terminal 7000 includes a housing 7010, a monitor portion 7012, a keyboard 7013, a port 7015, and the like.

The keyboard 7013 and the port 7015 are provided on the housing 7010. Examples of the port 7015 include a USB port, a LAN port, an HDMI (High-Definition Multimedia Interface; HDMI is a registered trademark) port, and the like.

The monitor portion 7012 attached to the housing 7010 can be opened and closed. FIG. 17A illustrates a state in which the monitor portion 7012 is opened and FIG. 17B illustrates a state in which the monitor portion 7012 is closed. For example, the maximum angle of the monitor portion 7012 when opened is approximately 135° (see FIG. 17A).

The housing 7010 is provided with a cover 7011 that can be opened and closed (see FIG. 17B). The memory device 10 according to one embodiment of the present invention is incorporated in the housing 7010, and the memory device 10 can be attached or detached. A device for cooling the memory device 10 or a device for dissipating heat may be provided in the housing 7010. When the cover 7011 is opened, the memory device 10 can be attached or detached, and thus the information terminal 7000 has high extensibility. When a plurality of the memory devices 10 is incorporated into the information terminal 7000, advanced graphics processing, scientific computation, arithmetic operation of artificial intelligence, and the like can be performed.

Figure 18A:
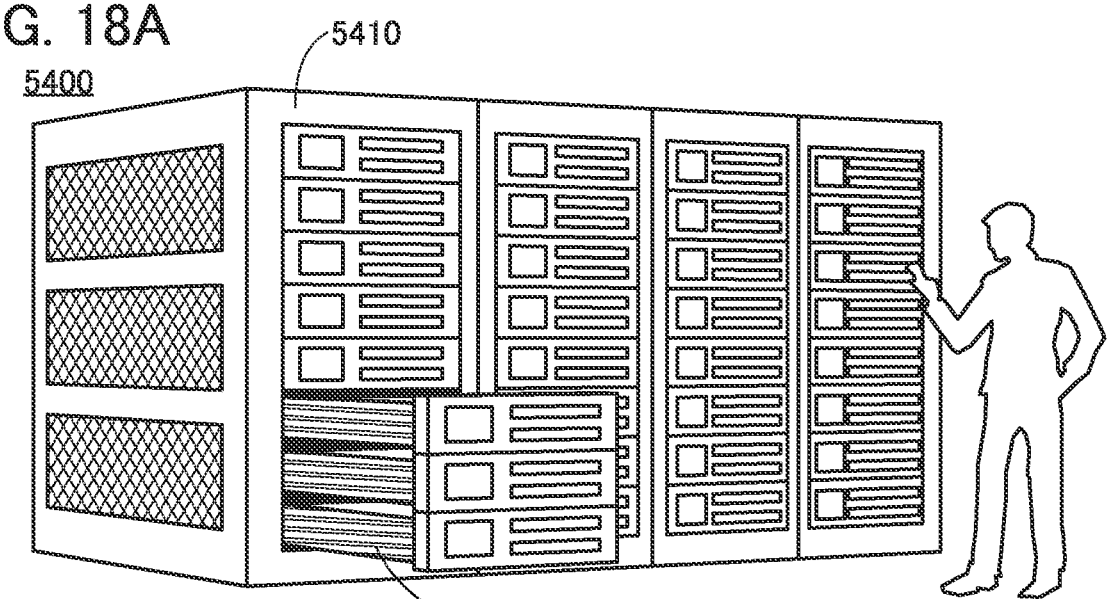
FIG. 18A, FIG. 18B, and FIG. 18C are diagrams illustrating examples of electronic devices.

FIG. 18A illustrates a large-sized parallel computer 5400 as an electronic device in which the memory device according to one embodiment of the present invention can be used, for example. In the parallel computer 5400, a plurality of rack mount computers 5420 are included in a rack 5410.

Figure 18B:
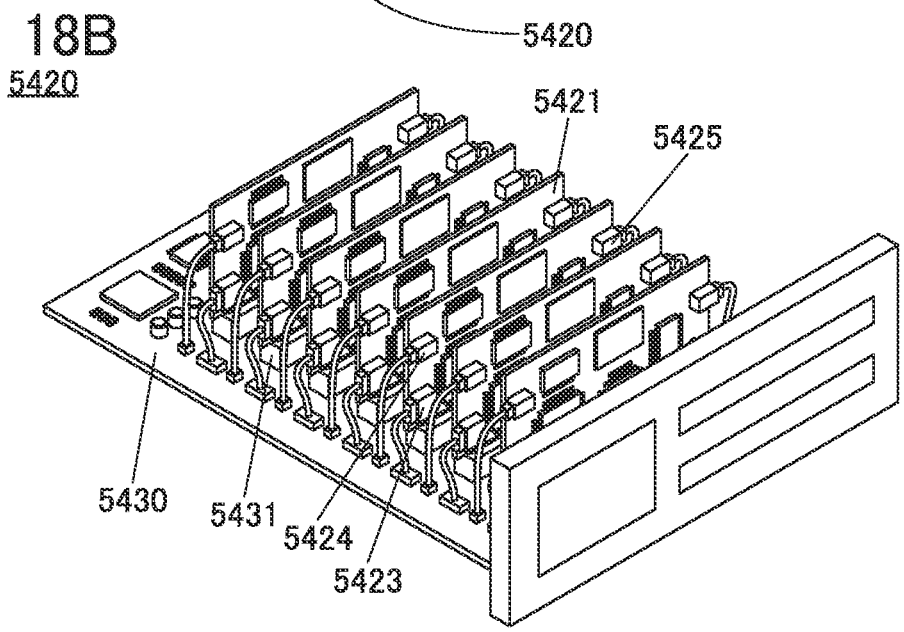

FIG. 18B is a schematic perspective view illustrating a structure example of the computer 5420. The computer 5420 includes a motherboard 5430, and the motherboard includes a plurality of slots 5431. A PC card 5421 is inserted in the slot 5431. The PC card 5421 includes a connection terminal 5423, a connection terminal 5424, and a connection terminal 5425, each of which is connected to the motherboard 5430.

Figure 18C:
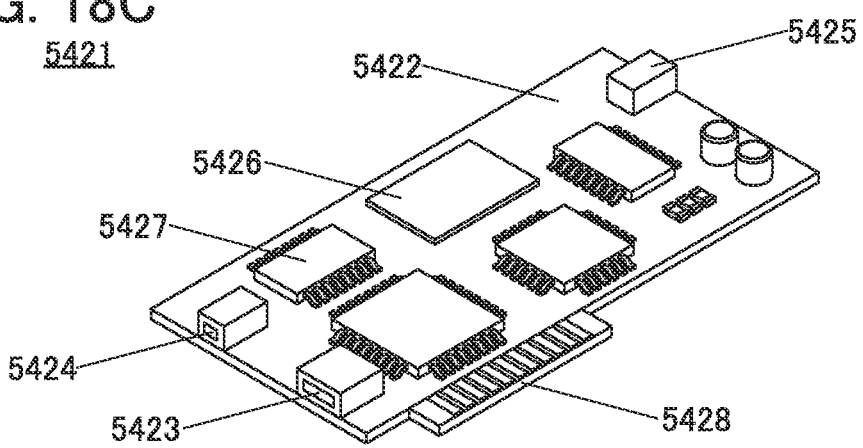

FIG. 18C is a schematic perspective view illustrating a structure example of the PC card 5421. The PC card 5421 includes a board 5422, and includes, over the board 5422, the connection terminal 5423, the connection terminal 5424, the connection terminal 5425, a chip 5426, a chip 5427, and the like.

The memory device according to one embodiment of the present invention, a CPU, a GPU, a FPGA, or the like is mounted as the chip 5426, the chip 5427, or the like. The chip 5426, the chip 5427, and the like include a plurality of terminals (not illustrated) for inputting and outputting signals. The terminal is inserted in a socket (not illustrated) included in the PC card 5421, whereby electrical connection to the PC card 5421 may be established, or the terminals are reflow-soldered, for example, to wirings included in the PC card 5421, whereby electrical connection may be established.

The connection terminal 5423, the connection terminal 5424, and the connection terminal 5425 can serve, for example, as an interface for performing power supply, signal input/output, or the like to the PC card 5421. Examples of the standard for each of the connection terminal 5423, the connection terminal 5424, and the connection terminal 5425 include USB (Universal Serial Bus), SATA (Serial ATA), SCSI (Small Computer System Interface), and HDMI (registered trademark) in the case of outputting an image signal.

In addition, the PC card 5421 includes a connection terminal 5428 over the board 5422. The connection terminal 5428 has a shape with which the connection terminal 5428 can be inserted in the slot 5431 of the motherboard 5430, and the connection terminal 5428 functions as an interface for connecting the PC card 5421 and the motherboard 5430. An example of the standard for the connection terminal 5428 is PCI Express (also referred to as PCIe; PCI Express and PCIe are registered trademarks).

The parallel computer 5400 can perform large-scale scientific computation and large-scale arithmetic operation required for leaning and inference of artificial intelligence.

Figure 19:
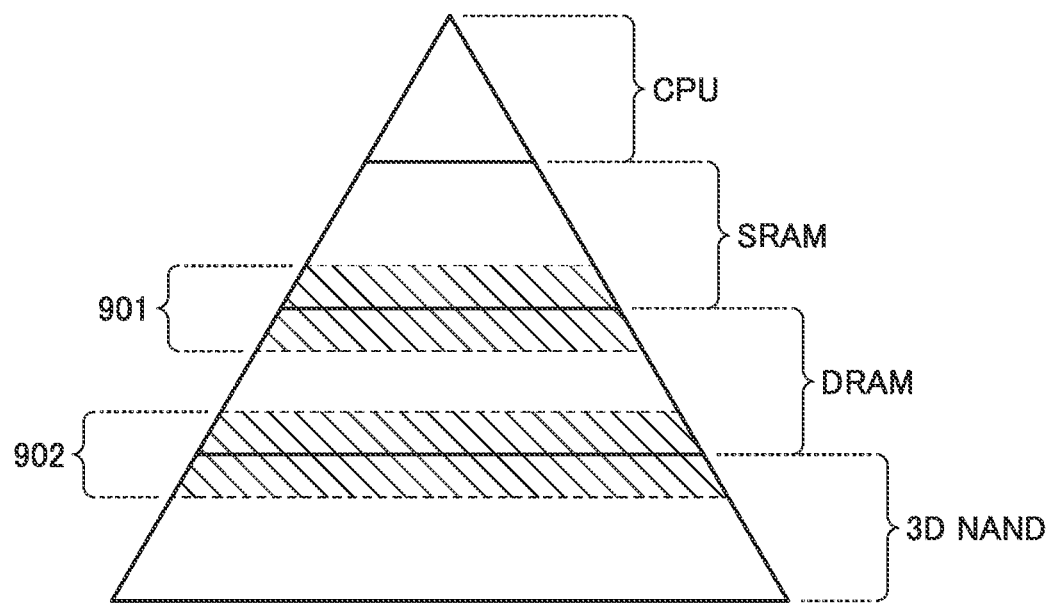
FIG. 19 is a diagram illustrating a hierarchy of various kinds of memory devices.

In general, a variety of memory devices (memory) are used in semiconductor devices such as computers in accordance with the intended use. FIG. 19 shows a hierarchy diagram showing various memory devices with different levels. The memory devices at the upper levels require high access speeds, and the memory devices at the lower levels require large memory capacity and high record density. In FIG. 19, sequentially from the top level, a memory combined as a register in an arithmetic processing device such as a CPU, a SRAM (Static Random Access Memory), a DRAM, and a 3D NAND memory are shown.

A memory combined as a register in an arithmetic processing device such as a CPU is used for temporary storage of arithmetic operation results, for example, and thus is frequently accessed by the arithmetic processing device. Accordingly, high operation speed is required rather than memory capacity. The register also has a function of retaining settings of the arithmetic processing device, for example.

An SRAM is used for a cache, for example. The cache has a function of retaining a copy of part of data retained in a main memory. Copying data which is frequently used and retaining the copy of the data in the cache facilitates rapid data access.

A DRAM is used for the main memory, for example. The main memory has a function of retaining a program or data which are read from the storage. The record density of a DRAM is approximately 0.1 to 0.3 Gbit/mm$^2$.

A 3D NAND memory is used for the storage, for example. The storage has a function of retaining data that needs to be stored for a long time and a variety of programs used in an arithmetic processing device, for example. Therefore, the storage needs to have a high memory capacity and a high memory density rather than operating speed. The record density of a memory device used for the storage is approximately 0.6 to 6.0 Gbit/mm$^2$.

The memory device of one embodiment of the present invention operates fast and can retain data for a long time. The memory device of one embodiment of the present invention can be favorably used as a memory device positioned in a boundary region 901 including both the level in which cache is positioned and the level in which main memory is positioned. The memory device of one embodiment of the present invention can be favorably used as a memory device positioned in a boundary region 902 including both the level in which main memory is positioned and the level in which the storage is positioned.

The memory device according to one embodiment of the present invention can be favorably used as a memory device used in a server, a notebook PC, a smartphone, a game machine, an image sensor, IoT (Internet of Things), healthcare, and the like.

Figure 20A:
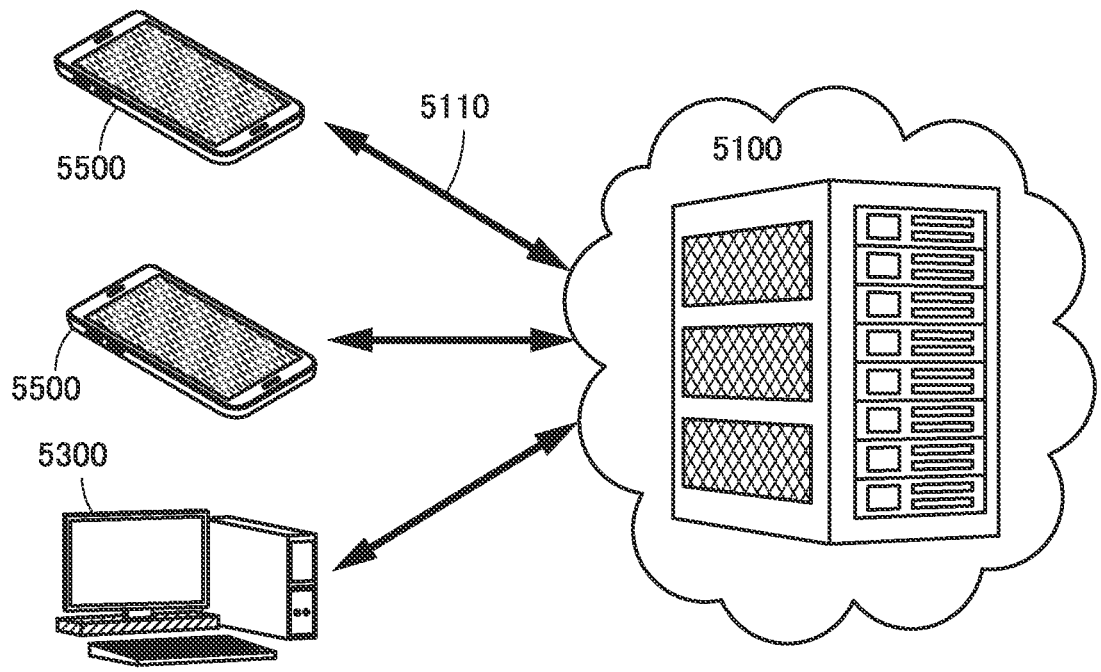
FIG. 20A and FIG. 20B are diagrams illustrating an example of an electronic device.

FIG. 20A illustrates a system including a server 5100 as an electronic device in which the memory device according to one embodiment of the present invention can be used, for example. FIG. 20A schematically illustrates a state where communication 5110 is performed between the server 5100 and each of the information terminal 5500 and a desktop information terminal 5300.

A user can access the server 5100 from the information terminal 5500, the desktop information terminal 5300, and the like. Then, through the communication 5110 via the Internet, the user can receive a service that the administrator of the server 5100 offers. Examples of the service include e-mailing; SNS (Social Networking Service); online software; cloud storage; a navigation system; a translation system; an Internet game; online shopping; financial trading in stocks, exchange, debts, and the like; reservation system for public facilities, commercial facilities, accommodation facilities, hospitals, and the like; and viewing of videos such as Internet shows, talks, and lectures.

In the case where the processing capacity in scientific computation, arithmetic operation required for leaning and inference of artificial intelligence, or the like is insufficient with the information terminal 5500 or the desktop information terminal 5300 in the user's possession, the user can access the server 5100 through the communication 5110 and perform the computation or the arithmetic operation on the server 5100.

Artificial intelligence can be used in a service provided on the server 5100, for example. For example, adopting artificial intelligence in a navigation system may enable the system to provide flexible guidance to a destination in consideration of a traffic congestion situation, a train running status, or the like. As another example, adopting artificial intelligence in a translation system may enable the system to translate unique expressions such as dialects and slangs appropriately. As another example, using artificial intelligence in a reservation system for hospitals and the like may enable the system to introduce an appropriate hospital, clinic, or the like by judging from a user's symptom, degree of an injury, or the like.

Although FIG. 20A illustrates the state in which the communication 5110 is performed between the server 5100 and each of the information terminal 5500 and the desktop information terminal 5300, the communication 5110 may be performed between the server 5100 and an electronic device other than the information terminal. For example, an embodiment may be IoT, in which electronic devices are connected to the Internet.

Figure 20B:
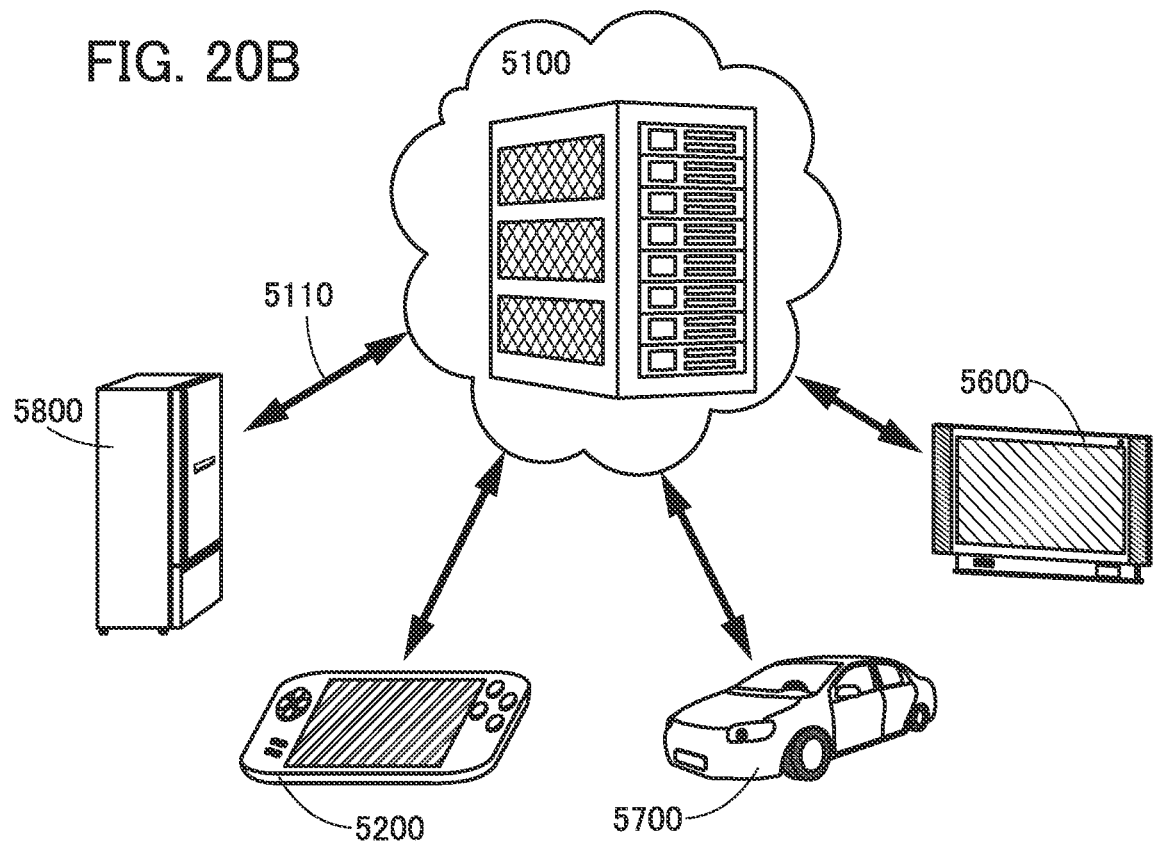

FIG. 20B schematically illustrates an example of a state in which the communication 5110 is performed between the server 5100 and each of electronic devices (the electric refrigerator-freezer 5800, the portable game machine 5200, the automobile 5700, and a television device 5600).

Each of the electronic devices in FIG. 20B may use artificial intelligence. Arithmetic operation required for leaning and inference of artificial intelligence, and the like can be performed on the server 5100. For example, data necessary for arithmetic operation is transmitted from one of the electronic devices to the server 5100 through the communication 5110, arithmetic operation of artificial intelligence is performed on the server 5100, and output data is transmitted from the server 5100 to the one of the electronic devices through the communication 5110. Thus, the electronic device can use data output by the arithmetic operation of artificial intelligence.

Note that the electronic devices illustrated in FIG. 20B are just examples, and the communication 5110 may be performed between the server 5100 and an electronic device not illustrated in FIG. 20B.

As described above, the memory device according to one embodiment of the present invention can be used in a variety of electronic devices. The memory device according to one embodiment of the present invention can be operated with a small number of power sources, and thus the cost of an electronic device using the memory device can be reduced. In addition, the memory device according to one embodiment of the present invention can have a small chip area, and thus an electronic device can be reduced in size. Alternatively, more memory devices can be mounted on an electronic devices. Moreover, in the memory device according to one embodiment of the present invention, data is not likely to be lost even in a high-temperature environment, and thus high-speed operation is possible. The use of the memory device according to one embodiment of the present invention can provide a highly reliable electronic device that can surely operate even in a high-temperature environment.

Note that this embodiment can be implemented in combination with the other embodiments described in this specification as appropriate.

REFERENCE NUMERALS

BG1: wiring, BG2: wiring, C11: capacitor, M12: transistor, N11: node, 10: memory device, 11: transistor, 12: transistor, 50: circuit, 51: sense amplifier circuit, 52: AND circuit, 53: analog switch, 54: analog switch, 61: transistor, 62: transistor, 63: transistor, 64: transistor, 66: transistor, 100: layer, 101: peripheral circuit, III: memory cell array, 112: memory cell, 113: memory cell, 121: row decoder, 122: word line driver circuit, 123: word line driver circuit, 124: predecoder, 131 column decoder, 132: bit line driver circuit, 133: pre-charge circuit, 134: sense amplifier circuit, 135: output MUX circuit, 136: driver circuit, 138: page buffer, 141: output circuit, 151: control logic circuit, 200: layer, 200_1: layer, 200_1: layer, 200_2: layer, 200_3: layer, 600: transistor, 605: conductor, 605a: conductor, 605b: conductor, 607: conductor, 611: insulator, 612: insulator, 614: insulator, 615: conductor, 616: insulator, 622: insulator, 624: insulator, 630: oxide, 630a: oxide, 630b: oxide, 630c: oxide, 640: conductor, 640a: conductor, 640b: conductor, 640c: conductor, 640d: conductor, 640e: conductor, 642: conductor, 642a: conductor, 642b: conductor, 643: oxide, 643a: oxide, 643b: oxide, 646: conductor, 646a: conductor, 646b: conductor, 650: insulator, 655: capacitor, 656: conductor, 657: conductor, 660: conductor, 660a: conductor, 660b: conductor, 672: insulator, 673: insulator, 674: insulator, 680: insulator, 682: insulator, 683: insulator, 684: insulator, 685: insulator, 686: insulator, 687: insulator, 688: insulator, 689:

insulator, 690: transistor, 700: transistor, 705: conductor, 705a: conductor, 705b: conductor, 730: oxide, 730a: oxide, 730b: oxide, 730c: oxide, 742: conductor, 742a: conductor, 742b: conductor, 743: oxide, 743a: oxide, 743b: oxide, 746: conductor, 750: insulator, 760: conductor, 760a: conductor, 760b: conductor, 790: transistor, 800: transistor, 811: substrate, 813: semiconductor region, 814a: low-resistance region, 814b: low-resistance region, 815: insulator, 816: conductor, 820: insulator, 822: insulator, 824: insulator, 826: insulator, 828: conductor, 830: conductor, 850: insulator, 852: insulator, 854: insulator, 856: conductor, 857: conductor, 860: memory cell, 860_1: memory cell, 860_2: memory cell, 860_3: memory cell, 860_4: memory cell, 860_5: memory cell, 860_6: memory cell, 870: memory cell layer, 870_n: memory cell layer, 870_1: memory cell layer, 870_2: memory cell layer, 871: silicon layer, 876: conductor, 878: conductor, 901: boundary region, 902: boundary region, 3000: electronic component, 3002: printed circuit board, 3004: mounting board, 3011: mold, 3012: land, 3013: electrode pad, 3014: wire, 3030: electronic component, 3031: interposer, 3032: package substrate, 3033: electrode, 3035: semiconductor device, 5100: server, 5110: communication, 5200: portable game machine, 5201: housing, 5202: display portion, 5203: button, 5300: desktop information terminal, 5301: main body, 5302: display, 5303: keyboard, 5400: parallel computer, 5410: rack, 5420: computer, 5421: PC card, 5422: board, 5423: connection terminal, 5424: connection terminal, 5425: connection terminal, 5426: chip, 5427: chip, 5428: connection terminal, 5430: motherboard, 5431: slot, 5500: information terminal, 5510: housing, 5511: display portion, 5600: television device, 5700: automobile, 5701: display panel, 5702: display panel, 5703: display panel, 5704: display panel, 5800: electric refrigerator-freezer, 5801: housing, 5802: refrigerator door, 5803: freezer door, 7000: information terminal, 7010: housing, 7011: cover, 7012: monitor portion, 7013: keyboard, 7015: port

The invention claimed is:

1. A memory device comprising:
a semiconductor substrate; and
first to I-th layers, where I is an integer greater than or equal to 2; and
an insulator,
wherein the semiconductor substrate comprises a peripheral circuit comprising a transistor formed in the semiconductor substrate,
wherein a k-th layer comprises a memory cell array comprising a thin film transistor formed in the k-th layer, where k is an integer greater than or equal to 1 and less than or equal to I,
wherein the first layer is stacked above the semiconductor substrate,
wherein a j-th layer is stacked above a j-1-th layer, where j is an integer greater than or equal to 2 and less than or equal to I,
wherein the insulator covers side surfaces of the first to I-th layers and a top surface of the I-th layer, and
wherein the insulator comprises silicon nitride or silicon nitride oxide.

2. The memory device according to claim 1,
wherein the thin film transistor comprises a metal oxide in a channel formation region.

3. The memory device according to claim 1,
wherein the thin film transistor comprises a front gate and a back gate.

4. The memory device according to claim 1,
wherein the thin film transistor comprises a metal oxide in a channel formation region, and
wherein the thin film transistor comprises a front gate and a back gate.

5. A memory device comprising:
a semiconductor substrate; and
first to I-th layers, where I is an integer greater than or equal to 2; and
an insulator,
wherein the semiconductor substrate comprises a peripheral circuit comprising a transistor formed in the semiconductor substrate,
wherein a k-th layer comprises a memory cell array comprising a thin film transistor formed in the k-th layer, where k is an integer greater than or equal to 1 and less than or equal to I,
wherein each memory cell array comprises a plurality of memory cells,
wherein each of the memory cells comprises a first thin film transistor and a second thin film transistor,
wherein the first layer is stacked above the semiconductor substrate,
wherein a j-th layer is stacked above a j-1-th layer, where j is an integer greater than or equal to 2 and less than or equal to I,
wherein the insulator covers side surfaces of the first to I-th layers and a top surface of the I-th layer, and
wherein the insulator comprises silicon nitride or silicon nitride oxide.

6. The memory device according to claim 5,
wherein the thin film transistor comprises a metal oxide in a channel formation region.

7. The memory device according to claim 5,
wherein the thin film transistor comprises a front gate and a back gate.

8. A memory device comprising:
a semiconductor substrate; and
first to I-th layers, where I is an integer greater than or equal to 2; and
an insulator,
wherein the semiconductor substrate comprises a peripheral circuit comprising a transistor formed in the semiconductor substrate,
wherein a k-th layer comprises a memory cell array comprising a thin film transistor formed in the k-th layer, where k is an integer greater than or equal to 1 and less than or equal to I,
wherein the peripheral circuit comprises first to I-th word line driver circuits and first to I-th bit line driver circuits,
wherein the memory cell array included in the k-th layer is electrically connected to a k-th word line driver circuit,
wherein each memory cell array is electrically connected to the bit line driver circuit,
wherein the first layer is stacked above the semiconductor substrate,
wherein a j-th layer is stacked above a j-1-th layer, where j is an integer greater than or equal to 2 and less than or equal to I,
wherein the insulator covers side surfaces of the first to I-th layers and a top surface of the I-th layer, and
wherein the insulator comprises silicon nitride or silicon nitride oxide.

9. The memory device according to claim 8,
wherein the thin film transistor comprises a metal oxide in a channel formation region.

10. The memory device according to claim 8,
wherein the thin film transistor comprises a front gate and a back gate.

11. A memory device comprising:
a semiconductor substrate; and
first to I-th layers, where I is an integer greater than or equal to 2; and
an insulator,
wherein the semiconductor substrate comprises a peripheral circuit comprising a transistor formed in the semiconductor substrate,
wherein a k-th layer comprises a memory cell array comprising a thin film transistor formed in the k-th layer, where k is an integer greater than or equal to 1 and less than or equal to I,
wherein the peripheral circuit comprises first to I-th word line driver circuits and first to I-th bit line driver circuit,
wherein the memory cell array included in the k-th layer is electrically connected to a k-th word line driver circuit,
wherein each memory cell array is electrically connected to the bit line driver circuit,
wherein each memory cell array comprises a plurality of memory cells,
wherein each of the memory cells comprises a first thin film transistor and a second thin film transistor,
wherein the first layer is stacked above the semiconductor substrate,
wherein a j-th layer is stacked above a j-1-th layer, where j is an integer greater than or equal to 2 and less than or equal to I,
wherein the insulator covers side surfaces of the first to I-th layers and a top surface of the I-th layer, and
wherein the insulator comprises silicon nitride or silicon nitride oxide.

12. The memory device according to claim 11,
wherein the thin film transistor comprises a metal oxide in a channel formation region.

13. The memory device according to claim 11,
wherein the thin film transistor comprises a front gate and a back gate.

* * * * *